US 11,743,071 B2

(12) United States Patent
Trikha et al.

(10) Patent No.: US 11,743,071 B2
(45) Date of Patent: Aug. 29, 2023

(54) SENSING AND COMMUNICATIONS UNIT FOR OPTICALLY SWITCHABLE WINDOW SYSTEMS

(71) Applicant: View, Inc., Milpitas, CA (US)

(72) Inventors: Nitesh Trikha, Pleasanton, CA (US); Stephen Clark Brown, San Mateo, CA (US); Nitin Khanna, Milpitas, CA (US); Robert T. Rozbicki, Los Gatos, CA (US); Dhairya Shrivastava, Los Altos, CA (US); Brandon Tinianov, Santa Clara, CA (US)

(73) Assignee: View, Inc., Milpitas, CA (US)

( * ) Notice: Subject to any disclaimer, the term of this patent is extended or adjusted under 35 U.S.C. 154(b) by 0 days.

(21) Appl. No.: 16/447,169

(22) Filed: Jun. 20, 2019

(65) Prior Publication Data

US 2019/0356508 A1   Nov. 21, 2019

Related U.S. Application Data

(63) Continuation-in-part of application No. PCT/US2019/030467, filed on May 2, 2019.
(Continued)

(51) Int. Cl.
*H04L 12/40* (2006.01)
*H04L 12/28* (2006.01)
(Continued)

(52) U.S. Cl.
CPC .............. *H04L 12/40* (2013.01); *E06B 7/28* (2013.01); *E06B 9/24* (2013.01); *G02F 1/1533* (2013.01);
(Continued)

(58) Field of Classification Search
CPC . H04L 12/2801; H04L 12/40; H04L 12/2838; H04L 2012/2843
See application file for complete search history.

(56) References Cited

U.S. PATENT DOCUMENTS 4,340,813 A    7/1982 Sauer
5,729,824 A *  3/1998 O'Neill .............. H04N 7/17309
                                                        370/293
(Continued)

FOREIGN PATENT DOCUMENTS

AU    2015101660 A4   12/2015
CN    103119845 A      5/2013
(Continued)

OTHER PUBLICATIONS

International Search Report and Written Opinion dated Sep. 16, 2019 in PCT/US2019/038429.
(Continued)

*Primary Examiner* — Derrick V Rose
(74) *Attorney, Agent, or Firm* — Weaver Austin Villeneuve & Sampson LLP; Ryan James Otis

(57) ABSTRACT

A high-speed data communications network in or on a building includes a plurality of trunk line segments serially coupled to each other by a plurality of passive circuits configured to deliver signals to, and to receive signals from, one or more devices on, in, or outside the building, wherein the signals comprise data having a greater than 1 Gpbs transmission rate.

55 Claims, 23 Drawing Sheets

Related U.S. Application Data

(60) Provisional application No. 62/858,100, filed on Jun. 6, 2019, provisional application No. 62/803,324, filed on Feb. 8, 2019, provisional application No. 62/768,775, filed on Nov. 16, 2018, provisional application No. 62/688,957, filed on Jun. 22, 2018, provisional application No. 62/666,033, filed on May 2, 2018.

(51) Int. Cl.

| | | |
|---|---|---|
| *H03H 7/48* | (2006.01) | |
| *H01F 38/14* | (2006.01) | |
| *G02F 1/153* | (2006.01) | |
| *H02G 3/30* | (2006.01) | |
| *H02G 3/36* | (2006.01) | |
| *G02F 1/163* | (2006.01) | |
| *E06B 9/24* | (2006.01) | |
| *E06B 7/28* | (2006.01) | |
| *H01P 3/06* | (2006.01) | |
| *H01R 24/40* | (2011.01) | |
| *H01R 103/00* | (2006.01) | |
| *E04H 1/06* | (2006.01) | |

(52) U.S. Cl.
CPC ............. *G02F 1/163* (2013.01); *H01F 38/14* (2013.01); *H01P 3/06* (2013.01); *H02G 3/30* (2013.01); *H02G 3/36* (2013.01); *H03H 7/48* (2013.01); *H04L 12/2801* (2013.01); *E04H 1/06* (2013.01); *E06B 2009/2464* (2013.01); *H01F 2038/143* (2013.01); *H01R 24/40* (2013.01); *H01R 2103/00* (2013.01)

(56) References Cited

U.S. PATENT DOCUMENTS

| | | | |
|---|---|---|---|
| 6,104,513 | A | 8/2000 | Bloom |
| 6,588,250 | B2 | 7/2003 | Schell |
| 6,897,936 | B1 | 5/2005 | Li et al. |
| 6,965,813 | B2 | 11/2005 | Granqvist et al. |
| 7,031,727 | B2 | 4/2006 | Baskin |
| 7,111,952 | B2 | 9/2006 | Veskovic |
| 7,310,355 | B1 | 12/2007 | Krein et al. |
| 7,382,636 | B2 | 6/2008 | Baarman et al. |
| 7,554,437 | B2 | 6/2009 | Axelsen |
| 7,588,067 | B2 | 9/2009 | Veskovic |
| 7,629,400 | B2 | 12/2009 | Hyman |
| 7,911,348 | B2 | 3/2011 | Rodgers |
| 7,950,827 | B2 | 5/2011 | Veskovic |
| 7,963,675 | B2 | 6/2011 | Veskovic |
| 8,022,977 | B2 | 9/2011 | Kanade et al. |
| 8,086,433 | B2 | 12/2011 | Lee et al. |
| 8,249,731 | B2 | 8/2012 | Tran et al. |
| 8,705,162 | B2 | 4/2014 | Brown et al. |
| 8,711,465 | B2 | 4/2014 | Bhatnagar et al. |
| 8,927,069 | B1 | 1/2015 | Estinto et al. |
| 9,121,837 | B2 | 9/2015 | Chan et al. |
| 9,551,913 | B2 | 1/2017 | Kim et al. |
| 9,715,242 | B2 | 7/2017 | Pillai et al. |
| 9,898,912 | B1 | 2/2018 | Jordan, II et al. |
| 9,930,463 | B2 | 3/2018 | Little |
| 9,965,865 | B1 | 5/2018 | Agrawal et al. |
| 10,156,852 | B2 | 12/2018 | Bakhishev et al. |
| 10,178,638 | B1 | 1/2019 | Stamatakis et al. |
| 10,289,094 | B2 | 5/2019 | Ashdown et al. |
| 10,322,680 | B2 | 6/2019 | Terashima et al. |
| 10,488,837 | B2 | 11/2019 | Cirino |
| 10,724,867 | B1 | 7/2020 | Waful et al. |
| 10,867,266 | B1 | 12/2020 | Carlin et al. |
| 10,917,259 | B1 | 2/2021 | Chein et al. |
| 10,921,675 | B2 | 2/2021 | Barnum et al. |
| 10,923,226 | B2 | 2/2021 | Macary et al. |
| 10,954,677 | B1 | 3/2021 | Scanlin |
| 10,982,487 | B2 | 4/2021 | Ramirez |
| 11,631,493 | B2 | 4/2023 | Schlameuss et al. |
| 2003/0039257 | A1 | 2/2003 | Manis et al. |
| 2003/0163351 | A1 | 8/2003 | Brown et al. |
| 2003/0227663 | A1 | 12/2003 | Agarwal et al. |
| 2005/0002662 | A1 | 1/2005 | Arpa et al. |
| 2005/0063036 | A1 | 3/2005 | Bechtel et al. |
| 2005/0157675 | A1 | 7/2005 | Feder et al. |
| 2005/0213992 | A1* | 9/2005 | Piehler ............ H04B 10/25751 |
| | | | 398/198 |
| 2006/0074494 | A1 | 4/2006 | McFarland |
| 2006/0270440 | A1 | 11/2006 | Shearer et al. |
| 2007/0067048 | A1 | 3/2007 | Bechtel et al. |
| 2007/0191074 | A1 | 8/2007 | Harrist et al. |
| 2007/0222542 | A1 | 9/2007 | Joannapoulos et al. |
| 2008/0182506 | A1 | 7/2008 | Jackson et al. |
| 2008/0277486 | A1 | 11/2008 | Seem et al. |
| 2009/0210252 | A1 | 8/2009 | Silver |
| 2009/0322347 | A1* | 12/2009 | Hashimshony ...... G01R 35/007 |
| | | | 324/601 |
| 2010/0188057 | A1 | 7/2010 | Tarng |
| 2010/0243427 | A1 | 9/2010 | Kozlowski et al. |
| 2010/0245973 | A1 | 9/2010 | Wang et al. |
| 2010/0315693 | A1 | 12/2010 | Lam et al. |
| 2011/0050756 | A1 | 3/2011 | Cassidy et al. |
| 2011/0148218 | A1 | 6/2011 | Rozbicki |
| 2011/0266137 | A1 | 11/2011 | Wang et al. |
| 2011/0266138 | A1 | 11/2011 | Wang et al. |
| 2011/0267674 | A1 | 11/2011 | Wang et al. |
| 2011/0267675 | A1 | 11/2011 | Wang et al. |
| 2011/0310519 | A1* | 12/2011 | Baba ..................... H04N 5/63 |
| | | | 361/91.1 |
| 2012/0032855 | A1 | 2/2012 | Reede et al. |
| 2012/0033287 | A1 | 2/2012 | Friedman et al. |
| 2012/0039526 | A1 | 2/2012 | Garaas et al. |
| 2012/0062975 | A1 | 3/2012 | Mehtani et al. |
| 2012/0112883 | A1 | 5/2012 | Wallace et al. |
| 2012/0133315 | A1 | 5/2012 | Berman et al. |
| 2012/0143516 | A1 | 6/2012 | Mezic et al. |
| 2012/0239209 | A1 | 9/2012 | Brown et al. |
| 2012/0296610 | A1 | 11/2012 | Hailemariam et al. |
| 2013/0057937 | A1 | 3/2013 | Berman et al. |
| 2013/0073681 | A1 | 3/2013 | Jiang et al. |
| 2013/0130227 | A1 | 5/2013 | Peltz et al. |
| 2013/0226353 | A1 | 8/2013 | Park |
| 2013/0250422 | A1* | 9/2013 | Tandler ................... E06B 9/303 |
| | | | 359/597 |
| 2013/0271814 | A1 | 10/2013 | Brown |
| 2013/0277539 | A1 | 10/2013 | Smilansky et al. |
| 2014/0007244 | A1 | 1/2014 | Martin et al. |
| 2014/0101573 | A1 | 4/2014 | Kuo |
| 2014/0236323 | A1 | 8/2014 | Brown et al. |
| 2014/0247475 | A1 | 9/2014 | Parker et al. |
| 2014/0300945 | A1 | 10/2014 | Parker |
| 2014/0317514 | A1 | 10/2014 | Bokotey |
| 2014/0368899 | A1* | 12/2014 | Greer ..................... E06B 9/24 |
| | | | 359/275 |
| 2015/0032264 | A1 | 1/2015 | Emmons et al. |
| 2015/0070745 | A1 | 3/2015 | Pradhan |
| 2015/0106121 | A1 | 4/2015 | Muhsin et al. |
| 2015/0116811 | A1 | 4/2015 | Shrivastava et al. |
| 2015/0122474 | A1 | 5/2015 | Petersen |
| 2015/0195644 | A1 | 7/2015 | Wilson et al. |
| 2015/0255651 | A1 | 9/2015 | Barr et al. |
| 2015/0270823 | A1* | 9/2015 | Sobolewski ......... G01R 27/025 |
| | | | 324/609 |
| 2015/0323915 | A1* | 11/2015 | Warren .................. G05B 15/02 |
| | | | 700/275 |
| 2015/0327010 | A1 | 11/2015 | Gottschalk et al. |
| 2015/0362819 | A1 | 12/2015 | Bjomard et al. |
| 2015/0378715 | A1 | 12/2015 | Solnit et al. |
| 2016/0071183 | A1 | 3/2016 | Joshi et al. |
| 2016/0091769 | A1 | 3/2016 | Rozbicki |
| 2016/0134932 | A1 | 5/2016 | Karp et al. |
| 2016/0210711 | A1 | 7/2016 | Krupa et al. |
| 2016/0231755 | A1 | 8/2016 | Ajax et al. |
| 2016/0261837 | A1 | 9/2016 | Thompson et al. |
| 2016/0376831 | A1 | 12/2016 | Plummer |
| 2017/0010880 | A1 | 1/2017 | Yamazaki |

(56) References Cited

U.S. PATENT DOCUMENTS

| | | | |
|---|---|---|---|
| 2017/0039339 A1 | 2/2017 | Bitran et al. | |
| 2017/0075183 A1 | 3/2017 | Brown | |
| 2017/0080341 A1 | 3/2017 | Mao et al. | |
| 2017/0082903 A1 | 3/2017 | Vigano et al. | |
| 2017/0085834 A1 | 3/2017 | Kim et al. | |
| 2017/0086003 A1 | 3/2017 | Rabinowitz et al. | |
| 2017/0122802 A1 | 5/2017 | Brown et al. | |
| 2017/0146884 A1 | 5/2017 | Vigano et al. | |
| 2017/0161911 A1 | 6/2017 | Kumar et al. | |
| 2017/0248564 A1 | 8/2017 | Miyajima | |
| 2017/0264865 A1 | 9/2017 | Huangfu | |
| 2017/0276542 A1 | 9/2017 | Klawuhn et al. | |
| 2017/0345267 A1 | 11/2017 | Flint et al. | |
| 2017/0374255 A1 | 12/2017 | Campbell et al. | |
| 2017/0374437 A1 | 12/2017 | Schwarzkopf et al. | |
| 2018/0090992 A1 | 3/2018 | Shrivastava et al. | |
| 2018/0119973 A1 | 5/2018 | Rothman et al. | |
| 2018/0129172 A1 | 5/2018 | Shrivastava et al. | |
| 2018/0130455 A1 | 5/2018 | Plummer et al. | |
| 2018/0139517 A1* | 5/2018 | Schwartz | H02J 50/40 |
| 2018/0153454 A1 | 6/2018 | Hayter et al. | |
| 2018/0156484 A1 | 6/2018 | Kim et al. | |
| 2018/0181085 A1 | 6/2018 | Gabriel et al. | |
| 2018/0187484 A1 | 7/2018 | Hebeisen et al. | |
| 2018/0195752 A1 | 7/2018 | Sasaki et al. | |
| 2018/0225585 A1 | 8/2018 | Dong et al. | |
| 2018/0259373 A1 | 9/2018 | Staton et al. | |
| 2018/0269974 A1* | 9/2018 | Luciano | H04N 21/6118 |
| 2018/0306609 A1 | 10/2018 | Agarwal et al. | |
| 2018/0307114 A1 | 10/2018 | Brown et al. | |
| 2018/0321042 A1 | 11/2018 | Brewer et al. | |
| 2018/0349710 A1 | 12/2018 | Houri et al. | |
| 2018/0364654 A1 | 12/2018 | Locke et al. | |
| 2019/0025661 A9 | 1/2019 | Brown et al. | |
| 2019/0049812 A1 | 2/2019 | Brown | |
| 2019/0058977 A1 | 2/2019 | Gherardi et al. | |
| 2019/0097827 A1 | 3/2019 | Angle et al. | |
| 2019/0178511 A1 | 6/2019 | Zimmerman et al. | |
| 2019/0205774 A1* | 7/2019 | Ba | G06Q 50/06 |
| 2019/0229768 A1* | 7/2019 | Jeremy | H04B 3/50 |
| 2019/0257143 A1* | 8/2019 | Nagel | G02F 1/163 |
| 2019/0317458 A1* | 10/2019 | Shrivastava | G05B 13/0265 |
| 2019/0324431 A1* | 10/2019 | Cella | G05B 19/41845 |
| 2019/0354071 A1 | 11/2019 | Turney et al. | |
| 2020/0026141 A1 | 1/2020 | Brown et al. | |
| 2020/0041967 A1 | 2/2020 | Shrivastava et al. | |
| 2020/0045261 A1 | 2/2020 | Lim et al. | |
| 2020/0090089 A1 | 3/2020 | Aston et al. | |
| 2020/0096775 A1 | 3/2020 | Franklin et al. | |
| 2020/0103841 A1 | 4/2020 | Pillai et al. | |
| 2020/0176125 A1 | 6/2020 | Chatterjea et al. | |
| 2020/0193155 A1 | 6/2020 | Keohane et al. | |
| 2020/0227159 A1 | 7/2020 | Boisvert et al. | |
| 2021/0021788 A1 | 1/2021 | Mcnelley et al. | |
| 2021/0210053 A1 | 7/2021 | Ng et al. | |
| 2021/0375440 A1 | 12/2021 | Schlameuss et al. | |
| 2021/0383804 A1 | 12/2021 | Makker et al. | |
| 2021/0390953 A1 | 12/2021 | Makker et al. | |
| 2022/0231396 A1 | 7/2022 | Rozbicki et al. | |
| 2023/0040424 A1 | 2/2023 | Gopinathanasari et al. | |
| 2023/0065864 A1 | 3/2023 | Trikha et al. | |
| 2023/0074720 A1 | 3/2023 | Brown et al. | |

FOREIGN PATENT DOCUMENTS

| | | |
|---|---|---|
| CN | 203019761 U | 6/2013 |
| CN | 103649826 A | 3/2014 |
| EP | 0917667 A1 | 5/1999 |
| EP | 2090961 A1 | 8/2009 |
| EP | 3299957 A1 | 3/2018 |
| EP | 3328000 A1 | 5/2018 |
| JP | H0611477 A | 1/1994 |
| JP | H06308073 A | 11/1994 |
| KR | 20120092921 A | 8/2012 |
| KR | 20170121858 A | 11/2017 |
| KR | 20170134321 A | 12/2017 |
| KR | 20180012615 A | 2/2018 |
| KR | 101853568 B1 | 4/2018 |
| TW | I607269 B | 12/2017 |
| WO | WO-02054086 A1 | 7/2002 |
| WO | WO2013/121103 | 8/2013 |
| WO | WO2014/032023 | 2/2014 |
| WO | WO2014/209812 | 12/2014 |
| WO | WO2015/100419 | 7/2015 |
| WO | WO2015/113592 A1 | 8/2015 |
| WO | WO2016/054112 | 4/2016 |
| WO | WO2016/072620 A1 | 5/2016 |
| WO | WO2016/085964 | 6/2016 |
| WO | WO2017/007841 | 1/2017 |
| WO | WO2017/058568 | 4/2017 |
| WO | WO2017/075472 | 5/2017 |
| WO | WO2017/120262 A1 | 7/2017 |
| WO | WO2017/192881 | 11/2017 |
| WO | WO2018/039080 | 3/2018 |
| WO | WO2018/063919 | 4/2018 |
| WO | WO2018/102103 | 6/2018 |
| WO | WO2018/200702 | 11/2018 |
| WO | WO2018/200752 | 11/2018 |
| WO | WO-2018200740 A2 | 11/2018 |
| WO | WO2019/178282 | 9/2019 |
| WO | WO2019/213441 | 11/2019 |
| WO | WO2020/243690 A1 | 12/2020 |
| WO | WO-2021211798 A1 | 10/2021 |

OTHER PUBLICATIONS

Density DPU Technical Specifications v1.0, Density, 2018, downloaded from <www.density.io>.

U.S. Appl. No. 16/550,052, filed Aug. 23, 2019, Brown et al.

U.S. Preliminary Amendment dated Apr. 6, 2020 in U.S. Appl. No. 16/550,052.

U.S. Office Action dated Sep. 18, 2020 in U.S. Appl. No. 16/550,052.

"Halio Rooftop Sensor Kit (Model SR500)," Product Data Sheet, Kinestral Technologies, 2020, 4 pp.

"SPN1 Sunshine Pyranometer," Product Overview, Specification, Accessories and Product Resources, Delta-T Devices, May 5, 2016, 9 pp. <<https://www.delta-t.co.uk/product/spn1/>> (downloaded Apr. 28, 2020).

U.S. Appl. No. 62/958,653, filed Jan. 8, 2020, Gopinathanasari et al.

U.S. Appl. No. 62/993,617, filed Mar. 23, 2020, Gupta et al.

U.S. Appl. No. 63/020,819, filed May 6, 2020, Gupta et al.

U.S. Appl. No. 63/029,301, filed May 22, 2020, Gupta et al.

U.S. Appl. No. 63/033,474, filed Jun. 2, 2020, Gupta et al.

U.S. Appl. No. 63/034,792, filed Jun. 4, 2020, Gupta et al.

U.S. Appl. No. 63/041,002, filed Jun. 18, 2020, Gupta et al.

U.S. Appl. No. 63/057,120, filed Jul. 27, 2020, Gupta et al.

U.S. Appl. No. 63/069,358, filed Aug. 24, 2020, Gupta et al.

U.S. Appl. No. 63/078,805, filed Sep. 15, 2020, Gupta et al.

U.S. Appl. No. 63/079,851, filed Sep. 17, 2020, Gupta et al.

U.S. Final Office Action dated Jan. 1, 2021 in U.S. Appl. No. 16/550,052.

International Preliminary Report on Patentability dated Dec. 22, 2020 in PCT/US2019/038429.

International Search Report and Written Opinion (ISA/EP) dated Sep. 30, 2020 in PCT Application No. PCT/US2020/035485.

Dols, W. Stuart, et al., A tool to model the fate and transport of indoor microbiological aerosols (FaTIMA), NIST Technical Note 2095, National Institute of Standards and Technology, US Department of Commerce, Jun. 2020, 32 pp. <<https://doi.org/10.6028/NIST.TN.2095>>.

Joseph, J., "Xiaomi shows off near perfect Under Screen Camera Technology," Gizchina.com, Aug. 28, 2020, 7 pp., <<https://www.gizmochina.com/2020/08/28/xiaomi-perfected-third-gen-under-screen-camera-technology-prototype/>>, retrieved Apr. 21, 2021.

U.S. Appl. No. 63/115,886, filed Nov. 19, 2020, Gupta et al.

U.S. Appl. No. 63/106,058, filed Oct. 27, 2020, Rasmus-Vorrath et al.

U.S. Appl. No. 63/146,365, filed Feb. 5, 2021, Brown et al.

U.S. Appl. No. 63/124,673, filed Dec. 11, 2020, Tai et al.

(56) References Cited

OTHER PUBLICATIONS

U.S. Appl. No. 63/133,725, filed Jan. 4, 2021, Gopinathanasari et al.
U.S. Appl. No. 63/159,814, filed Mar. 11, 2021, Gupta et al.
U.S. Appl. No. 63/163,305, filed Mar. 19, 2021, Trikha et al.
U.S. Appl. No. 63/173,759, filed Apr. 12, 2021, Rasmus-Vorrath et al.
U.S. Appl. No. 63/171,871, filed Apr. 7, 2021, Gomez-Martinez et al.
PCT Application No. PCT/US2021/015378 filed Jan. 28, 2021.
PCT Application No. PCT/US2021/012313 filed Jan. 6, 2021.
PCT Application No. PCT/US2021/023433 filed Mar. 22, 2021.
PCT Application No. PCT/US2021/017946 filed Feb. 12, 2021.
U.S. Office Action dated May 5, 2021 in U.S. Appl. No. 16/550,052.
U.S. Final Office Action dated Oct. 28, 2021 in U.S. Appl. No. 16/550,052.
International Preliminary Report on Patentability dated Dec. 9, 2021 in PCT Application No. PCT/US2020/035485.
U.S. Appl. No. 63/181,648, filed Apr. 29, 2021, Makker et al.
U.S. Appl. No. 63/209,362, filed Jun. 10, 2021, Gomez-Martinez et al.
U.S. Appl. No. 63/212,483, filed Jun. 18, 2021, Martinson et al.
U.S. Appl. No. 63/233,122, filed Aug. 13, 2021, Gupta et al.
U.S. Appl. No. 63/246,770, filed Sep. 21, 2021, Martinson et al.
U.S. Appl. No. 17/612,479, filed Nov. 18, 2021, Rozbicki et al.
PCT Application No. PCT/US2021/030798 filed May 5, 2021.
PCT Application No. PCT/US2021/052587 filed Sep. 29, 2021.
CN Office Action dated Mar. 2, 2022 in Application No. CN201980042340.1 with English translation.
EP Office action dated Jan. 10, 2022, in Application No. EP19745809.4.
TW Office Action dated Mar. 15, 2022, in Application No. TW109112242 with English translation.
U.S. Advisory Action dated Apr. 29, 2022 in U.S. Appl. No. 17/328,346.
U.S. Final office Action dated Dec. 1, 2021 in U.S. Appl. No. 17/328,346.
U.S. Non Final office Action dated Sep. 2, 2021 in U.S. Appl. No. 17/328,346.
U.S. Non-Final Office Action dated Mar. 25, 2022, in U.S. Appl. No. 16/550,052.
International Preliminary Report on Patentability and written opinion dated Jul. 21, 2022 in Application PCT/US2021/012313.
International Search Report and Written Opinion dated Aug. 2, 2022 in Application No. PCT/US2022/030757.
International Search Report and Written Opinion dated Aug. 22, 2022 in Application No. PCT/US2022/024343.
International Search Report and Written Opinion dated Mar. 25, 2022 in Application No. PCT/US2021/062774.
International Preliminary Report on Patentability dated Aug. 11, 2022 in PCT Application No. PCT/US2021/015378.
International Search Report and Written Opinion dated Aug. 8, 2022, in Application No. PCT/US2022/023605.
International Search Report and Written Opinion dated Jul. 6, 2022, in PCT Application No. PCT/US2022/020730.
International Search Report and Written Opinion dated Jun. 23, 2021 in PCT Application No. PCT/US2021/015378.
International Search Report and Written Opinion dated Nov. 10, 2021 in PCT Application No. PCT/US2021/043143.
International Search Report and Written Opinion dated Sep. 1, 2022, in Application No. PCT/US2022/024812.
TW Office Action dated Jul. 14, 2022, in Application No. TW108121734 with English translation.
U.S. Non-Final office Action dated Jul. 22, 2022 in U.S. Appl. No. 17/328,346.
U.S. Appl. No. 17/759,709, Inventors Trikha et al., filed Jul. 28, 2022.
U.S. Appl. No. 17/791,507, inventors Gopinathanasari et al., filed Jul. 7, 2022.
U.S. Appl. No. 17/910,722, inventor Trikha et al., filed Sep. 9, 2022.
Alarifi, A. et al., "Ultra Wideband Indoor Positioning Technologies: Analysis and Recent Advances", SENSORS, May 16, 2016, vol. 16 No.5, pp. 1-36.
Chan, E.C.L, et al., "Effect of Channel Interference on Indoor Wireless Local Area Network Positioning" IEEE 6th International Conference on Wireless and Mobile Computing, Networking and Communications, Oct. 11, 2010, pp. 239-245.
CN Office Action dated Nov. 2, 2022, in ApplicationNo. CN201980042340.1 with English translation.
International Preliminary Report on Patentability dated Oct. 6, 2022 in PCT Application PCT/US2021/023433.
International Search Report and Written Opinion dated Sep. 26, 2022 in Application No. PCT/US2022/032993.
International Preliminary Report on Patentability dated Dec. 1, 2022, in PCT Application No. PCT/US2021/033544.
International Preliminary Report on Patentability dated Feb. 9, 2023 in PCT Application No. PCT/US2021/043143.
International Search Report and Written Opinion dated Sep. 3, 2021 in PCT Application No. PCT/US2021/033544.
JP Office Action dated Dec. 20, 2022 in JP Application No. JP2020-570981 with English translation.
U.S. Final Office Action dated Dec. 2, 2022 in U.S. Appl. No. 16/550,052.
U.S. Notice of Allowance dated Jan. 9, 2023 in U.S. Appl. No. 17/328,346.
U.S. Appl. No. 17/924,105, inventors et al., filed Nov. 8, 2022.
International Preliminary Report on Patentability dated Mar. 9, 2023 in PCT Application No. PCT/US2021/046838.
International Search Report and Written Opinion dated Jan. 17, 2022 in PCT Application No. PCT/US2021/046838.
TW Office Action dated Feb. 16, 2023, in Application No. TW108121734 with English translation.
U.S Advisory Action dated Jan. 22, 2023 in U.S. Appl. No. 16/550,052.
U.S. Appl. No. 18/028,292, inventors Martinson et al., filed Mar. 24, 2023.
U.S. Appl. No. 18/042,712, inventors Gupta et al., filed Feb. 23, 2023.
U.S. Appl. No. 18/115,694, inventors Schlameuss et al., filed Feb. 28, 2023.

\* cited by examiner

Detail A

Detail B

| Digital Architectural Element Features ||||
|---|---|---|---|
| Sensor/ Component | Additional sensor/Component | Feature/Use case | Method/Process for use |
| HD Camera | Standalone | Building Security | Captures people, machine movements arounds building's spaces and notifies suspicious activity flagged via machine learning models. |
| | | Asset Tracking | Detects movements of equipment in, around building spaces and flags non-compliant asset movements. |
| | | Spatial Proximity Presence & Movement Detection - People, Devices | Detects people, device motion to trigger actions by other systems to respond to the motion detection, capture it for Spatial analytics. |
| | | Spatial Ambient light color Detection | Measures ambient light color spectrum readings for Spatial analytics as well as lighting systems to tune dynamic glass, lights to achieve target light levels. |
| | | Spatial IR Heat Map | Measures Spatial IR spectrum reading to perform ambient heat analysis, ambient Spatial object map. |
| | | Spatial Glare Detection | Measures glare to fine tune the surrounding programmable building devices to reduce the glare for occupant comfort, building efficiency. Building devices include tintable windows, displays on windows or elsewhere, HBD film, spectral power distribution controls. |
| | | Gesture Controls, Commands | Capture gesture signals and transforms it into actions by other systems as response to the gesture. |
| | | | Capture image of the document, scan and email it. |
| | Display, Speaker & Microphone | Video Collaboration | Full HD video comm. integrated on building's structure wall, partition |

Figure 5A

| Digital Architectural Element Features |||| 
|---|---|---|---|
| Sensor/ Component | Additional sensor/Component | Feature/Use case | Method/Process for use |
| Microphone Array | Standalone | White noise level, dust/air quality/smell detection (algorithms analyze acoustic waves to determine air density and particulates, etc.) | Detects air quality combinations for spatial analytics, triggering controls w/paired control systems to keep the readings with-in expected set range |
| | | Audio conversation input | Input sensor for capturing speech conversations. |
| | Speaker Array | White noise level reduction | Creates anti-white noise audio signals to reduce the background white noise. |
| Speaker Array | Standalone | Audio media playback | Play background music, media content for creating a delightful ambient environment for occupants. |
| | | Emergency Audio Alerts | PA Emergency alerts, notifications |
| | | Text-to-speech audio playback in audio conversations | Audio digital assistant (Alexa, Cortana, Google Home) conversations |
| Sensors - Temp/Humidity, VOC, CO2, Dust, ALS (acoustic light sensors), BLE Bluetooth | Standalone | Ambient Environment Data Capture | Captures the circuit data and publishes it for any subscriber, system to pick it up for taking action to counter the deviation or just log it powered by machine learning processing the signals from sensors to match it to either singular or compound actions. |
| Microcontroller Unit, Memory & Storage | Standalone | Edge compute node | Compute node running an Operating Systems to host sensors' OAM (operations, administration, maintenance), data processing and audio-visual interactive applications |
| UWB RF Antenna (ultra wideband) | MCU | Wi-Fi + 5G LTE Access Point, repeater. | Acts as WiFi & 5G AP (access points), repeater. |

Figure 5B

| Digital Architectural Element Features ||||
| Sensor/ Component | Additional sensor/Component | Feature/Use case | Method/Process for use |
| --- | --- | --- | --- |
| Modular Design | Standalone | Customization per install location | Allows plug n play of different components to create a customizable configuration for installation. |
| Power Unit | Standalone | Stores powers to keep sensors, MCU, peripherals operational | Self-power module that harvests internal ambient light by, e.g., transparent or opaque photovoltaic cells to keep the power storage (batteries) charged to power up all computing, sensor and other |
| | | Generates power for sensors, MCU, Display++ | peripheral devices (display) powered up |
| Display Dock | Standalone | Provides easy to slide, fit a transparent display sheet & accompanying connector circuitry | Structural support for installation, service and replacement of transparent display screens attached to the surface hiding the circuitry required to power & control the display transistors. |
| Communication Port | Standalone | Provides wired network connectivity | Wired network connectivity for OAM as well as actual data interactions with the digital architectural elements. |
| Window Controller | Standalone | Control EC Glass | OAM control for EC Glass |
| | Camera | Capture image, live video feed | Upon glass breakage detection by Window controller, start capturing image & video feed from camera |
| | Display, Speaker & Microphone | Change in value | Upon glass breakage detection by Window controller, start alarm as well as visual emergency signals on display. |
| | Sensors - T/H, ALS | Change in value | Upon tint level change ambient environment values to achieve set goals for occupant comfort. |
| Pico Projector | Window Controller | Capture and project image on S3, S4 | On tint-4 project the image on S3, S4 surface |

Figure 5C

SENSING AND COMMUNICATIONS UNIT FOR OPTICALLY SWITCHABLE WINDOW SYSTEMS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes. This application is also related to: U.S. patent application Ser. No. 13/449,251, filed Apr. 17, 2012; U.S. patent application Ser. No. 14/962,975, filed Dec. 8, 2015; U.S. patent application Ser. No. 15/287,646, filed Oct. 6, 2016; U.S. patent application Ser. No. 15/334,835 filed Oct. 26, 2016; U.S. patent application Ser. No. 15/347,677, filed Nov. 9, 2016; U.S. patent application Ser. No. 15/365,685, filed Nov. 30, 2016; International Patent Application No. PCT/US17/31106, filed May 4, 2017; International Patent Application No. PCT/US17/47664, filed Aug. 18, 2017; International Patent Application No. PCT/US17/52798, filed Sep. 21, 2017; International Patent Application No. PCT/US17/61054, filed Nov. 10, 2017; U.S. patent application Ser. No. 15/742,015 filed Jan. 4, 2018; U.S. patent application Ser. No. 15/882,719, filed Jan. 29, 2018; International Patent Application No. PCT/US18/29476, filed Apr. 25, 2018, PCT Patent Application No. PCT/US18/29406, filed Apr. 25, 2018; International Patent Application No. PCT/US19/2219, filed Mar. 13, 2019; and International Patent Application No. PCT/US19/30467, filed May 2, 2019, each incorporated herein by reference in its entirety.

FIELD

The embodiments disclosed herein relate generally to systems of optically switchable windows and more particularly to communication and sensing techniques associated with the optically switchable windows.

BACKGROUND

Optically switchable windows, sometimes referred to as "smart windows," exhibit a controllable and reversible change in an optical property when appropriately stimulated by, for example, a voltage change. The optical property is typically color, transmittance, absorbance, and/or reflectance. Electrochromic (EC) devices are sometimes used in optically switchable windows. One well-known electrochromic material, for example, is tungsten oxide ($WO_3$). Tungsten oxide is a cathodic electrochromic material in which a coloration transition, transparent to blue, occurs by electrochemical reduction.

Electrically switchable windows, sometimes referred to as "smart windows", whether electrochromic or otherwise, may be used in buildings to control transmission of solar energy. Switchable windows may be manually or automatically tinted and cleared to reduce energy consumption, by heating, air conditioning and/or lighting systems, while maintaining occupant comfort.

Electrochromic materials may be incorporated into, for example, windows for home, commercial and other uses as thin film coatings on the window glass. A small voltage applied to an electrochromic device of the window will cause them to darken; reversing the voltage polarity causes them to lighten. This capability allows control of the amount of light that passes through the windows, and presents an opportunity for electrochromic windows to be used as energy-saving devices.

While electrochromic devices, and particularly electrochromic windows, are finding acceptance in building designs and construction, they have not begun to realize their full commercial potential.

SUMMARY

According to some embodiments, a high-speed data communications network in or on a building includes a plurality of trunk line segments serially coupled to each other by a plurality of passive circuits configured to deliver signals to, and to receive signals from, one or more devices on, in, or outside the building, wherein the signals comprise data having a greater than 1 Gpbs transmission rate.

In some examples, the trunk line segments may include coaxial cables. In some examples, the trunk line segments may include a twisted pair of conductors.

In some examples, the passive circuit may be configured as a bias T. In some examples, the bias T may include an inductor and a capacitor.

In some examples, the passive circuit may be configured as a directional coupler.

In some examples, each passive circuit may include a first conductor having two ends, each end configured to couple to one of the trunk line segments. In some examples, the passive circuit may include a second conductor disposed adjacent and apart from the first conductor. In some examples, the first and second conductors may be spaced apart in a parallel relationship.

In some examples, at least one of the passive circuits may be configured to deliver signals via inductive coupling.

According to some implementations, a method of installing a high-speed data communications network in, or on, a building includes providing a plurality of trunk line segments, providing one or more circuit, and forming the network by coupling the trunk line segments to the one or more circuit to form a daisy chain trunk line topology, wherein the plurality of trunk line segments comprise coaxial cables, and wherein the one or more circuit is configured to deliver signals to, and to receive signals from, one or more device on, in, or outside the building.

In some examples, the one or more devices may include windows. In some examples, the one or more device may include a controller configured to control functions of at least one of the windows.

In some examples, the one or more device may include a device selected from the group consisting of an Internet of Things (IoT) device, a wireless device, a sensor, an antenna, a 5G device, a mmWave device, a microphone, a speaker, and a microprocessor. In some examples, the method may further include installing the one or more devices in, or on, a structural element of the building.

In some examples, the one or more circuits may include an inductor and a capacitor.

In some examples, the one or more circuits may include an antenna. In some examples, the antenna may include a 5G antenna.

In some examples, one or more circuit may include one or more connectors. In some examples, the connector may include an RF connector.

In some examples, the one or more circuits may include two or more connectors.

In some examples, the signals may include data having a greater than 1 Gpbs transmission rate.

In some examples, the signals may include power signals. In some examples, the power signals may include CLASS 2 power signals.

In some examples, the signals may include TCP/IP data and power signals.

In some examples, the daisy chain topology may be coupled to a building management control panel.

In some examples, the signals may include wireless data.

In some examples, the method may further include a step of installing at least one window in the building. In some examples, the at least one window may include an optically switchable window.

In some examples, the at least one window may include an electrochromic window. In some examples, the step of installing at least one window p may be reformed after forming the network.

In some examples, at least a portion of the trunk line may be installed in, or on, an exterior wall of the building. In some examples, the one or more devices may include an antenna and/or repeater. In some examples, at least one of the one or more devices may be installed in, or on, a window of the building. In some examples, the window may include a digital display screen.

In some examples, the one or more circuits may include a directional coupler.

In some examples, the one or more circuits may include a bias T circuit.

In some examples, forming the network may be performed during construction of the building. In some examples, forming the network may include coupling the circuits to windows of the building.

According some embodiments, a high-speed data communications network in or on a building includes a plurality of trunk line segments and one or more circuit, wherein the trunk line segments are coupled by the one or more circuit to form a daisy chain trunk line configuration, wherein the plurality of segments comprise coaxial cables, and wherein the one or more circuits are configured to deliver signals to, and to receive signals from, one or more device on, in, or outside the building.

In some examples, the one or more devices may include a window. In some examples, the one or more devices may include a controller configured to control functions of the window.

In some examples, the one or more device may be selected from the group consisting of Internet of Things (IoT) devices, wireless devices, sensors, antennas, 5G devices, microphones, microprocessors, and speakers. In some examples, the one or more device may be is in, or on, a structure of the building.

In some examples, the one or more circuits may include an inductor and a capacitor.

In some examples, the one or more circuits may include an antenna. In some examples, the antenna may be a 5G antenna.

In some examples, the one or more circuits may include two or more connectors. In some examples, the two or more connectors may be configured to be fastened to a coaxial cable and to a pair of conductors. In some examples, the connectors may include an RF connector. In some examples, the connectors may include a terminal block.

In some examples, the signals may include data having a greater than 1 Gpbs transmission rate.

In some examples, the signals may include power signals. In some examples, the power signals include CLASS 2 power signals.

In some examples, the signals may include TCP/IP data and power signals.

In some examples, the signals may include 5G signals.

In some examples, the signals may include wireless data.

In some examples, the one or more devices may include an optically switchable window. In some examples, the optically switchable window may include an electrochromic window. In some examples, the optically switchable window may include, a digital display technology.

In some examples, at least a portion of the trunk line may be is installed in or on an exterior wall of the building.

In some examples, the one or more devices may include a transceiver, antenna and/or repeater, and wherein the one or more device is installed in, or on, an exterior structure of the building. In some examples, the exterior structure may include an exterior wall.

In some examples, the exterior structure may include a roof.

In some examples, the one or more devices may include an antenna.

In some examples, the one or more device may be are installed in, or on, windows of the building.

In some examples, the one or more circuits may include a transceiver, antenna and/or repeater.

In some examples, the one or more circuit may include a directional coupler circuit.

In some examples, the one or more circuit may include a bias T circuit.

These and other features and embodiments will be described in more detail below with reference to the drawings.

BRIEF DESCRIPTION OF THE DRAWINGS

FIGS. 5A through 5D illustrate a number of examples of applications and uses of the digital architectural element and related elements contemplated by the present disclosure.

DETAILED DESCRIPTION

Figure 1A:
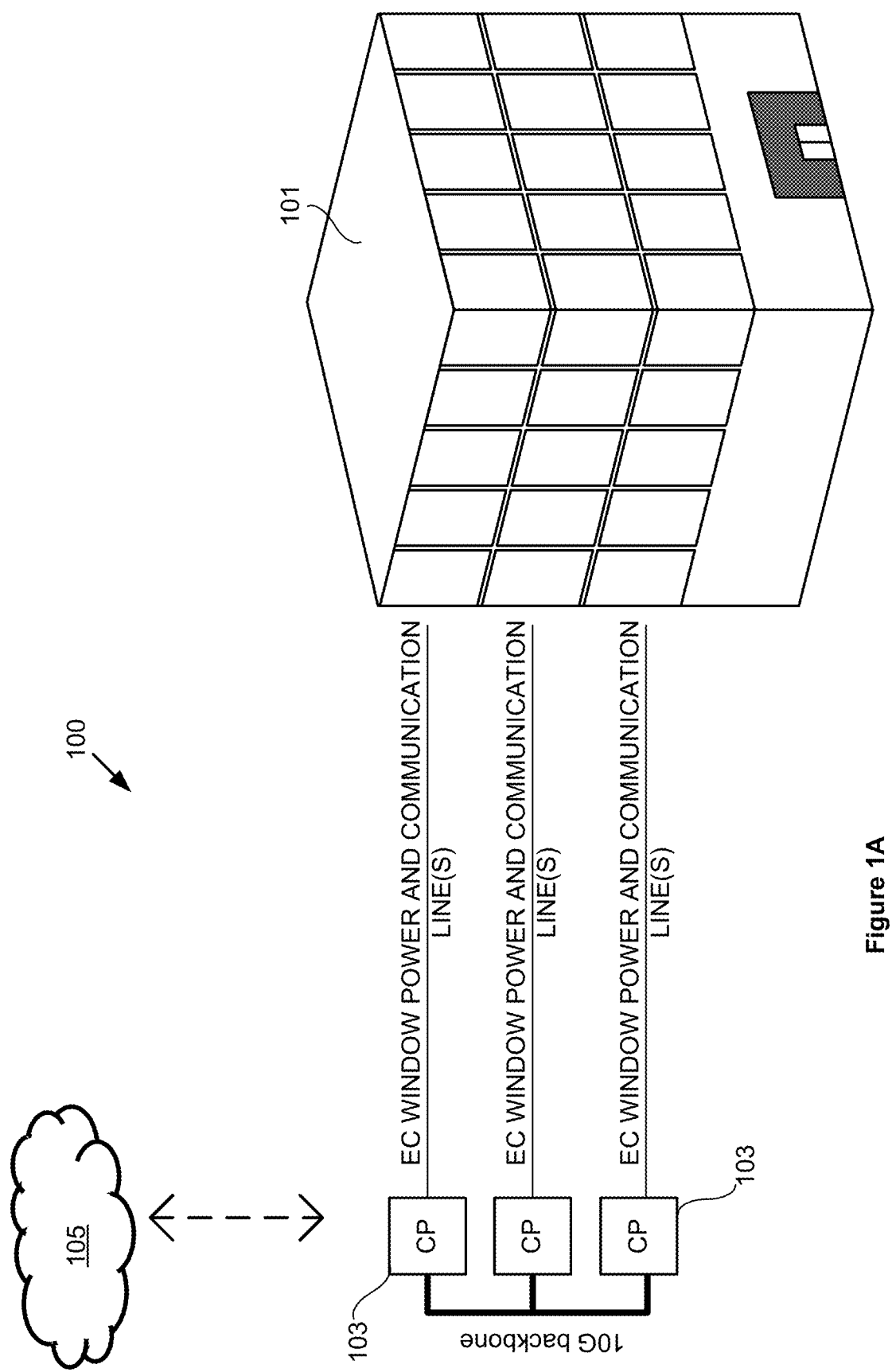
FIGS. 1A-1D show various link technologies and topologies that may be used with the present disclosure.

The following detailed description is directed to certain embodiments or implementations for the purposes of describing the disclosed aspects. However, the teachings herein can be applied and implemented in a multitude of different ways. In the following detailed description, references are made to the accompanying drawings. Although the disclosed implementations are described in sufficient detail to enable one skilled in the art to practice the implementations, it is to be understood that these examples are not limiting; other implementations may be used and changes may be made to the disclosed implementations without departing from their spirit and scope. Furthermore, while the disclosed embodiments focus on electrochromic windows (also referred to as optically switchable windows, tintable and smart windows), the concepts disclosed herein may apply to other types of switchable optical devices including, for example, liquid crystal devices and suspended particle devices, among others. For example, a liquid crystal device or a suspended particle device, rather than an electrochromic device, could be incorporated into some or all of the disclosed implementations. Additionally, the conjunction "or" is intended herein in the inclusive sense where appropriate unless otherwise indicated; for example, the phrase "A, B or C" is intended to include the possibilities of "A," "B," "C," "A and B," "B and C," "A and C," and "A, B, and C."

Enterprise Communication/Networking Components

The window systems and associated components disclosed in these embodiments can facilitate high bandwidth (e.g., gigabit) communication and associated data processing. These communications and data processing may employ optically switchable window systems components and facilitate various window and non-window functions as described herein and in PCT Patent Application No. PCT/US18/29476, filed Apr. 25, 2018, U.S. Patent Application No. 62/666,033, filed May 2, 2018, and PCT Patent Application No. PCT/US18/29406, filed Apr. 25, 2018. Some of the optically switchable window system components include components of a communications network and power distribution system for powering window transitions as described in U.S. patent application Ser. No. 15/365,685, filed Nov. 30, 2016.

Example components for enhancing functionality of a communications network that serves optically switchable windows may include: (1) a control panel with a high bandwidth switching and/or routing capability (e.g., one gigabit or faster Ethernet switch); (2) a backbone that includes control panels and high bandwidth links (e.g., 10 gigabit or faster Ethernet capability) between the control panels; (3) a digital element having sensors, display drivers, and logic for various functions that employ high data rate processing, the digital element configured, for example, as a digital wall interface or a digital architectural element such as a digital mullion; (4) an enhanced functionality window controller that includes an access point for wireless communication, e.g., a Wi-Fi access point; and (5) high bandwidth data communication links between the control panels and digital elements and/or enhanced functionality window controllers, the data communication links configured, for example, as trunk lines or to follow paths that at least partially overlap with the paths of trunk lines.

FIGS. 1A-1D show various link technologies and topologies adapted to power and control elctrochromic (EC) windows or other types of optically switchable windows. FIG. 1A presents a highly simplified top level view of a system 100 that includes a building 101 that includes a number of EC windows. A subset of the EC windows is connected by way of EC window power and communications lines to a "Control Panel" (CP) 103. Control panels will be described in more detail hereinbelow. In the illustrated example, three the building's windows are grouped in three subsets, each connected to a respective CP 103, but it will be appreciated that fewer or more than three CP's may be contemplated for any given building. In the illustrated example, the three CPs 103 are communicatively coupled by a high bandwidth 10 Gbps backbone, and to an external network 105.

Figure 1B:
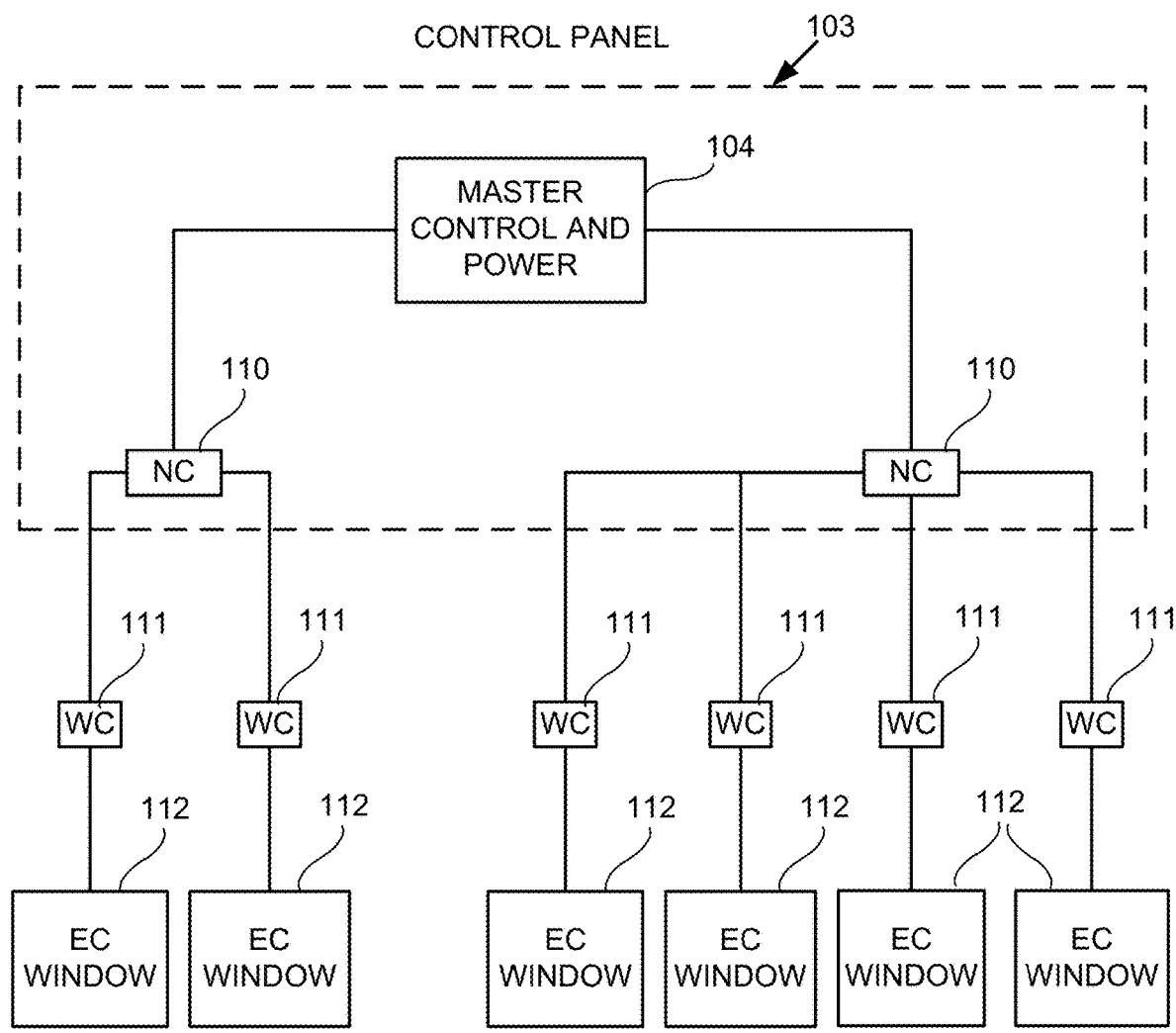

FIG. 1B illustrates a more detailed block diagram of a control panel 103 interfacing with a plurality of EC windows 112. In the illustrated example the control panel 103 includes a master control and power module 104 and to network controllers (NC's) 110. It will be appreciated that the control panel 103 may include fewer or more NC's 110 than illustrated. Each NC 110 is competitively coupled with two or more window controllers (WC's) 111, each window controller 111 being associated with a respective EC window 112.

Figure 1C:
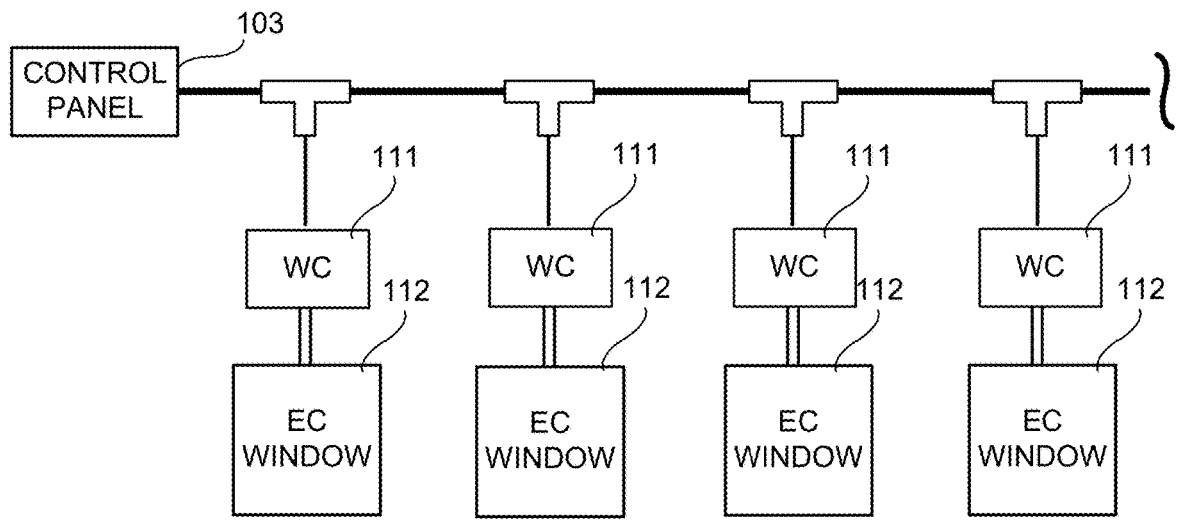
Figure 1D:
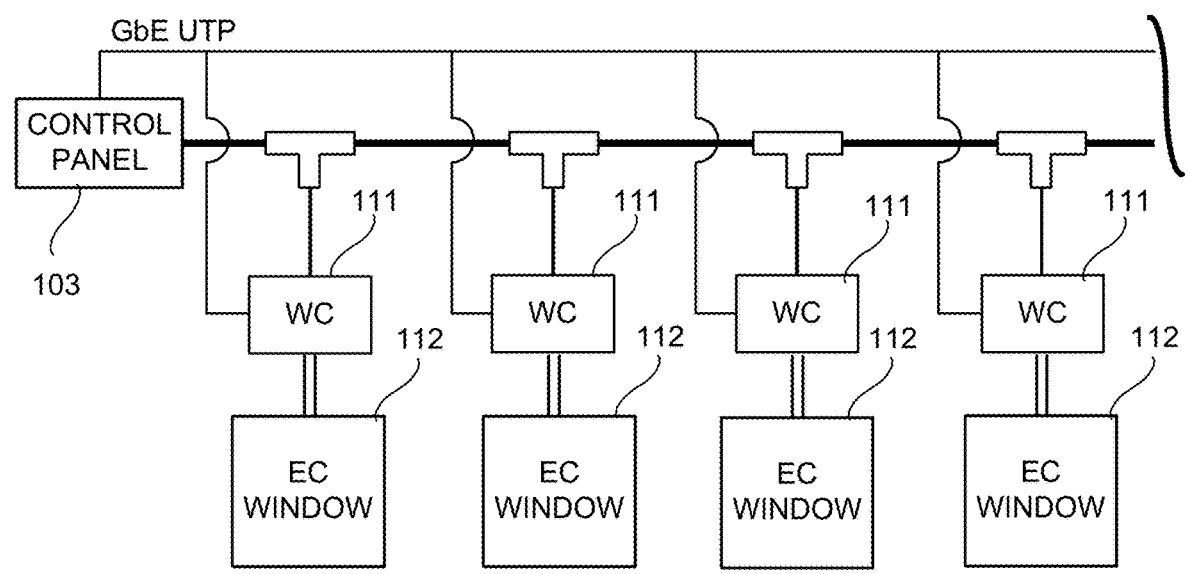

Referring now to FIG. 1C and FIG. 1D, in certain embodiments, communicative coupling between the control panel 103 in the window controllers 111 may be accomplished in a trunk line format. An unshielded twisted pair (UTP) line and/or implementations of MoCA (Multimedia over Coax Alliance) data transmission protocols can be integrated into a trunk line system, or run parallel or independently of the trunk line. As indicated in FIG. 1C, for example, a coaxial cable capable of transmitting data using MoCA is provided within a trunk line; i.e., a coaxial cable runs within the trunk line architecture. In FIG. 1D, a UTP system is implemented independent and parallel to a trunk line system. In certain embodiments, a UTP cable is incorporated into a trunk line path.

Figure 1E:
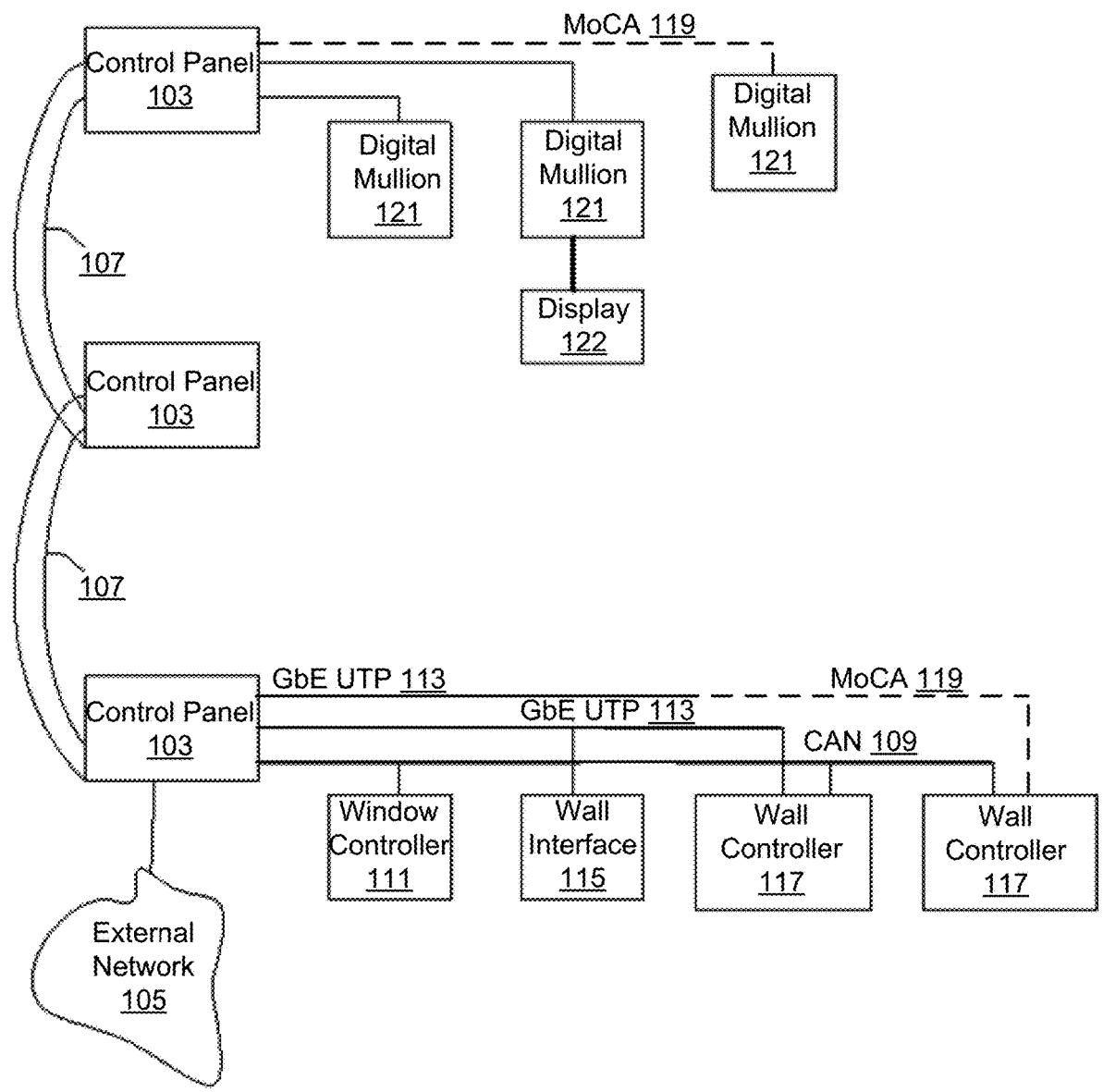
FIG. 1E shows an example of a data communication system that can provide data for interacting with optically switchable windows and for non-window purposes.

While FIGS. 1A through 1D show only conventional window controllers, the links may also provide data transmission to other elements such as digital wall interfaces, enhanced functionality window controllers, digital architectural elements, and the like. FIG. 1E shows an example of a data communication system that can provide data for interacting with optically switchable windows and for non-window purposes. As depicted, a building's communication system has multiple control panels (CPs) 103, with at least one connected to an external network 105 such as the internet, which may allow access to a variety of services and/or content, such as cloud-based services and/or content. Each control panel 103 may contain components for delivering power to one or more window controllers and/or other devices in the building and a master or network controller as described elsewhere herein. Example features of control panels and their components are provided in U.S. patent application Ser. No. 15/365,685, filed Nov. 30, 2016, previously incorporated by reference. In the depicted embodiment, each control panel 103 also has a high bandwidth data communications switch such as a 10 gigabit per second (Gbps) Ethernet switch.

Each control panel 103 is linked to one or more other control panels via appropriate cabling 107 to create a data network backbone. In certain embodiments, cabling 107 includes twinaxial cabling, which may employ copper conductors in an insulating shield. Twinaxial cable is suitable for communication distances of a few hundred feet. In certain embodiments, high bandwidth, e.g., 2.5 Gbps and beyond, coaxial is used. Current and evolving implementations of MoCA data transmission protocols support this. Still further, in some cases, particularly those requiring only relatively short links, an unshielded twisted pair cable may be used. Certain embodiments employ high bandwidth (e.g., 10 Gbps or greater) wireless connections. These embodiments may employ sets of parabolic antennas and parabolic receivers.

Various types of data transmission lines may be employed to provide data communications between the control panels 103 and destination devices in the building such as optically switchable windows and/or non-window devices in a building. In the depicted embodiment, a data transmission line 109 and associated interfaces supports a controller network protocol such as the Controller Area Network (CAN) protocol CAN 2.0. In the depicted embodiment, transmission line 109 and associated interfaces provide data communications between conventional window controllers 111 and other types of controllers in the control panels 103. Examples of such other controllers include network and master controllers. Data transmission lines 109 may be employed to provide communications to other devices (not shown) that can function using data provided with the bandwidth limitations of a controller area network.

Another type of data transmission line is a high bandwidth network line 113 such as a gigabit Ethernet (GbE) line, which may be a UTP line (as illustrated), or a twinax line, etc. High bandwidth lines 113 can provide data links between control panels 103 and one or more types of devices that may require high data rates for certain functions. In the depicted embodiment, such devices include digital wall interfaces 115 and enhanced functionality window controllers 117, both described elsewhere herein. In some implementations, enhanced functionality window controllers 117 are connected to both a controller network (e.g., controller network line/CAN bus 109) and a high bandwidth line 113.

In the depicted embodiment, high bandwidth data transmission may be provided by either or both of an unshielded twisted pair line supporting gigabit Ethernet and one or more of coaxial lines 119. In some embodiments, data transmission over the coaxial line(s) 119 may be in accordance with a protocol such as that promulgated by the Multimedia over Coax Alliance (MoCA) that functionally bonds channels in a coaxial cable, each channel carrying a different frequency band, into a single combined line that has high bandwidth, e.g., of about 1 Gbps or higher. MoCA protocols are described elsewhere herein. Other link technology such as wireless may be used in place of or to supplement the UTP or coaxial lines.

As depicted, a top control panel 103 serves three digital architectural elements (digital mullions 121 in this case, with one connected to a video display device 122). Either or both GbE UTP lines 113 and coaxial cable 119 may be employed to provide high bandwidth data communication between the control panel and the digital architectural elements.

Figure 2A:
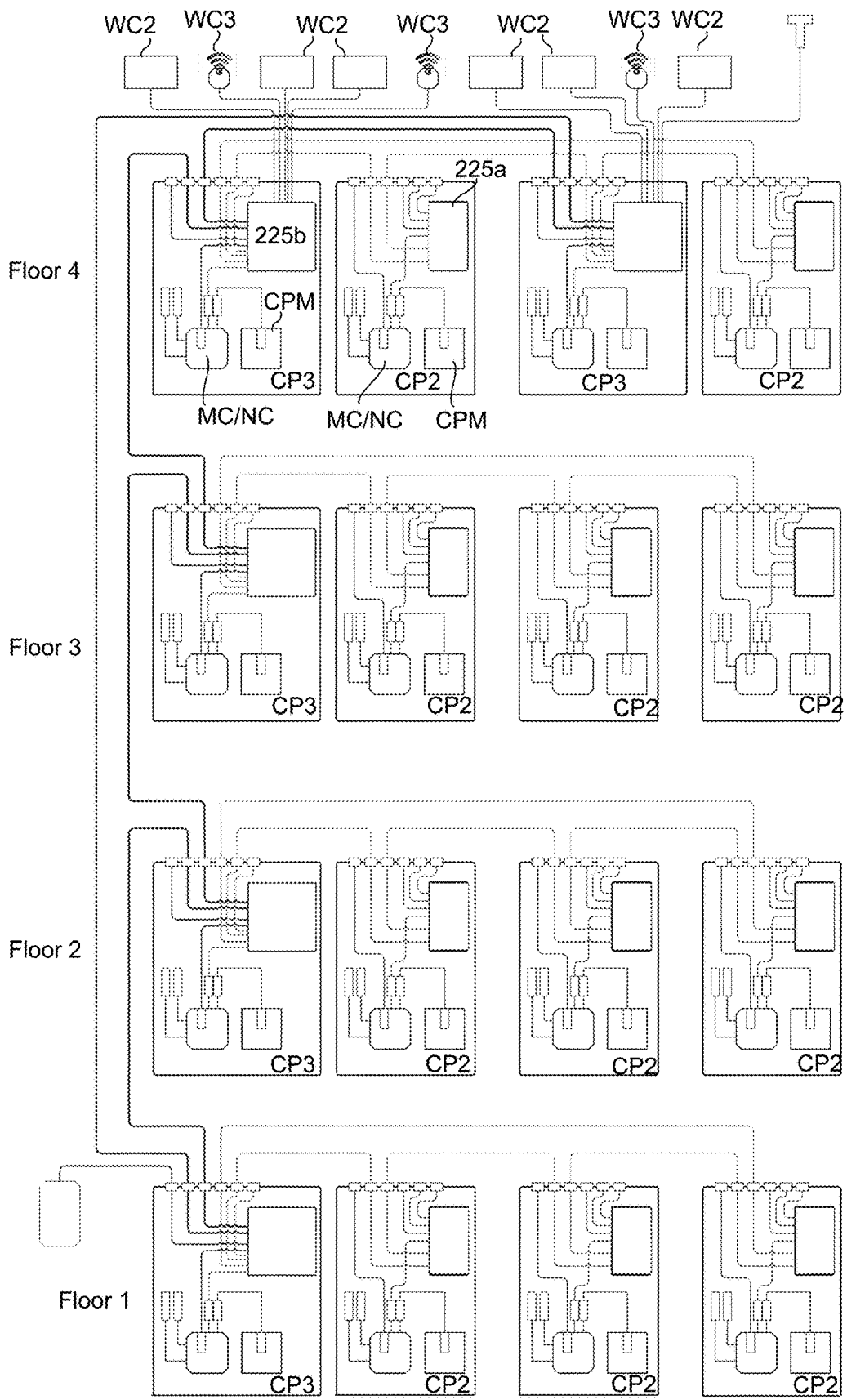
FIGS. 2A and 2B show a high bandwidth communications network for a building, according to some embodiments.
Figure 2B:
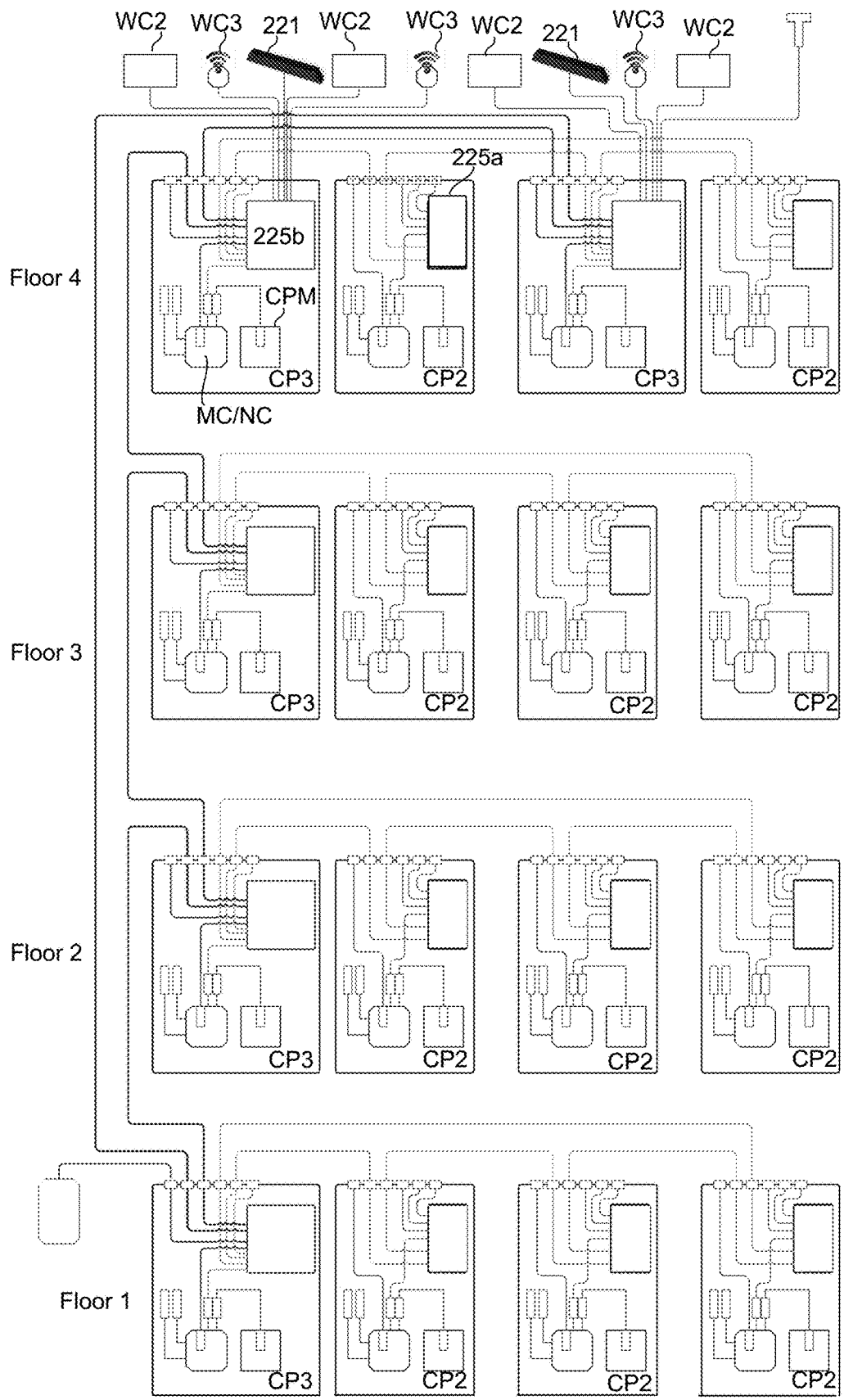

FIGS. 2A and 2B show a high bandwidth communications network for a building, according to some embodiments. In both figures, control panels, which may have similar functionality to CP 103 described in connection with FIGS. 1A-1E, are identified as modules labeled CP2 or CP3. In the illustrated example, each control panel includes a master and/or network controller (MC/NC), a control panel monitor (CPM), and a communications network switch 225a or 225b. In certain embodiments, the control panel monitors have one or more features presented in U.S. patent application Ser. No. 15/365,685, filed Nov. 30, 2016, previously incorporated by reference. In some implementations, a CP2 network switch 225a includes multiple (e.g., two) small form-factor pluggable (SFP) transceiver ports and multiple (e.g., four) 100 Mb Ethernet ports. One example of a suitable network switch is the IE 2000 switch available from Cisco Systems of San Jose, Calif. The SFP ports are plug-ins for optical fiber connections. In certain embodiments, one or more of the SFP ports supports 850 nm optical communications, or 1310 nm optical communications, or 1550 nm optical communications.

In the CP3 control panels, the network switch 225b can accommodate data rates beyond what is required for the optically switchable window system. As such, a CP3 switch 225b may require more bandwidth than is provided in components dedicated solely to the window system (e.g., the CP2s). In certain embodiments, the high bandwidth switches of high bandwidth control panels (e.g., the CP3s) contain multiple (e.g., four) SFPs, multiple (e.g., eight) Gb Ethernet ports, and multiple (e.g., eight) PoE (Power over Ethernet) Gb Ethernet ports. In certain embodiments, each port can support at least a 10 Gb line. In certain embodiments, the switches may be configured to aggregate the ports, if desired, to produce up to a 40 Gb Ethernet port. One example of a suitable network switch is the IE 4000 switch available from Cisco Systems of San Jose, Calif.

The backbone for high bandwidth cabling may be directed upward through vertical riser conduits in a multistory building. If necessary to support high bandwidth communication throughout all communication elements of a building (e.g., including all digital architectural elements and all wall interfaces), the high bandwidth cabling may be directed horizontally on one or more floors of the building. In a core and shell building, for example, the initial construction may include vertical riser conduits but not include horizontal conduits, which would be installed later when the building has tenants.

In certain embodiments, control panels and associated links with high bandwidth capability are used together as a network backbone. In other words, every component in the backbone has high bandwidth transmission capability. As used herein, unless otherwise specified, "high bandwidth" describes a network component having at least about 0.5 gigabits per second or faster data transmission and/or data processing capability. In certain embodiments, the data transmission network includes a 10 Gbps backbone.

In certain embodiments, a network backbone provides connectivity to another network located outside the building having the backbone. In one example, the other network is a wide area network or simply the internet. Components of the backbone may be designed or configured for cloud connectivity; for example, the control panels may include components for connecting to Comcast Business, Level 3 Communications, or the like.

As indicated above, some network configurations include controller network components such as a CAN interface in window controllers and control panels. Further, some network configurations additionally include high bandwidth network components such as an Ethernet switches and Ethernet lines from control panel.

As described above in connection with FIGS. 1A-1E, a controller network may provide data transmission for standard window controllers (WC2's) dedicated to controlling optically switchable windows. In addition, the controller network may provide data transmission supporting enhanced functionality window controllers (WC3's) that may have a Wi-Fi access point, cellular capability, etc. In certain embodiments, enhanced functionality window controllers connect to a controller network bus to send and receive data relating to controlling optically switchable windows assigned to the window controllers. Additionally, the enhanced functionality window controllers may connect to a high bandwidth line such as a gigabit Ethernet line to send and receive data relating to non-window functions such as Wi-Fi and/or cellular communications.

In certain embodiments, enhanced functionality window controllers are deployed at locations where needed to provide a wireless communication service within a building. As an example, one enhanced functionality window controller may be deployed for every 2500 square feet of building space; this may correspond to about one enhanced functionality window controller per 50 linear feet. More generally, enhanced functionality window controllers may be deployed in a building such that adjacent controllers are separated by distance of between about 30 and 100 feet. In certain embodiments, adjacent enhanced functionality window controller are separated along a trunk line by about four to ten IGUs, e.g., by approximately every six IGUs.

In certain embodiments, the enhanced functionality window controllers receive data via drops from a trunk line as illustrated in the examples depicted in FIGS. 1, 2A, and 2B and discussed in U.S. patent application Ser. No. 15/365,685, filed Nov. 30, 2016, previously incorporated by reference. A trunk line can be used to carry the data transmission cables. Drop lines from the trunk line can be used to provide data (and power) from the trunk lines to the individual enhanced functionality window controllers. In alternative embodiments, the network topology includes a separate data line running to each of one or more enhanced functionality window controllers.

In certain embodiments, the lines providing data from the control panels to the enhanced functionality window controllers WC3 (as well as conventional window controllers WC2, in some embodiments) are gigabit Ethernet lines, which may be embodied as an unshielded twisted pair (UTP), twinax cable, etc. In some cases, data to all or many of the enhanced functionality window controllers is made entirely via the gigabit Ethernet UTP lines.

In certain embodiments, some or all of the data provided to one or more of the enhanced functionality window controllers WC3 is provided via a high bandwidth coaxial cable. In one example, the coaxial cable and associated network controllers are designed or configured to transmit data using one of the MoCA standards, which provides an internet protocol suite, envisioned, at least in part, by the cable TV industry. As mentioned, in some implementations, MoCA provides gigabit Ethernet bandwidth over a coaxial cable.

The MoCA protocols include a technique known as bonding to provide multiple channels, each of limited bandwidth, so that together the channels provide a much higher bandwidth. In some implementations, each of the bonded channels employs a distinct frequency band, each at about 155 kB. In some implementations, to provide gigabit bandwidth, sixteen coaxial channels are aggregated to become a gigabit channel. If less than gigabit bandwidth is needed, fewer channels need be bonded. In some cases, different channels are coupled to different endpoints, thus allowing different bands. The network can separate traffic to different end points, allowing implementation of virtual networks, for example. Cable caps may be deployed on the coaxial cable to connect with additional enhanced functionality window controllers. In some embodiments, MoCA or a similarly bandwidth scalable approach allows the building infrastructure to add and subtract window controllers, including enhanced functionality window controllers relatively seamlessly.

In certain embodiments, a trunk line from a control panel to one or more window controllers and/or digital elements (e.g., digital wall interfaces or digital architectural elements) employs both coaxial and non-coaxial line. For example, a first portion of the line from a control panel is a twinax or UTP line and a second portion of the line, which is connected to the first portion, is a coaxial line configured to transmit data using, e.g., a MoCA protocol. Both the first portion and the second portion of the trunk line may be designed or configured to support gigabit transmission rates. In certain embodiments, the first and second portions of the trunk line are connected using a T connector. For example, a twinax or UTP line runs from a control panel and then connects to a coaxial cable (for MoCA protocol), when then runs to the terminus where the last window controller (conventional or enhanced) is located.

In some embodiments, a coaxial cable is configured as or incorporated into a trunk line. In this manner, cable drops can be made, as needed, to window controllers and/or other devices along the length of the trunk line. In some cases, no extra lines are needed, just one coaxial cable per trunk line. In certain embodiments, high bandwidth data communications lines (coaxial, UTP, twinax, etc.) can follow trunk line paths as defined for, e.g., power delivery. If desired, such high bandwidth lines can be installed during construction but used only later, when digital elements are installed, assuming that they are installed later rather than when the building is constructed.

In some embodiments, as illustrated in FIG. 2B, a high bandwidth communications network for a building incorporates digital mullions 221 or other enhanced functionality digital architectural elements.

Multi-Component Digital Elements on Building Elements

As indicated above, a high bandwidth network as described herein may include a plurality of digital elements with robust sensing and data processing capabilities and/or one or more additional features such as data storage and/or user interface capabilities. Components enabling these capabilities are described below and may be referred to herein, generally as "sensors and other peripheral" components or elements. Uses and functions of digital elements are also described below.

As explained below, digital elements may be provided in various formats and housings that allow, as the purpose dictates, installation on building structural elements, which are typically permanent elements, and/or on building walls, floors, ceilings, or roofs. In various embodiments, the chassis or housing of a digital element is no greater than about 5 meters in any dimension, or no greater than about 3 meters in any dimension. In various embodiments, the housing is rigid or semi-rigid and encompasses some or all components of the element. In some cases, the housing provides a frame or scaffold for attaching one or more components such as a speaker, a display, an antenna, or a sensor. In some embodiments, the housing provides external access to one or more ports or cables such as ports or cables for attaching to network links, video displays, mobile electronic devices, battery chargers, etc.

Window controller networks and associated digital elements may be installed relatively early in the construction of office buildings and other types of buildings. Frequently, the window controller network is installed before any other network, e.g., before networks for other building functions such as Building Management Systems (BMSs), security systems, Information Technology (IT) systems of tenants, etc.

In the absence of the present teachings, the sensors and other peripheral elements are designed around the walls and ceilings of the building after the construction and as a result may be costly to install, operate and maintain. In certain embodiments of this disclosure, a high bandwidth window network and associated digital components are installed early and provide associated sensors and peripherals in the skin or fabric of the building (e.g., structural building components, particularly those on the perimeter of the building or rooms such as walls, partitions, frames, beams, mullions, transoms, and the like). The installation may occur during building construction. The installed network may utilize remote operational capabilities of a window network (e.g., sensing, data transmission, processing) to reduce the installation and operating costs of sensors, which are currently silo-ed, and edge network technologies.

Regarding operating costs, managing and operating siloed sensor networks is very expensive. In certain embodiments, a high bandwidth building network and associated digital elements facilitate central monitoring and operating of sensors and other peripherals, thereby significantly reduces the operating cost of sensor networks.

In certain embodiments, sensors on a window network are installed close to where building occupants spend their time, thereby improving the sensors' effectiveness in providing occupant comfort. As discussed below, digital elements as described herein that are connected to a high bandwidth network may be deployed in various locations throughout a building. Examples of such locations include building structural elements in offices, lobbies, mezzanines, bathrooms, stairwells, terraces, and the like. Within any of these locations, digital elements may be positioned and/or oriented proximate to occupant positions, thereby collecting environment data that is most appropriate for triggering building systems to act in a way maintain or enhance occupant comfort.

In certain embodiments, the sensing, data processing, and data storage capabilities of a high bandwidth window network provides an infrastructure for building interactive applications or personal digital assistants such as Microsoft's Cortana, Apple's Siri, Amazon's Alexa, and Google's Google Home. The usefulness of such applications and personal digital assistants is extended by direct interactions between a range of sensors and a building's occupants. As described more fully below, such interactions include computer vision, analytics, machine learning, and the like.

Digital Architectural Element

A digital architectural element (DAE) may contain various sensors, a processor (e.g., a microcontroller), a network interface, and one or more peripheral interfaces. Examples of DAE sensors include light sensors, optionally including image capture sensors such as cameras, audio sensors such as voice coils or microphones, air quality sensors, and proximity sensors (e.g., certain IR and/or RF sensors). The network interface may be a high bandwidth interface such as a gigabit (or faster) Ethernet interface. Examples of DAE peripherals include video display monitors, add-on speakers, mobile devices, battery chargers, and the like. Examples of peripheral interfaces include standard Bluetooth modules, ports such as USB ports and network ports, etc. In addition or alternatively, ports include any of various proprietary ports for third party devices.

In certain embodiments, the digital architectural element works in conjunction with other hardware and software provided for an optically switchable window system (e.g., a display on window). In certain embodiments, the digital architectural element includes a window controller or other controller such as a master controller, a network controller, etc.

In certain embodiments, a digital architectural element includes one or more signal generating device such as a speaker, a light source (e.g., and LED), a beacon, an antenna (e.g., a Wi-Fi or cellular communications antenna), and the like. In certain embodiments, a digital architectural element includes an energy storage component and/or a power harvesting component. For example, a element may contain one or more batteries or capacitors as energy storage devices. Such elements may additionally include a photovoltaic cell. In one example, a digital architectural element has one or more user interface components (e.g., a microphone or a speaker), and one more sensors (e.g., a proximity sensor), as well a network interface for a high bandwidth communications.

In various embodiments, a digital architectural element is designed or configured to attach to or otherwise be collocated with a structural element of building. In some cases, a digital architectural element has an appearance that blends in with the structural element with which it is associated. For example, a digital architectural element may have a shape, size, and color that blends with the associated structural element. In some cases, a digital architectural element is not easily visible to occupants of a building; e.g., the element is fully or partially camouflaged. However, such element may interface with other components that do not blend in such as video display monitors, touch screens, projectors, and the like.

The building structural elements to which digital architectural elements may be attached include any of various building structures. In certain embodiments, building structures to which digital architectural elements attach are structures that are installed during building construction, in some cases early in building construction. In certain embodiments, the building structural elements for digital architectural elements are elements that serve as a building structural function. Such elements may be permanent, i.e., not easy to remove from a building. Examples include walls, partitions (e.g., office space partitions), doors, beams, stairs, façades, moldings, mullions and transoms, etc. In various examples, the building structural elements are located on a building or room perimeter. In some cases, digital architectural elements are provided as separate modular units or boxes that attach to the building structural element. In some cases, digital architectural elements are provided as façades for building structural elements. For example, a digital architectural element may be provided as a cover for a portion of a mullion, transom, or door. In one example, a digital architectural element is configured as a mullion or disposed in or on a mullion. If it is attached to a mullion, it may be bolted on or otherwise attached to the rigid parts of the mullion. In certain embodiments, a digital architectural element can snap onto an building structural element. In certain embodiments, a digital architectural element serves as a molding, e.g., a crown molding. In certain embodiments, a digital architectural element is modular; i.e., it serves as a module for part of a larger system such as a communications network, a power distribution network, and/or computational system that employs an external video display and/or other user interface components.

In some embodiments, the digital architectural element is a digital mullion designed to be deployed on some but not all mullions in a room, floor, or building. In some cases, digital mullions are deployed in a regular or periodic fashion. For example, digital mullions may be deployed on every sixth mullion.

In certain embodiments, in addition to the high bandwidth network connection (port, switch, router, etc.) and a housing, the digital architectural element includes multiple of the following digital and/or analog components: a camera, a proximity or movement sensor, an occupancy sensor, a color temperature sensor, a biometric sensor, a speaker, a microphone, an air quality sensor, a hub for power and/or data connectivity, display video driver, a Wi-Fi access point, an antenna, a location service via beacons or other mechanism, a power source, a light source, a processor and/or ancillary processing device.

One or more cameras may include a sensor and processing logic for imaging features in the visible, IR (see use of thermal imager below), or other wavelength region; various resolutions are possible including HD and greater.

One or more proximity or movement sensors may include an infrared sensor, e.g., a an IR sensor. In some embodiments, a proximity sensor is a radar or radar-like device that detects distances from and between objects using a ranging function. Radar sensors can also be used to distinguish between closely spaced occupants via detection of their biometric functions, for example, detection of their different breathing movements. When radar or radar-like sensors are used, better operation may be facilitated when disposed unobstructed or behind a plastic case of a digital architectural element.

One or more occupancy sensor may include a multi-pixel thermal imager, which when configured with an appropriate computer implemented algorithm can be used to detect and/or count the number of occupants in a room. In one embodiment, data from a thermal imager or thermal camera is correlated with data from a radar sensor to provide a better level of confidence in a particular determination being made. In embodiments, thermal imager measurements can be used to evaluate other thermal events in a particular location, for example, changes in air flow caused by open windows and doors, the presence of intruders, and/or fires.

One or more color temperature sensors may be used to analyze the spectrum of illumination present in a particular location and to provide outputs that can be used to implement changes in the illumination as needed or desired, for example, to improve an occupant's health or mood.

One or more biometric sensor (e.g., for fingerprint, retina, or facial recognition) may be provided as a stand-alone sensor or be integrated with another sensor such as a camera.

One or more speakers and associated power amplifiers may be included as part of a digital architectural element or separate from it. In some embodiments, two or more speakers and an amplifier may, collectively, be configured as a sound bar; i.e., a bar-shaped device containing multiple speakers. The device may be designed or configured to provide high fidelity sound.

One or more microphones and logic for detecting and processing sounds may be provided as part of a digital architectural element or separate from it. The microphones may be configured to detect one or both of internally or externally generated sounds. In one embodiment, processing and analysis of the sounds is performed by logic embodied as software, firmware, or hardware in one or more digital structural element and/or by logic in one or more other devices coupled to the network, for example, one or more controllers coupled to the network. In one embodiment, based on the analysis, the logic is configured to automatically adjust a sound output of one or more speaker to mask and/or cancel sounds, frequency variations, echoes, and other factors detected by one or more microphone that negatively impact (or potentially could negatively impact) occupants present in a particular location within a building. In one embodiment, the sounds comprise sounds generated by, but not limited to: indoor machinery, indoor office equipment, outdoor construction, outdoor traffic, and/or airplanes.

In embodiments, one or more microphones are positioned on, or next to, windows of a building; on ceilings of the building; and/or or other interior structures of the building. The logic may be configured in a singular or arrayed fashion to analyze and determine the type, intensity, spectrum, location and/or direction interior sounds present in a building. In one embodiment, the logic is functionally connected to other fixed or moving network connected devices that may be being used in a building, for example, devices such as computers, smart phones, tablets, and the like, and is configured to receive and analyze sounds or related signals from such devices.

In one embodiment, the logic is configured to measure and analyze real time delays in signals from microphones to predict the amount and type of sound needed to mask or cancel unwanted external and/or internal sound present at a particular location in the building. In one embodiment, the logic is configured to detect changes in the level and/or location of the unwanted external and/or internal sound where, for example, the changes can be caused by movements of objects and people within and outside a building, and to dynamically adjust the amount of the masking and/or canceling sound based on the changes. In one embodiment, the logic is configured to use signals from tracking sensors in a building and, according to the signals, to cause the masking and/or canceling sounds to be increased or decreased at a particular location in the building according to a presence and/or location of one or more occupant. In one embodiment, one or more of the speakers are positioned to generate masking and/or canceling sounds that propagate substantially in a plane of travel of unwanted sound, including in a horizontal plane, vertical plane, and/or combinations of the two.

In one embodiment, the logic comprises an algorithm designed to acoustically map an interior of a building, to locate in-office noise source locations, and to improve speech privacy. In one embodiment, after an array of speakers and microphones is installed in a building, the logic may be used to perform an acoustical sweep so as to cause each speaker to generate sound that in turn is detected by each microphone. In one embodiment, time delays, sound level decreases, and spectrum differences in the detected sounds are used to calculate and map effective acoustical distances between speakers, microphones, and between them. In one embodiment, an acoustical transfer function of an interior of a building map may be obtained from the acoustical sweep. With such an acoustical map and set of transfer functions of one or more space within a building, the logic can make appropriate masking and/or canceling level determinations when sources of unwanted sounds generated in the spaces are present. When needed, the logic can adjust speaker generated sounds to correct for absorption of certain absorptive surfaces, for example, a sound that may otherwise be sound muffled bouncing off of a soft partition can be adjusted to sound crisp again. The acoustical map of a space can also be used to determine what is direct versus indirect sound, and adjust time delays of masking and/or canceling sounds so that they arrive at a desired location at the same time.

One or more air quality sensor s (optionally able to measure one or more of the following air components: volatile organic compounds (VOC), carbon dioxide temperature, humidity) may be used in conjunction with HVAC to improve air circulation control.

One or more hubs for power and/or data connectivity to sensor(s), speakers, microphone, and the like may be provided. The hub may be a USB hub, a Bluetooth hub, etc. The hub may include one or more ports such as USB ports, High Definition Multimedia Interface (HDMI) ports, etc. Alternatively or in addition, the element may include a connector dock for external sensors, light fixtures, peripherals (e.g., a camera, microphone, speaker(s)), network connectivity, power sources, etc.

One or more video drivers for a display (e.g., a transparent OLED device) on or proximate to an integrated glass unit (IGU) associated with the architectural element may be provided. The driver may be wired or optically coupled; e.g., the optical signal is launched into the window by optical transmission; see, e.g., a switchable Bragg grating that includes a display with a light engine and lens that focuses on glass waveguides that transmits through the glass and travels perpendicularly to line of sight.

One or more Wi-Fi access points and antenna(s), which may be part of the Wi-Fi access point or serve a different purpose. In certain embodiments, the architectural element itself or faceplate that covers all or a portion of the architectural element serves as an antenna. Various approaches may be employed to insulate the architectural element and make it transmit or receive directionally. Alternatively, a prefabricated antenna may be employed or a window antenna as described in PCT Patent Application No. PCT/US17/31106, filed May 4, 2017, incorporated herein by reference in its entirety.

One or more power sources such as an energy storage device (e.g., a rechargeable battery or a capacitor), and the like may be provided. In some implementations, a power harvesting device is included; e.g., a photovoltaic cell or panel of cells. This allows the device to be self-contained or partially self-contained. The light harvesting device may be transparent or opaque, depending on where it is attached. For example, a photovoltaic cell may be attached to, and partially or fully cover, the exterior of a digital mullion, while a transparent photovoltaic cell may be cover a display or user interface (e.g., a dial, button, etc.) on the digital architectural element.

One or more light sources (e.g., light emitting diodes) configured with the processor to emit light under certain conditions such signaling when the device is active.

One or more processors may be configured to provide various embedded or non-embedded applications. The processor may be a microcontroller. In certain embodiments, the processor is low-powered mobile computing unit (MCU) with memory and configured to run a lightweight secure operating system hosting applications and data. In certain embodiments, the processor is an embedded system, system on chip, or an extension.

One or more ancillary processing devices such as a graphical processing unit, or an equalizer or other audio processing device configured to interpret audio signals.

A digital architectural element or building structural element associated with a digital architectural element may have one or more antennas. These may be pre-constructed and attached to or embedded in the element, either on the surface on or in the element's interior. Alternatively, or in addition, an antenna may be configured such that the structure of a digital architectural element or building structural element serves as an antenna component. For example, a conductive metal piece of a mullion may serve as an antenna element or ground plane. In some embodiments, a portion of a digital architectural element or building structural element is removed (or added) so that the remaining portion serves as a tuned antenna element. For example, a part of a mullion may be punched out to provide a tuned antenna element. By attaching coaxial or other cable to the element and an RF transmitter or receiver, the building structural element and/or an associated digital architectural element may serve as an antenna element. The antenna components may be designed with an impedance (e.g., about 50 ohms) that matches that of the RF transmitter, for example.

Depending on construction, the antenna element may be a Wi-Fi antenna, a Bluetooth antenna, a cellular communication antenna, etc. In certain embodiments, the antenna transmits and/or receives in the radio frequency portion of the electromagnetic spectrum. The antenna may be a patch antenna, a monopole antenna, a dipole antenna, etc. It may be configured to transmit or receive electromagnetic signals in any appropriate wavelength range. Examples of antenna components that may be employed in optically switchable window systems are described in PCT Patent Application No. PCT/US17/31106, filed May 4, 2017, which was previously incorporated herein by reference in its entirety.

In various embodiments, a camera of a digital architectural element is configured to capture images in the visible portion of the electromagnetic spectrum. In some cases, the camera provides images in high resolution, e.g., high definition, of at least about 720p or at least about 1080p. In certain cases, the camera may also capture images having information about the intensity of wavelengths outside the visible range. For example, a camera may be able capture infrared signals. In certain implementations, a digital architectural element includes a near infrared device such as a forward looking infrared (FLIR) camera or near-infrared (NIR) camera. Examples of suitable infrared cameras include the Boson™ or Lepton™ from FLIR Systems, of Wilsonville, Oreg. Such infrared cameras may be employed to augment a visible camera in a digital architectural element.

In certain embodiments, the camera may be configured to map the heat signature of a room such that it may serve as a temperature sensor with three-dimensional awareness. In some implementations, such cameras in a digital architectural element enable occupancy detection, augment visible cameras to facilitate detecting a human instead of a hot wall, provide quantitative measurements of solar heating (e.g., image the floor or desks and see what the sun is actually illuminating), etc.

In certain embodiments, the speaker, microphone, and associated logic are configured to use acoustic information to characterize air quality or air conditions. As an example, an algorithm may issue ultrasonic pulses, and detect the transmitted and/or reflected pulses coming back to a microphone. The algorithm may be configured to analyze the detected acoustic signal, sometimes using a transmitted vs. received differential audio signal, to determine air density, particulate deflection, and the like to characterize air quality.

Figure 3:
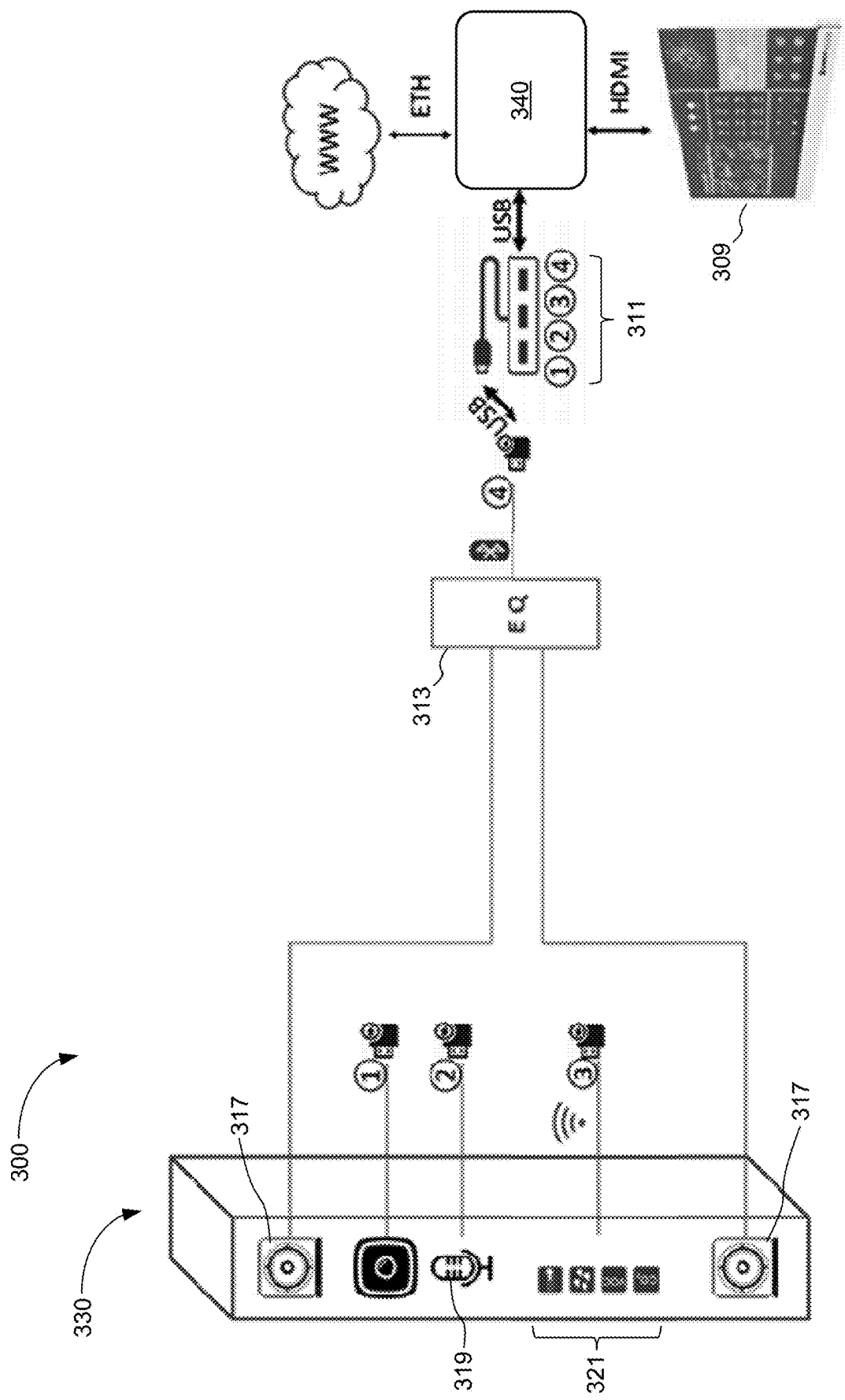
FIG. 3 illustrates a block diagram showing an example of components that may be present in certain implementations of a digital architectural element.

FIG. 3 illustrates a block diagram showing an example of components that may be present in certain implementations of a digital architectural element (DAE). In the illustrated example, an arrangement 300 includes a DAE 330 and a computer or processor 340. The computer processor 340 is connected to an external network such as the internet and optionally a cloud-based content and/or service provider. The connection may include an appropriate modem, router, or switch and may include a high bandwidth backbone such as the 10 G backbone described hereinabove. The computer or processor 340 is also connected to a video display 309 via, in this example, a HDMI link. Further, the computer 340 is connected to ports 311 (USB, Wi-Fi, Bluetooth, or otherwise) to make available additional internal or external resources for the DAE 330. As indicated hereinabove a DAE may include various sensors and peripheral elements. In the example illustrated in FIG. 3, DAE 330 includes speakers 317, microphone 319, and various sensors 321. Any one or more of these components may be coupled to the computer or processor 340 via the ports 311.

In the illustrated example, an equalizer 313 may be configured to provide tone control to adjust for acoustics of a room. In some cases, the equalizer 313 facilitates adjustment of room acoustics using, for example, real time, time delay reflectometry. The equalizer and associated components can thereby compensate for unwanted audio artifacts produced by interactions of the sound waves with items that are in a room or otherwise in close proximity with an occupant. In certain embodiments, a signal pulse is generated by a speaker associated with the digital architectural element, and one or more microphones pick up the pulse directly and as reflected and attenuated by items in the room. Based on the time delay between emitting and detecting the pulse, as well as the tonal quality of the detected pulse, the system can infer room boundaries, etc. In certain embodiments, a user's smart phone further enables optimizing speaker outputs for the acoustical environment of various locations in a room. During a set up mode, the user, with phone enabled, may move around a room and use the phone to detect the acoustical response. Based on the location and the detected acoustic response, the digital architectural element can determine how to optimize speaker output. After the acoustic profile of the room is mapped, the digital architectural element is programmed to tune its speaker output based on various factors such as where the user is located in a room. The element can, in some embodiments, detect the user location using any of a number of proximity techniques, such as those described in PCT Patent Application No. PCT/US17/31106, filed May 4, 2017, which was previously incorporated herein by reference in its entirety.

Digital Wall Interface

Certain aspects of this disclosure pertain to digital wall interfaces that contain some or all of the components that are used in a digital architectural element, and the digital wall interface is configured to include a chassis or housing that is designed for mounting on a wall or door of a partially or fully constructed building. The wall interface may be constructed to provide a user interface that is easily visible to users. It may have a relatively small footprint (e.g., at most about 500 square inches of user facing surface area) and be circularly or polygonally shaped. In certain embodiments, a digital wall interface is approximately tablet shaped and sized.

In certain embodiments, a digital wall interface has the same or similar features as a digital architectural element but it is a wall mounted device. For example, a digital wall interface may include the sensors and peripheral elements as described for the digital architectural element. Further, such elements may be included in a bar or similar chassis.

In various embodiments, a digital architectural element is provided with the building, as the building is being constructed, while a digital wall interface is installed in a building after the building construction is complete or nearly complete. In one approach to building construction, a plurality of digital architectural elements are installed during construction of the basic building structures—walls, partitions, doors, mullions and transoms, etc.—while one or more digital wall interfaces are installed shortly before or at the time of occupancy, e.g., by a tenant. Of course, once installed, the digital wall interfaces and the digital architectural elements can work in conjunction, e.g., as part of a mesh network, by sharing sensed results, by sharing analysis and control logic, etc.

In many embodiments, a digital wall interface includes a built in display configured to provide a user interface, and optionally a touch sensitive interface. In some but not all embodiments, a digital architectural element does not include a display or touch interface. Note that in some embodiments, a digital architectural element does not include a built in display but does have an associated display, e.g., a display connected to the element by an HDMI cable or a projector configured to project video controlled by the element. Similarly, a digital wall interface may be configured to work with a separate display such as a window display or a projection display.

While much of the discussion herein regarding uses, components, and functions of digital devices uses digital architectural elements as examples, in most cases a digital wall interface may serve a similar or identical purpose. So, unless the discussion focuses on a building structural element to which digital device is attached or associated with, the discussion applies equally to digital wall interfaces and digital architectural elements.

Enhanced Functionality Window Controllers (WC3).

As described hereinabove, in certain embodiments, an enhanced functionality window controller (WC3) may include a Wi-Fi access point, and optionally also has cellular communications capability. It is often configured to connect to multiple networks (e.g., a CAN bus and Ethernet).

In some embodiments, an enhanced functionality window controller may have the basic structure and function as described above herein, but with an added gigabit Ethernet interface and a processor with enhanced computing power. As with more conventional window controllers, the enhanced functionality window controller may have a CAN bus interface or similar controller network. In some embodiments, the controller has video capability and/or may include features described in U.S. patent application Ser. No. 15/287,646, filed Oct. 6, 2016, which is incorporated herein by reference in its entirety.

In certain embodiments, the enhanced functionality window controller is implemented as a module having (i) a processor with sufficiently high processing power to handle video and other functions requiring significant processing power, (ii) an Ethernet connection, (iii) optionally video processing capabilities, (iv) optionally a Wi-Fi access point or other wireless communications capability, etc. This module may be attached to a base board having other, more conventional, window controller functionality such as a power amplifier or another baseboard that is used with a ring sensor. The resulting device may be used to control an optically switchable window, or it may be used simply provide wireless communications, video, and/or other functions not necessarily associated with controlling the states of optically switchable windows.

In certain embodiments, the enhanced functionality window controller is provisioned, controlled, alarmed, etc. by a CAN bus or similar controller network protocol, as with a conventional window controller described herein, but additionally it provides video, Wi-Fi, and/or other extra functions.

Figure 4:
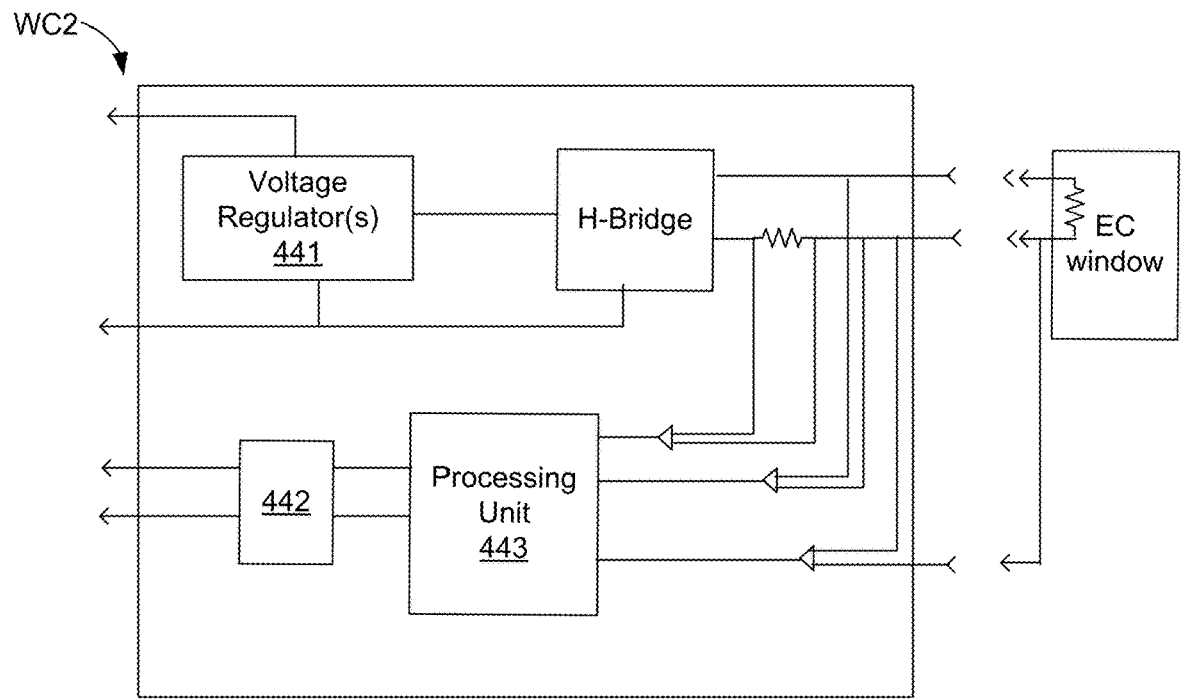
FIG. 4 illustrates a comparison between a block diagram of a conventional window controller and a block diagram of a window controller according to some embodiments.
Figure 4:
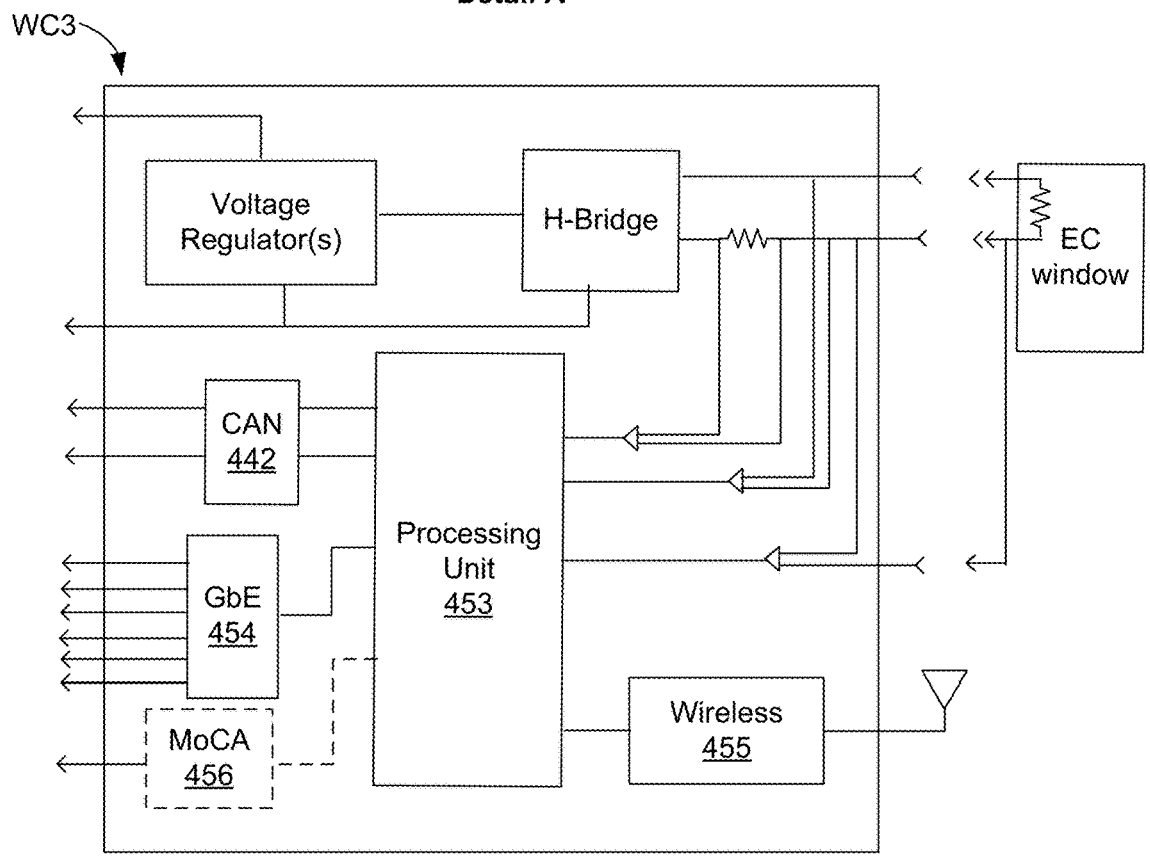
Figure 5D:
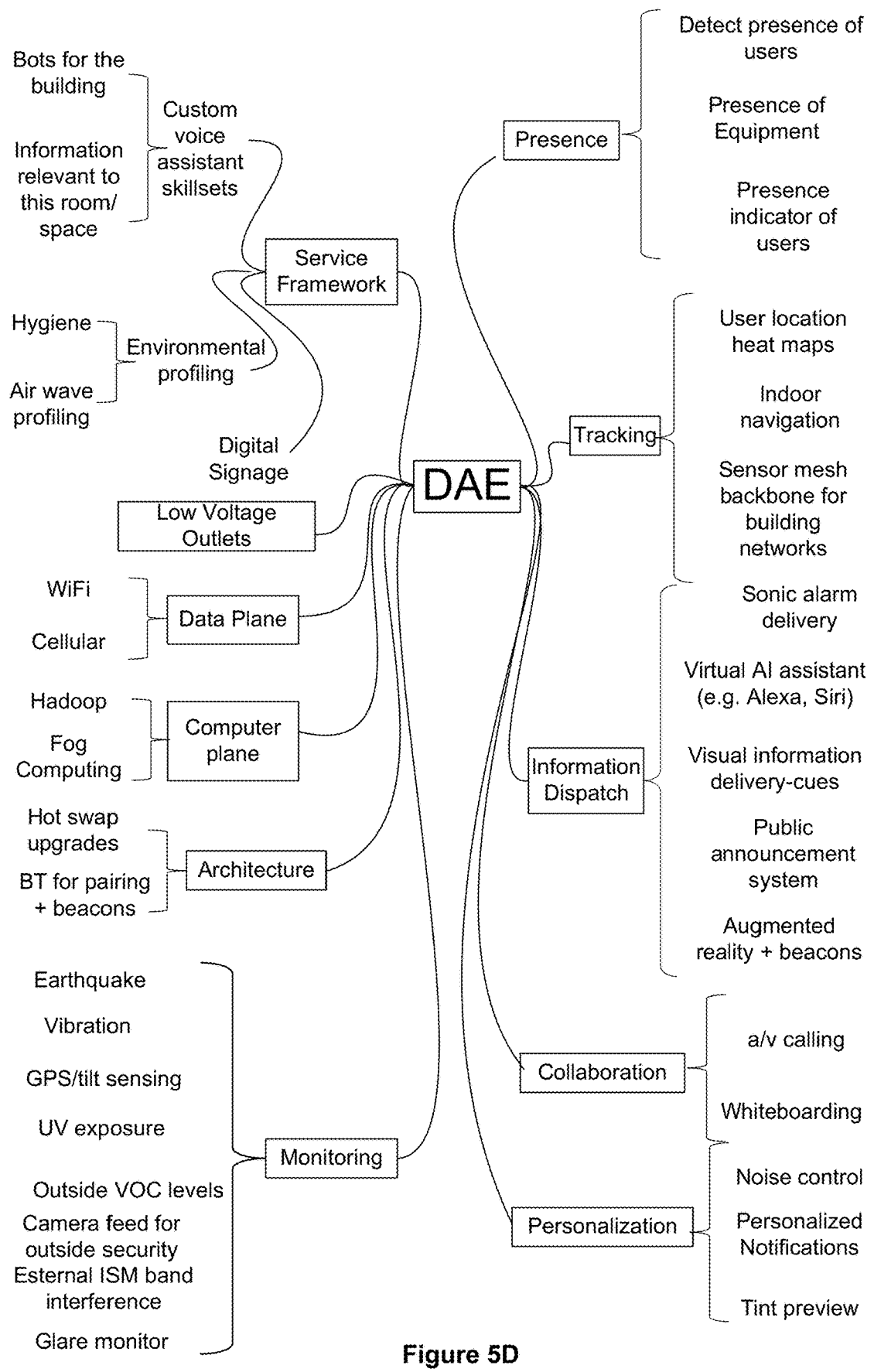

FIG. 4 illustrates a comparison between a block diagram of WC2 (Detail A) and, according to some implementations a block diagram of WC3 (Detail B). The WC2 block diagram is an example of a conventional window controller such as those available from View, Inc. of Milpitas, Calif. Some of the depicted components include at least one voltage regulator 441, a controller network interface, CAN 442 a processing unit (microcontroller) 443, and various ports and connectors. Some of these components and example architectures are described in U.S. patent application Ser. No. 13/449,251, filed Apr. 17, 2012, and U.S. patent application Ser. No. 15/334,835 filed Oct. 26, 2016, which are incorporated herein by reference in their entireties.

Detail B depicts an example of an enhanced functionality window controller, WC3. In the depicted embodiments, the conventional window controller (WC 2) and the enhanced functionality window controller (WC3) have a similar architecture and some common components. The enhanced functionality window controller WC3 has a more capable microcontroller 453, a gigabit Ethernet interface 454, a wireless (e.g. Wi-Fi, Bluetooth or cellular) interface 455 and an optional MoCA interface 456. The gigabit Ethernet interface may be a conventional unshielded twisted pair (e.g., UTP/CATS-6) interface and/or a MoCA (GbE over coaxial cable) interface. In certain embodiments, connection to the enhanced functionality window controller is via a conventional RJ45 modular connector (jack). In certain embodiments that support MoCA, the controller includes a separate adaptor feeding the jack. As an example, such adaptor may be an Actiontec (Actiontec Electronics, Inc. of Sunnyvale, Calif.) adaptor such as the ECB6250 MoCA 2.5 network adapter, e.g., an adaptor that provides data communication speeds up to about 2.5 Gbps.

Applications and Uses

FIGS. 5A through 5D illustrate a number of examples of applications and uses of the digital architectural element and related elements contemplated by the present disclosure. It will be appreciated that the network and high bandwidth backbone described herein may be used for various functions, some of which are not related to controlling windows. One such function is the providing of internet, local network, and/or computational services for tenants or other building occupants, construction personnel on site during the construction of the building, and the like. During construction, the network and computation resources provided by the backbone and digital elements may be used for more than just commissioning windows. For example, they may be used to provide architectural information, construction instructions, and the like. In this way, construction personnel have ready access to construction information they need via a high bandwidth, on-site network.

In some cases, the network, communications, and/or computational services provided by the network and computational infrastructure as described herein are utilized in multi-tenant buildings or shared workspaces such as those provided by WeWork.com. For example, shared workspace buildings need only provide temporary connectivity and processing power as needed. A building network such as described herein affords central control and flexible assignment of computational resources to particular building locations. This flexibility allows assignment of different resources to different tenants.

Readings from sensors in a digital element (e.g., a digital wall interface or a digital architectural element) may provide information about the environment in the vicinity of the digital architectural element. Examples of such sensors include sensors for any one or more of temperature, humidity, volatile organic compounds (VOCs), carbon dioxide, dust, light level, glare, and color temperature. In certain embodiments, readings from one or more such sensors are input to an algorithm that determines actions that other building systems should take to offset the deviation in measured readings to get these readings to target values for occupant's comfort or building efficiency, depending on the contextual index of occupant's presence and other signals.

In certain embodiments, a digital element may be provided on the roof of a building, optionally collocated with a sky sensor or a ring sensor such as described in US Patent Application Publication No. 2017/0122802, published May 4, 2017. Such element may be outfitted with some or all features presented elsewhere herein for a digital architectural element. Examples include sensors, antenna, radio, radar, air quality detectors, etc. In some implementations, the digital element on the roof or other building exterior location provides information about air quality; in this way, digital elements may provide information about the air quality both inside and outside. This allows decisions about window tint states and other environmental conditions to be made using a full set of information (e.g., when conditions outside the building are unhealthy (or at least worse than they are inside), a decision may be made prohibit venting air from outside).

In some cases, the light levels, glare, color temperature, and/or other characteristics of ambient or artificial light in a region of building are used to make decisions about whether to change the tint state of an electrochromic device. In certain embodiments, these decisions employ one or more algorithms or analyses as described in U.S. patent application Ser. No. 15/347,677, filed Nov. 9, 2016, and U.S. patent application Ser. No. 15/742,015, a national stage application filed Jan. 4, 2018, which are incorporated herein by reference in their entireties. In one example, tinting decisions are made by using a solar calculator and/or a reflection model in conjunction with an algorithm for interpreting light information from sensors of the digital architectural element. The algorithm may in some cases use information about the presence of occupants, how many there are, and/or where they are located (data that can be obtained with a digital architectural element) to assist in making decisions about whether to tint a window and what tint state should be chosen. In some cases, for purposes of determining appropriate tint states, a digital architectural element is used in lieu of or in conjunction with a sky sensor such as described in U.S. patent application Ser. No. 15/287,646, filed Oct. 6, 2016, and previously incorporated herein by reference in its entirety.

As an example of tint and glare control, sensors in a digital element may provide feedback about local light, temperature, color, glare, etc. in a room or other portion of a building. The logic associated with a digital element may then determine that the light intensity, direction, color, etc. should be changed in the room or portion of a building, and may also determine how to effect such change. A change may be necessary for user comfort (e.g., reduce glare at the user's workspace, increase contrast, or correct a color profile for sensitive users) or privacy or security. Assuming that the logic determines that a change is necessary, it may then send instructions to change one or more lighting or solar components such as optically switchable window tint states, display device output, switched particle device film states (e.g., transparent, translucent, opaque), light projection onto a surface, artificial light output (color, intensity, direction, etc.), and the like. All such decisions may be made with or without assistance from building-wide tint state processing logic such as described in U.S. patent application Ser. No. 15/347,677, filed Nov. 9, 2016, and U.S. patent application Ser. No. 15/742,015, a national stage application filed Jan. 4, 2018, previously incorporated herein by reference in their entireties.

An array of digital architectural elements in a building may form a mesh edge access network enabling interactions between building occupants and the building or machines in the building. When equipped with an appropriate network interface, a digital architectural element and/or a digital wall interface and/or an enhanced functionality window controller can be used as a digital compute mesh network node providing connectivity, communication, application execution, etc. within building structural elements (e.g., mullions) for ambient compute processing. It may be powered, monitoring and controlled in a similar or identical manner as an edge sensor node in a mesh network setup in the buildings. It may be used as gateway for other sensor nodes.

A non-exhaustive list of functions or uses for the high bandwidth window network and associated digital elements contemplated by the present disclosure includes: (a) Speaker phone—a digital wall interface or a digital architectural element may be configured to provide all the functions of a speaker phone; (b) Personalization of space—an occupant's preferences and/or roles may be stored and then implemented in particular locations where the occupant is present. In some cases, the preferences and/or roles are implemented only temporarily, when a user is at a particular location. In some cases, the preferences and/or roles remain in effect so long as the occupant is assigned a work space or living space; (c) Security—track assets, identify unauthorized presence of individuals in defined locations, lock doors, tint windows, untint windows, sound alarms, etc.; (d) Control HVAC, air quality; (e) communication with occupants, including public address notifications for occupants during emergencies; messages may be communicated via speakers in a digital element; (f) collaboration among occupants using live video; (g) Noise cancellation—E.g., microphone detects white noise, and the sound bar cancels the white noise; (h) Connecting to, streaming, or otherwise delivering video or other media content such as television; (i) Enhancements to personal digital assistants such as Amazon's Alexa, Microsoft's Cortana, Google's Google Home, Apple's Siri, and/or other personal digital assistants; (j) Facial or other biometric recognition enabled by, e.g., a camera and associated image analysis logic—determine the identification of the people in a room, not just count the number of people; (k) Detect color—color balancing with room lighting and window tint state; (l) Local environmental conditions detected and/or adjusted. Conditions may be determined using one or more of the following types of sensed conditions, for example: temperature & humidity, volatile organic compounds (VOC), $CO_2$, dust, smoke and lighting (light levels, glare, color temperature.

Computational System and Memory Devices

The presently disclosed logic and computational processing resources may be provided within a digital element such as a digital wall interface or a digital architectural element as described herein, and/or it may be provided via a network connection to a remote location such as another building using the same or similar resources and services, servers on the interne, cloud-based resources, etc.

Certain embodiments disclosed herein relate to systems for generating and/or using functionality for a building such as the uses described in the preceding "Applications and Uses" section. A programmed or configured system for performing the functions and uses may be configured to (i) receive input such as sensor data characterizing conditions within a building, occupancy details, and/or exterior environmental conditions, and (ii) execute instructions that determine the effect of such conditions or details on a building environment, and optionally take actions to maintain or change the building environment.

Many types of computing systems having any of various computer architectures may be employed as the disclosed systems for implementing the functions and uses described herein. For example, the systems may include software components executing on one or more general purpose processors or specially designed processors such as programmable logic devices (e.g., Field Programmable Gate Arrays (FPGAs)). Further, the systems may be implemented on a single device or distributed across multiple devices. The functions of the computational elements may be merged into one another or further split into multiple sub-modules. In certain embodiments, the computing system contains a microcontroller. In certain embodiments, the computing system contains a general purpose microprocessor. Frequently, the computing system is configured to run an operating system and one or more applications.

In some embodiments, code for performing a function or use described herein can be embodied in the form of software elements which can be stored in a nonvolatile storage medium (such as optical disk, flash storage device, mobile hard disk, etc.). At one level a software element is implemented as a set of commands prepared by the programmer/developer. However, the module software that can be executed by the computer hardware is executable code committed to memory using "machine codes" selected from the specific machine language instruction set, or "native instructions," designed into the hardware processor. The machine language instruction set, or native instruction set, is known to, and essentially built into, the hardware processor(s). This is the "language" by which the system and application software communicates with the hardware processors. Each native instruction is a discrete code that is recognized by the processing architecture and that can specify particular registers for arithmetic, addressing, or control functions; particular memory locations or offsets; and particular addressing modes used to interpret operands. More complex operations are built up by combining these simple native instructions, which are executed sequentially, or as otherwise directed by control flow instructions.

The inter-relationship between the executable software instructions and the hardware processor is structural. In other words, the instructions per se are a series of symbols or numeric values. They do not intrinsically convey any information. It is the processor, which by design was pre-configured to interpret the symbols/numeric values, which imparts meaning to the instructions.

The algorithms used herein may be configured to execute on a single machine at a single location, on multiple machines at a single location, or on multiple machines at multiple locations. When multiple machines are employed, the individual machines may be tailored for their particular tasks. For example, operations requiring large blocks of code and/or significant processing capacity may be implemented on large and/or stationary machines.

In addition, certain embodiments relate to tangible and/or non-transitory computer readable media or computer program products that include program instructions and/or data (including data structures) for performing various computer-implemented operations. Examples of computer-readable media include, but are not limited to, semiconductor memory devices, phase-change devices, magnetic media such as disk drives, magnetic tape, optical media such as CDs, magneto-optical media, and hardware devices that are specially configured to store and perform program instructions, such as read-only memory devices (ROM) and random access memory (RAM). The computer readable media may be directly controlled by an end user or the media may be indirectly controlled by the end user. Examples of directly controlled media include the media located at a user facility and/or media that are not shared with other entities. Examples of indirectly controlled media include media that is indirectly accessible to the user via an external network and/or via a service providing shared resources such as the "cloud." Examples of program instructions include both machine code, such as produced by a compiler, and files containing higher level code that may be executed by the computer using an interpreter.

The data or information employed in the disclosed methods and apparatus is provided in a digital format. Such data or information may include sensor data, building architectural information, floor plans, operating or environment conditions, schedules, and the like. As used herein, data or other information provided in digital format is available for storage on a machine and transmission between machines. Conventionally, data may be stored as bits and/or bytes in various data structures, lists, databases, etc. The data may be embodied electronically, optically, etc.

In certain embodiments, algorithms for implementing functions and uses described herein may be viewed as a form of application software that interfaces with a user and with system software. System software typically interfaces with computer hardware and associated memory. In certain embodiments, the system software includes operating system software and/or firmware, as well as any middleware and drivers installed in the system. The system software provides basic non-task-specific functions of the computer. In contrast, the modules and other application software are used to accomplish specific tasks. Each native instruction for a module is stored in a memory device and is represented by a numeric value.

Integrated Environmental Monitoring and Control

As described hereinabove, the presently disclosed techniques contemplate a network of digital architectural elements (DAE's) capable of collecting a rich set of data related to environmental, occupancy and security conditions of a building's interior and/or exterior. The digital architectural elements may include optically switchable windows and/or mullions or other architectural features associated with optically switchable windows. Advantageously, the digital architectural elements may be widely distributed throughout all or much of, at least, a building's perimeter. As a result, the collected data may provide a highly granular, detailed representation of environmental, occupancy and security conditions associated with much or all of a building's interior and/or exterior. For example, many or all of the building's windows may include, or be associated with, a digital architectural element that includes a suite of sensors such as light sensors and/or cameras (visible and/or IR), acoustic sensors such as microphone arrays, temperature and humidity sensors and air quality sensors that detect VOCs, CO2, carbon monoxide (CO) and/or dust.

In some implementations, automated or semi-automated techniques, including machine learning, are contemplated in which the building's environmental control, communications and/or security systems intelligently react to changes in the collected data. As an example, occupancy levels of a room in a building may be determined by light sensors cameras and/or acoustic sensors, and a correlation may be made between a particular change in level of occupancy and a desired change in HVAC function. For example, an increased occupancy level may be correlated with a need to increase airflow and/or lower a thermostat setting. As a further example, data from air quality sensors that detect levels of dust may be correlated with a need to perform building maintenance or introduce or exclude outside air from interior spaces. In one use case scenario for example, dust levels in a room were observed to rise when the occupants were moving about the room, and to decline with the occupants were seated. In such a scenario, a determination may be made that floor coverings need to be serviced (mopped, vacuumed). In another use case scenario, measured interior air-quality may be observed to (i) improve or (ii) degrade when a window is opened. In the case of (i), it may be determined that air circulation ducts or filters of an HVAC system should be serviced. In the case of (ii) it may be determined that exterior air-quality is poor, and that windows of the building should preferentially be maintained in a closed position. In yet a further use case scenario, a correlation may be drawn between the number of occupants in a conference room, and whether doors and/or windows are open or closed, with Co2 levels and/or rate of change of Co2 levels.

Figure 6:
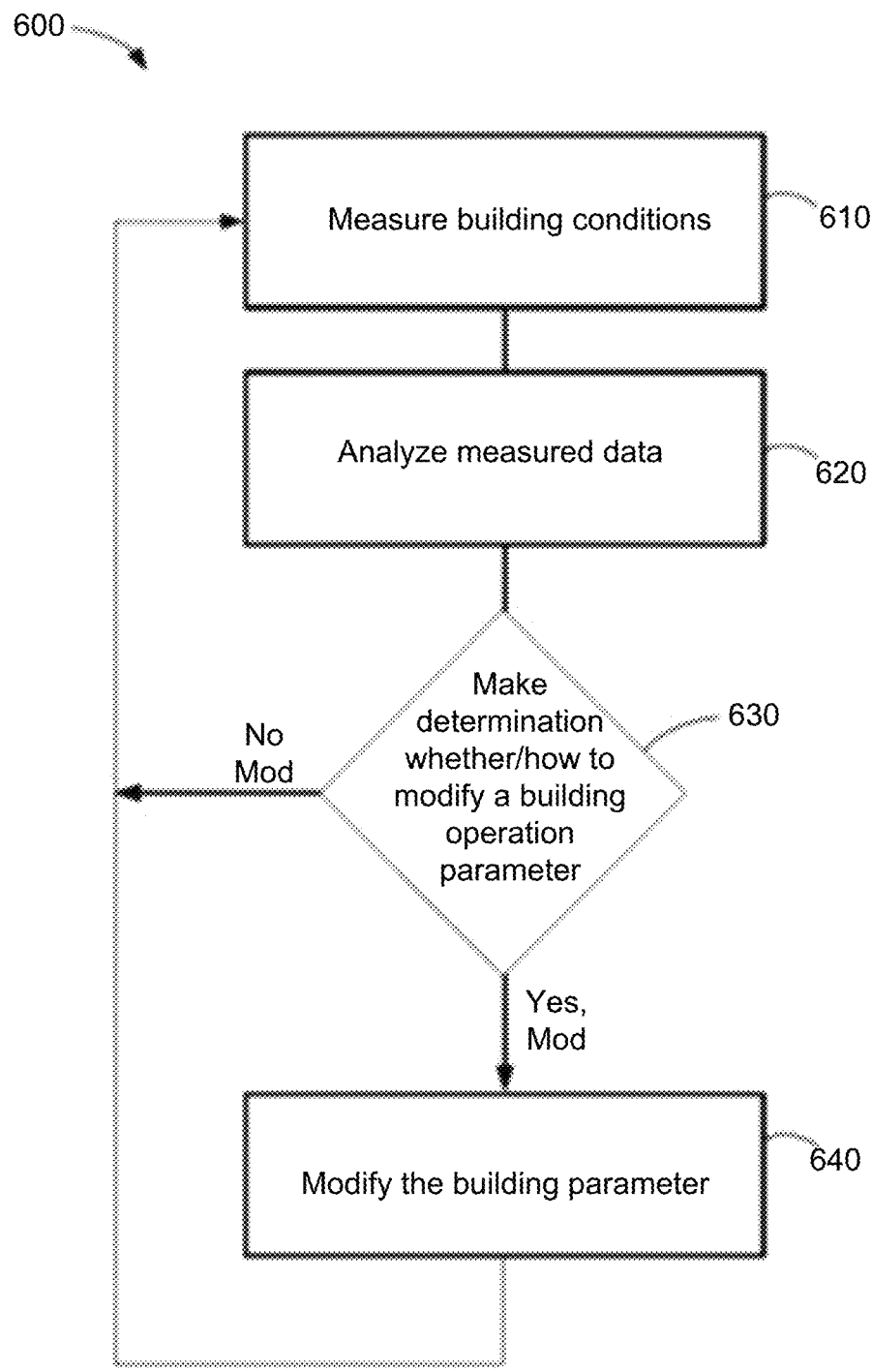
FIG. 6 illustrates a process flow for measuring a plurality of building conditions, and controlling building operation parameters of a plurality of building systems responsive to the measured building conditions, according to some embodiments

More generally, the present techniques contemplate measuring a plurality of "building conditions", and controlling "building operation parameters" of a plurality of "building systems" responsive to the measured building conditions, as illustrated in FIG. 6. As used herein, a "building condition" may refer to a physical, measurable condition in a building or a portion of a building. Examples include temperature, air flow rate, light flux and color, occupancy, air quality and composition (particulate count, gas concentration of carbon dioxide, carbon monoxide, water (i.e., humidity)). As used herein, a "building system" may refer to a system that can control or adjust a building operation parameter. Examples include an HVAC system, a lighting system, a security system, a window optical condition control system. A building operation parameter may refer to a parameter that can be controlled by one or more building systems to adjust or control a building condition. Examples include heat flux from or to heaters or air conditioners, heat flux from windows or lighting in a room, air flow through a room, and light flux from artificial lights or natural light through an optically switchable window.

Referring still to FIG. 6, a method 600 may include collecting inputs, block 610, from a plurality of sensors. Some or all of the sensors may be disposed on or associated with a respective window and/or with a respective digital architectural element associated with a window and/or with a digital wall interface. The sensors may include visible and/or IR light sensors or cameras, acoustic sensors, temperature and humidity sensors and air quality sensors, for example. It will be appreciated that the collected inputs may represent a variety of environmental condition measurements that are temporally and spatially diverse. In some implementations, at least some of the inputs may include a combination of sensors. For example separate sensors, specialized for respective measurements of $CO_2$, CO, dust and/or smoke may be contemplated, and a combination of inputs from the separate sensors may be analyzed (block 620) for determination of air-quality control. As a further example, inputs relevant to a determination of occupancy levels in a room collected from separate sensors that measure, respectively, optical and acoustic signals may be analyzed (block 620). As a yet further example, inputs may be received, nearly simultaneously, from spatially distributed sensors. For example, the sensors may be spatially distributed with respect to a given room or distributed between multiple rooms and/or floors of the building.

In some implementations, analysis of the measured data at block 620 may take into account certain "context information" not necessarily obtained from the sensors. Context information, as used herein may include time of day and time of year, and local weather and/or climatic information, as well as information regarding the building layout, and usage parameters of various portions of the building. The context information may be initially input by a user (e.g. a building manager) and updated from time to time, manually and/or automatically. Examples of usage parameters may include a building's operating schedule, and an identification of expected and/or permitted/authorized usages of individual rooms or larger portions (e.g., floors) of the building. For example, certain portions of the billing may be identified as lobby space, restaurant/cafeteria space, conference rooms, open plan areas, private office spaces, etc. The context information may be utilized in making a determination as to whether or how to modify building operation parameter, block 630, and also for calibration and, optionally, adjustment of the sensors. For example, based on the context information, certain sensors may, optionally, be disabled in certain portions of the building in order to meet an occupant's privacy expectations. As a further example, sensors for rooms in which a considerable number of persons may be expected to congregate (e.g., an auditorium) may advantageously be calibrated or adjusted differently than sensors for rooms expected to have fewer occupants (e.g., private offices).

An objective of the analysis at block 620 may be to determine that a particular building condition exists or may be predicted to exist. As a simple example, the analysis may include comparing a sensor reading such as a light flux or temperature measurement with a threshold. As a further, more sophisticated example, when an occupancy load in a room undergoes a change (because, for example, a meeting in a conference room convenes or adjourns) the analysis at block 620 may, first, directly recognize the change as a result of inputs from acoustic and/or optical sensors associated with the room; second, the analysis may predict an environmental parameter that may be expected to change as a result of a change in occupancy load. For example, an increase in occupancy load can be expected to lead to increased ambient temperatures and increased levels of $CO_2$. Advantageously, the analysis at block 620 may be performed automatically on a periodic or continuous basis, using models or other algorithms that may be improved over time using, for example, machine learning techniques. In some implementations, the analysis may not explicitly identify a particular building condition (or combination of conditions) in order to determine that a building operation parameter should be adjusted.

Referring again to block 630 a determination as to whether or how to modify building operation parameter may be made based on the results of analysis block 620. Depending on the determination, the building condition may or may not be changed. When a determination is made to not modify building operation parameter the method may return to block 610. When a determination is made to modify a billing for operation parameter, one or more building conditions may be adjusted, at block 640, for purposes of improving occupant comfort or safety and/or to reduce operating costs and energy consumption, for example. For example, lights and/or HVAC service, may be set to a low power condition in rooms that are determined to be unoccupied. As a further example, a determination may be made that a fault or issue has arisen that requires attention of the building's administration, maintenance or security personnel.

The determination may be made on a reactive and/or proactive basis. For example, the determination may react to changes in measured parameters, e.g., a determination may be made to increase HVAC flowrates when a rise in ambient $CO_2$ is measured. Alternatively or in addition, the determination may be made on a proactive basis, i.e., the building operation parameter may be adjusted in anticipation of an environmental change before the change is actually measured. For example an observed change in occupancy loads may result in a decision to increase HVAC flowrates whether or not a corresponding rise in ambient $CO_2$ or temperature is measured.

In some implementations, the determination may relate to building operation parameters associated with HVAC (e.g., airflow rates and temperature settings), which may be controlled in one or more locations based on measured temperature, $CO_2$ levels, humidity, and/or local occupancy. In some implementations the determination may relate to building operation parameters associated with building security. For example, in response to an anomalous sensor reading, a security system alarm may be caused to trigger, selected doors and windows may be locked or unlocked, and/or a tint state of all or some windows may be changed. Examples of security-related building conditions include detection of a broken window, detection of an unauthorized person in a controlled area, and detection of unauthorized movement of equipment, tools, electronic devices or other assets from one location to another.

Other types of security-related building condition information can include information related to detection of the occurrence of the detection of sound outside and/or within the building. In one embodiment, the detected sound is analyzed for type of sound. In some embodiments, analysis is initiated via hardware, firmware, or software onboard to one or more digital structural element or elsewhere in a building, or even offsite. In some embodiments, sound outside or inside of a building causes conductive layers deposited on window glass of an electrochromic window to vibrate, which vibrations cause changes in capacitance between the conductive layers, and which changes of capacitance are converted into a signal indicative of the sound. Thus, some windows of the present invention can inherently provide the functionality of a sound and/or vibration sensor, however, in other embodiments, sound and/or vibration sensor functionality can be provided by sensors that have been added to windows with or without conductive layers, and/or by one or more sensors implemented in digital structural elements.

In one embodiment, an originating location of sound can be determined by analyzing differences in sound amplitude and/or sound time delays that different ones of sound and or vibration sensors experience. Types of sound detected and then analyzed include, but are not limited to: broken window sounds, voices (for example, voices of persons authorized or unauthorized to be in certain areas), sounds caused by movement (of persons, machines, air currents), and sounds caused by the discharge of firearms. In one embodiment, depending on the type of sound detected, one or more appropriate security or other action is initiated by one or more system within the building. For example, upon a determination that a firearm has been discharged at a location outside or inside of a building, a building management system makes an automated 911 call to summon emergency responders to the location.

In the case of sound generated by a firearm inside of a building, knowing the precise location (for example, room, floor, and building information) of the sound as well as the shooter who generated the sound is essential to a proper emergency response. However, in buildings with large open space floor plans and/or hallways, textual positional information that requires reference to a particular building's floor plan may delay the response. Rather than just textual positional information, in one embodiment visual positional information is provided. Visual positional information of sound can be provided by installed camera system, if so equipped, but in one embodiment, is provided by causing the tint state of one or more window determined to be the closest to sound generated by the firearm or the shooter to be changed to a distinctive tint state. For example, in one embodiment, upon sensing of a sound of interest, a tint of a tintable window closest to the sound of interest is caused to change to a tint that is darker than the tint of windows that are farther away from the sound, or vice versa. In this manner, if responders were unable to quickly be able to locate a particular room on a particular floor of a particular building, they might to be able to do so by visually looking for a window that has been distinctively tinted to be darker or lighter than other windows.

In one embodiment, a current location of a person associated with a particular sound may be different from their initial location, in which case, their change in location can be updated via detection of other sounds or changes caused by the person to the environment. For example, in the case of an active shooter situation, gas sensors in digital architectural elements or other predetermined locations can be used to monitor changes in air quality caused by the presence of exploded gunpowder, and to thereby provide responders with updates as to location of the shooter. Sound and other sensors could also be used to obtain the location of persons trying to quietly hide from and active shooter (for example, via infrared detection of their location). In one embodiment, to confuse an active shooter, sounds can be generated by speakers in digital architectural elements or other speakers in the shooters location to distract the shooter, or to mask noises made by hostages trying to hide from him. In one embodiment, speakers and/or microphones in digital architectural elements or other devices could be selectively made active to communicate with persons trying to hide from an active shooter. Apart from causing the tint of one or more windows to be made distinctive to help identify the location of sound, in some embodiments, the distinctive tint of the windows may need to be changed to some other tint, for example to provide more light to facilitate one or more persons entry or egress from a particular location or to provide less light to hinder visibility in a particular location.

Referring still to FIG. 6, at block 640, one or more building parameters may be modified responsive to the determination made at block 630. The building parameter modification may be implemented under the control of a building management system in some embodiments, and may be implemented by one or more of the building's systems such as HVAC, lighting, security, and window controller network, for example. It will be appreciated that the building parameter modification may be selectively made on a global (building-wide) basis or localized areas (e.g. individual rooms, suites of rooms, floors, etc.), As mentioned, a building system that determines how to modify building operation parameters may employ machine learning. This means that a machine learning model is trained using training data. In certain embodiments, the process begins by training an initial model through supervised or semi-supervised learning. The model may be refined through on-going training/learning afforded by use in the field (e.g., while operating in a functioning building). Examples of training data (building conditions interplay with one another and/or with building operations parameters) include the following combinations of sensed or context data (X or inputs) and building operation parameters or tags (Y or output): (a) [X=occupancy (as measured by IR or camera/video), context, light flux (internal+solar); Y=$\Delta$T/time (without cooling)]; (b) [X=occupancy (as measured by IR or camera/video), context; Y=$\Delta O_2$/time (with nominal ventilation)]; and (c) [X=occupancy (as measured by IR or camera/video), context, temperature, external relative humidity (RH); Y=$\Delta$RH/time (with nominal ventilation)]. Part of the purpose of machine learning is to identify unknown or hidden patterns or relationships, so the learning typically uses a large number of inputs (X) for each possible output (Y).

Figure 7:
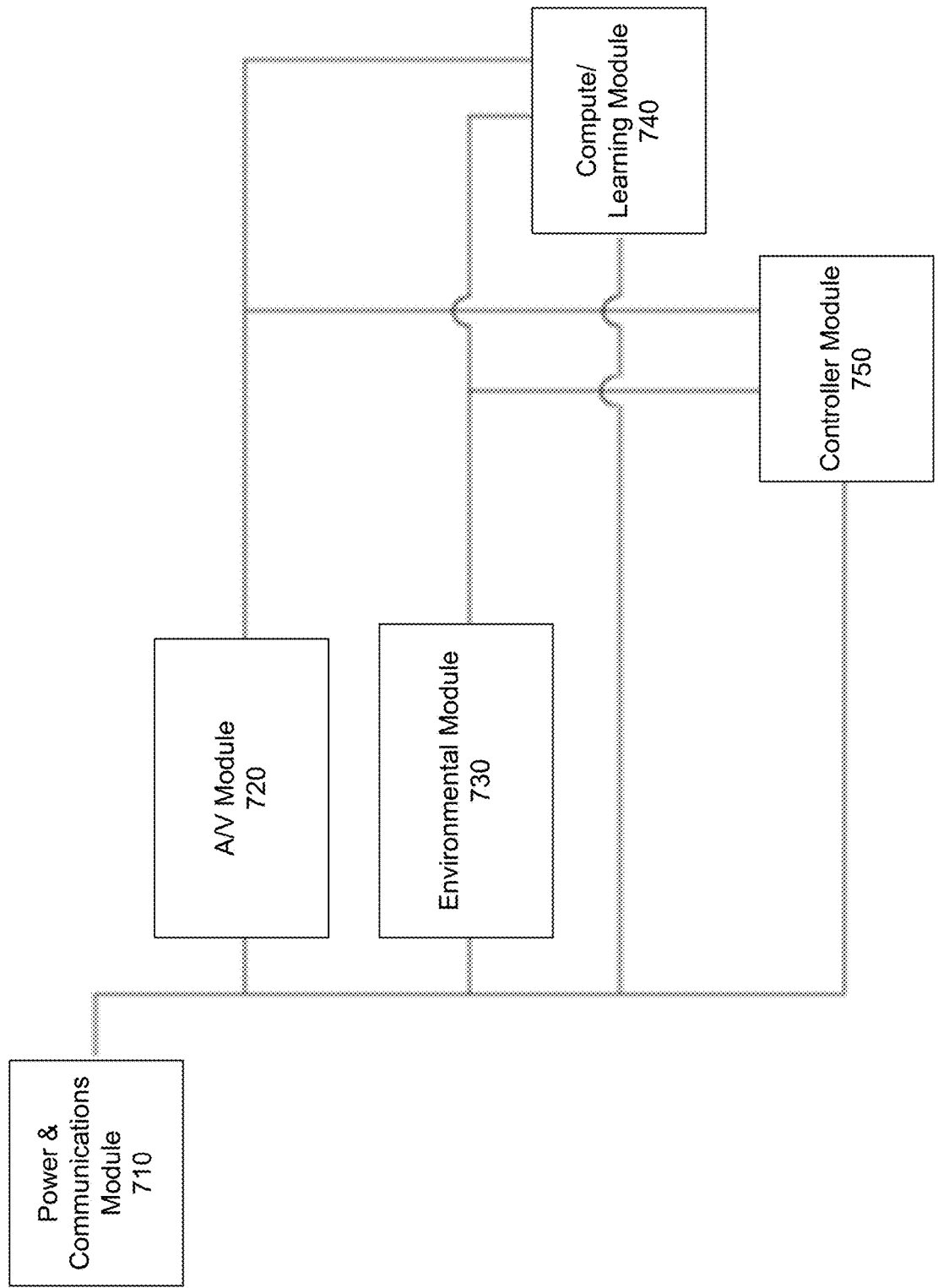
FIG. 7 illustrates an example of a suite of functional modules, configured to execute the process flow illustrated in FIG. 6 according to an implementation.

In some embodiments, execution of the process flow illustrated in FIG. 6 may be facilitated by provisioning digital architectural elements with a suite of functional modules for the collection and analysis of environmental data, communications and control. FIG. 7 illustrates an example of a suite of such functional modules, according to an implementation. In the illustrated embodiment, a digital architectural element 700 includes a power and communications module 710, an audiovisual (A/V) module 720, an environmental module 730, a compute/learning module 740 and a controller module 750.

The power and communications module 710 may include one or more wired or wireless interfaces for transmission and reception of communication signals and/or power. Examples of wireless power transmission techniques suitable for use in connection with the presently disclosed techniques are described in U.S. provisional patent application No. 62/642,478, entitled WIRELESSLY POWERED AND POWERING ELECTROCHROMIC WINDOWS, filed Mar. 13, 2018, international patent application PCT/US17/52798, entitled WIRELESSLY POWERED AND POWERING ELECTROCHROMIC WINDOWS, filed Sep. 21, 2017, and U.S. patent application Ser. No. 14/962,975, entitled WIRELESS POWERED ELECTROCHROMIC WINDOWS, filed Dec. 8, 2015, each assigned to the asset any of the present application, the contents of which are hereby incorporated by reference in their entirety into the present application. The power and communications module 710 may be communicatively coupled with and distribute power to each of the audiovisual (A/V) module 720, the environmental module 730, the compute/learning module 740 and the controller module 750. The power and communications module 710 may also be communicatively coupled with one or more other digital architectural elements (not illustrated) and/or interface with a power and/or control distribution node of the building.

The A/V module 730 may include one or more of the A/V components described hereinabove, including a camera or other visual and/or IR light sensor, a visual display, a touch interface, a microphone or microphone array, and a speaker or speaker array. In some embodiments, the "touch" interface may additionally include gesture recognition capabilities operable to detect recognize and respond to non-touching motions of a person's appendage or a handheld object.

The environmental module 730 may include one or more of the environmental sensing components described hereinabove, including temperature and humidity sensors, acoustic light sensors, IR sensors, particle sensors (e.g., for detection of dust, smoke, pollen, etc.), VOC, CO, and/or $CO_2$ sensors. The environmental module 730 may functionally incorporate a suite of audio and/or electromagnetic sensors that may partially or completely overlap the sensors (e.g, microphones, visual and/or IR light sensors) described above in connection with AN module 730. In some embodiments, a "sensor" as the term is used herein may include some processing capability, in order, for example, to make determinations such as occupancy (or number of occupants) in a region. Cameras, particularly those detecting IR radiation can be used to directly identify the number of people in a region. Alternatively in addition, a sensor may provide raw (unprocessed) signals to the compute/learning module 740 and/or to the controller module 750.

The compute/learning module 740 may include processing components (including general or special purpose processors and memories) as described hereinabove for the digital architectural element, the digital wall interface, and/or the enhanced functionality window controller. Alternatively or in addition, it may include a specially designed ASIC, digital signal processor, or other type of hardware, including processors designed or optimized to implement models such as machine learning models (e.g., neural networks). Examples include Google's "tensor processing unit" or TPU. Such processors may be designed to efficiently compute activation functions, matrix operations, and/or other mathematical operations required for neural network or other machine learning computation. For some applications, other special purpose processors may be employed such as graphics processing units (GPUs). In some cases, the processors may be provided in a system on a chip architecture.

The controller module 750 may be or include a window control module incorporating one more features described in U.S. patent application Ser. No. 15/882,719, filed Jan. 29, 108, entitled CONTROLLER FOR OPTICALLY-SWITCHABLE WINDOWS, U.S. patent application Ser. No. 13/449, 251, filed Apr. 17, 2012, entitled "CONTROLLER FOR OPTICALLY-SWITCHABLE WINDOWS", International Patent Application No. PCT/US17/47664, filed Aug. 18, 2017, entitled "ELECTROMAGNETIC-SHIELDING ELECTROCHROMIC WINDOWS", U.S. patent application Ser. No. 15/334,835, filed Oct. 26, 2016, entitled "CONTROLLERS FOR OPTICALLY-SWITCHABLE DEVICES" and International Patent Application No. PCT/US17/61054, filed Nov. 10, 2017, entitled "POWER DISTRIBUTION NETWORKS FOR ELECTROCHROMIC DEVICES", each assigned to the assignee of the present application and hereby incorporated by reference into the present application in their entireties.

For clarity of illustration, FIG. 7 presents the digital architectural elements 700 as incorporating separate and distinct modules 710, 720, 730, 740 and 750. It should be appreciated however that two or more modules may be structurally combined with each other and/or with features of the digital wall interface described hereinabove. Moreover it is contemplated that, in a building installation including a number of digital architectural elements, not every digital architectural element will necessarily include all the described modules 710, 720, 730, 740 and 750. For example in some embodiments one or more of the described modules 710, 720, 730, 740 and 750 may be shared by a plurality of digital architectural elements.

Figure 8:
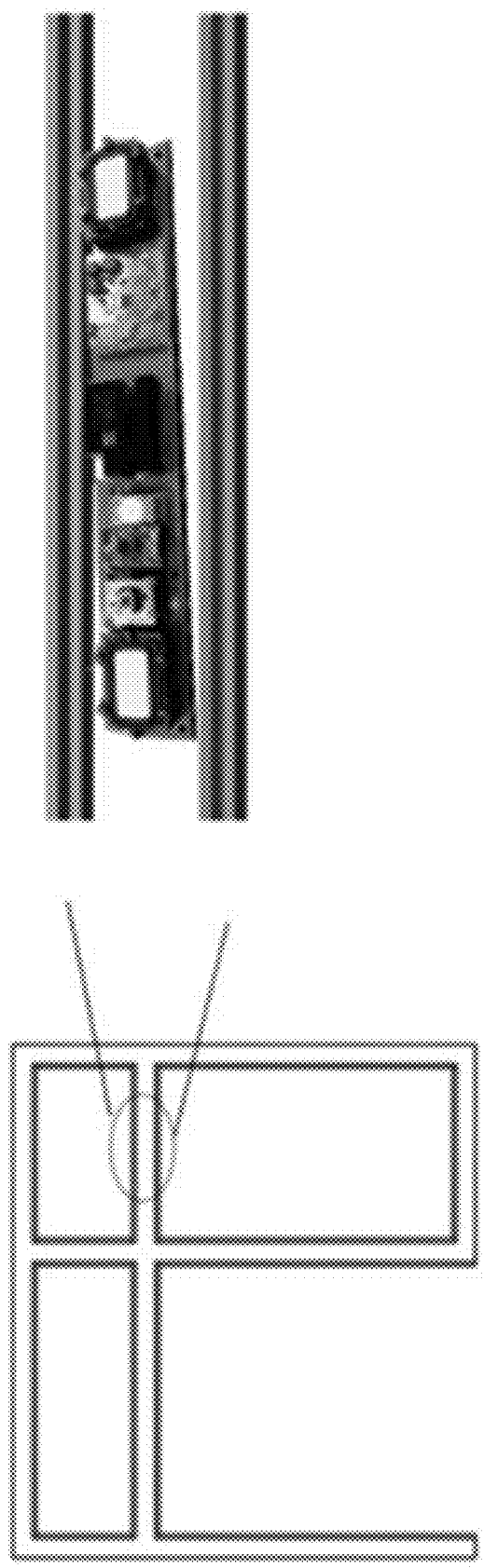
FIG. 8 illustrates an example physical packaging of a digital architectural element, according to some implementations.

FIG. 8 illustrates an example physical packaging of a digital architectural element, according to some implementations. As may be observed in FIG. 8, it is contemplated that the functionality of the described modules 710, 720, 730, 740 and 750 may be configured in a physical package having a size and form factor that can be readily accommodated by an architectural feature such as a typical window mullion.

Trunk Line for a High-Speed Network Infrastructure

An ever increasing use and implementation of Internet of Things (IOT) devices requires communications networks that are capable of supporting their data throughput. In the contest of previously constructed buildings, existing installed network infrastructures are increasingly being found to be incapable of supporting this data throughput. Implementation or retrofitting of a building network infrastructure according to the present invention enables higher speed communication between many more devices than has previously been possible.

Figure 9A:
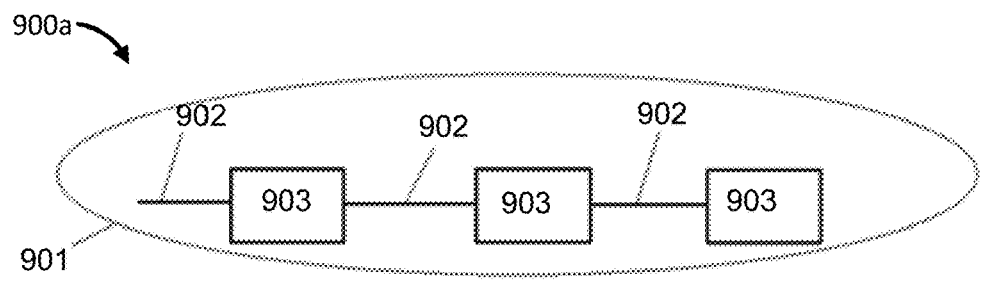
FIGS. 9A-9C illustrate representations of a trunk line for a high-speed network infrastructure, according to some implementations.
Figure 9B:
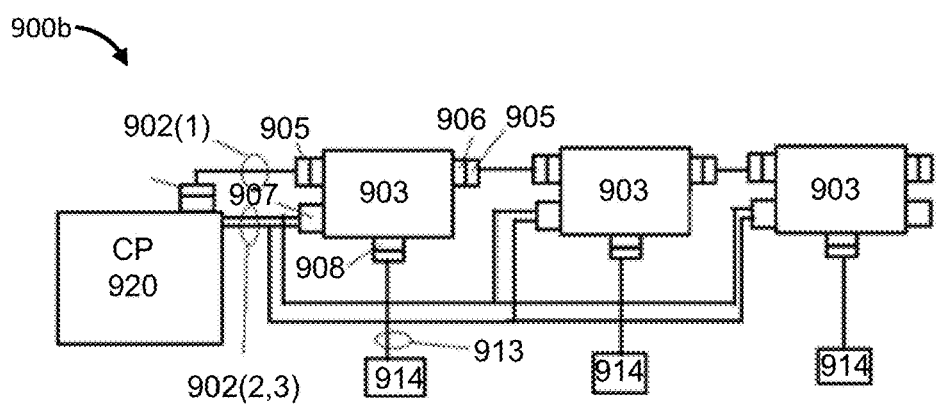
Figure 9C:
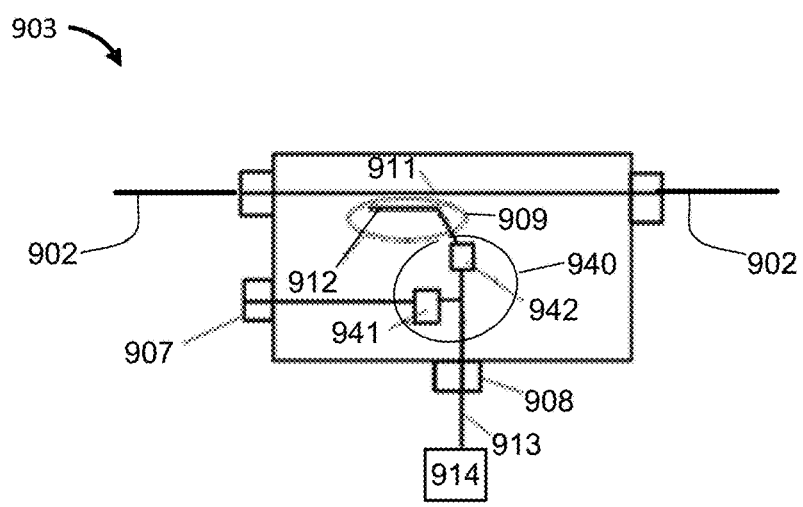

FIGS. 9A-9C illustrate representations of a trunk line for a high-speed network infrastructure, according to some implementations. Referring first to FIG. 9A, in one embodiment, a high-speed network infrastructure 900a is implemented with at least one trunk line 901 that includes at least one trunk line segment 902 and at least one or more circuits 903. As described in more detail below, one or more of circuits 903 may be disposed in or otherwise associated with a respective digital architectural element. In some embodiments, network 900a is configured to transfer signals to, and/or from devices at a throughput of 500 Mbps, 1 Gbps, 2.5 Gbps, 10 Gbps, for example, as envisioned by MoCA 2.0, MoCA 2.0 bonded, MoCA 2.5, and MoCA 3.0 respectively.

Referring now to FIG. 9B, in one embodiment, network infrastructure 900b comprises a serial connection of trunk line segments 902 that are daisy chained together, where one end of a first segment 902(1) coupled to a control panel (CP), 920 and a second end of the first segment 902(1) is coupled via a trunk line circuit 903 to a second segment 902(i). In one embodiment, the second segment 902(i) comprises two or more conductors (in the illustrated example, 902(2) and 902(3)). In one embodiment, some or all of the trunk line segments 902 include a twisted pair of conductors configured to transfer power signals. In one embodiment, the DC power signals comprise CLASS 2 power signals. In one embodiment, ends of at least one segment 902 comprise RF connectors 905. In one embodiment, RF connectors 905 comprise F-type connectors.

In one embodiment, each trunk line circuit 903 is configured to pass signals between two trunk line segments 902, and is further configured to couple signals between the segments and a connector 908. In one embodiment, at least one trunk line circuit 903 includes connector 908, at least one connector 906 configured to mate with a connector 905 at an end of a segment 202, and at least one connector 907 configured to mate with power signals carried by conductors 902(2,3). In one embodiment, connector(s) 906 are or include F-type connectors configured to mate with connectors 905 of segments 902; and connector(s) 907 comprises at least one fastener, for example, but not limited to, terminal block type fasteners configured to secure conductive ends of conductors.

In one embodiment, the trunk line circuit 903 includes one or more passive circuits. Referring now to FIG. 9C, in the illustrated embodiment, the trunk line circuit 903 includes a directional coupler circuit 909 coupled to a bias tee circuit 940. In one embodiment, the directional coupler 909 is proximate to a first conductor 911 and includes a second conductor 912. Where the first conductor 911 is configured to conduct signals between segments 902, signals on the first conductor 911 are inductively coupled to the second conductor 912. In one embodiment, the bias T circuit 940 includes an inductor 941 and a capacitor 942, where a first end of the inductor 941 is coupled to the connector 907 and a second end of the inductor 941 is coupled to the capacitor 942 and to the connector 908. In one embodiment, a power signal at the connector 207 is combined by bias T circuit 940 with signals provided by the directional coupler circuit 909, and the combined signals are coupled by the bias T circuit 940 to the connector 908. In one embodiment, the connector 908 is or includes an RF connector. In one embodiment, the connector 908 is or includes an F-type connector. In one embodiment, the connector 908 is coupled to a drop line 913 that may be configured to transfer both power and high speed/high bandwidth data signals to one or more devices 914. In one embodiment, the drop line 913 is or includes a coaxial cable conductor.

In one embodiment, the high-speed network 900 is installed on, or in, a building under construction. In some embodiments, at least a portion of a network 900 is installed on or in structural elements of a building before a building is released for occupancy, for example, structural elements such as unfinished or exposed interior and exterior facing walls, ceilings, and/or floors. In some embodiments, at least a portion of a network 200 is installed during, or after, installation of an electrical infrastructure of a building under construction. In other embodiments, one or more portions of a network 900 are installed before or during installation of windows of a building under construction. Early installation of a network 900 before final finish work is completed enables previously unavailable functionality to be made available during construction of a building. In one embodiment, where windows are installed concurrently with, or after, installation of a network 900, parts, or all, of the processing power of the network and/or windows can be made available to contractors and other on-site personnel. For example, in one embodiment, where windows comprised of a digital display screen technology are installed concurrently with, or after, installation of a network 900, electronic versions of construction blueprints can be made available for display on the display screens to on-site architects and contractors.

Further, during or after construction, it is known that certain materials in buildings may interfere or block transmission of certain frequencies, which blocking can interfere with devices whose operation relies upon such frequencies. For example, it is known that metallic structures that may be present in interior and/or exterior walls of a building (for example, but not limited to metallic girders and metallic window glass coatings) can interfere with the operation of certain wireless devices. Such devices comprise but are not limited to, cell phones, TOT devices, 5G, and mm Wave enabled devices. In one embodiment, the trunk line 901 is configured to comprise, or to be connected to, one or more device such as a transceiver, antenna and/or signal repeater to obviate such blocking. Appropriate placement of the one or more transceiver, antenna, and/or signal repeater in, or on, structures of the building can be used facilitate communications across and around such structures. In one embodiment, during or after construction of a building, one or more transceiver, antenna and/or signal repeater is coupled a trunk line 901 to facilitate communication between devices inside the building. In one embodiment, one or more transceiver, antenna, and/or signal repeater is positioned within a building according to its connection to and/or routing of trunk line 901. For example, in one embodiment, during or after construction, a trunk line 901 is installed on, or in, exterior walls of a building, and transceivers, antennas and/or signal repeaters are provided as part of, or separate from, one or more trunk line circuits 903. In one embodiment, routing of trunk line 901 along an exterior of the building can be used to improve wireless connectivity to devices present outside the building. In embodiments, one or more architectural element can comprise a transceiver, antenna and/or signal repeater. In one embodiment, a transceiver, antenna and/or signal repeater can be provided in, or on, a window or window frame. In one embodiment, transceivers, antennas and/or signal repeaters can be coupled to the trunk line 901 via the drop line 913, or via a connection to the trunk line 901 at some other point along the trunk line. In one embodiment, one or more of a transceiver, an antenna and/or a signal repeater is located on an external wall or roof or a building, and the trunk line 901 is coupled to the transceiver, antenna and/or signal repeater.

Trunk Line—Drop Line Interface

Figure 10:
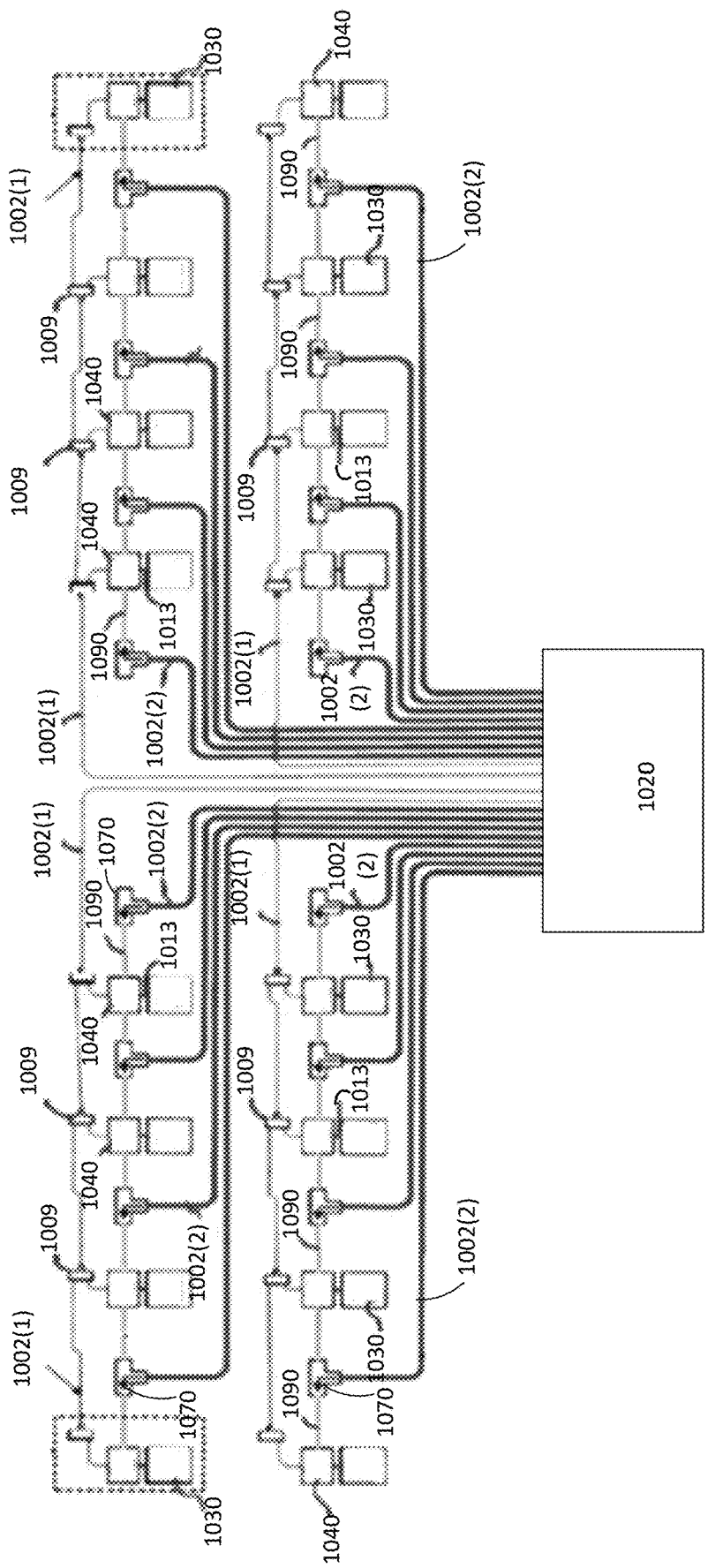
FIG. 10 shows an example power and data distribution system that includes s control panel, trunk lines, drop lines, and digital architectural elements, according to some embodiments.

FIG. 10 shows an example power and data distribution system that includes s control panel, trunk lines, drop lines, and digital architectural elements, according to some embodiments. In the embodiment depicted in FIG. 10, a control panel 1020 provides power and data to multiple digital architectural elements 1030.

Conductors (power insert lines) 1002(2), power injectors 1070, and power segments 1090 are provided to carry electrical power from the control panel 1020 to the digital architectural elements 1030. Power distribution systems, including trunk lines, power inserts, and power injectors are discussed in PCT Application Publication No. 2018/102103, filed Nov. 10, 2017 (P085X1WO), which is incorporated herein by reference in its entirety.

In certain embodiments, the power insert lines and the power segments include one or more twisted pair conductors such as pairs of 12 or 14AWG conductors. In one example, one or both of these types of current carrying lines contains two pairs of 2×14AWG conductors. In certain embodiments, one or both of these types of power carrying cables is designed for class 2 electrical power (e.g., <4 Amps and <30 Volts DC).

In the depicted embodiment, power from the control panel 1020 is delivered to bias tees 1040 first via power insert lines 1002(2), and then from power injectors 1070, and finally via power segments 1090. The bias tees 1040 couple power and data into drop lines 1013 connected to the multiple digital architectural elements 1030.

In the depicted embodiment, data is provided between the control panel 1020 (or more specifically, for example, a master controller or network controller provided in the control panel) and the multiple digital architectural elements 1030. Data is carried from cables 1002(1), which are connected to the control panel 1020, to directional couplers 1009, bias tees 1040, and finally the drop lines 1013.

In certain embodiments, the data carrying cables 1002(1) and the drop lines 1013 are coaxial cables. In certain embodiments, one or both of these coaxial cables are RG6 coaxial cables. As explained elsewhere herein, the system may include hardware and/or software logic for delivering high bandwidth data over coaxial cables. In certain embodiments, the system employs components configured to deliver data using one or more of the MoCA standards.

In various embodiments, data from the control panel is delivered to individual ones of the multiple digital architectural elements 1030 by tapping off some of the carrier signal from the data carrying cables 1002(1) using directional couplers 1009. As an example, a directional coupler may direct a small fraction of the data signal from the data carrying cable 1002(1), and direct the extracted signal toward a bias tee. As an example, a data signal received at a directional coupler has a first signal strength, and the digital coupler extracts a small portion of the signal for the bias tee and allows a signal of slightly reduced strength to continue downstream toward the next directional coupler.

Upstream data from the digital architectural elements 1030 passes through the drop lines 1013 to the bias tees 1040 and directional couplers 1009, and finally onto the data carrying cables 1002(1) for delivery to the control panel 1020 (or often more precisely to a network or master controller within a control panel). Directional couplers 1009 such as those depicted in this example system direct certain data in only one direction. For example, upstream data from the digital architectural elements 1030 passing through the directional couplers 1009 is directed only upstream, toward the control panel 1020 on the data carrying cables 1002(1).

In the example of FIG. 10, any one or more of the digital architectural elements 1030 may include any one or more of the modules or may provide one or more of the functions described elsewhere herein. For example, although for clarity of illustration the directional couplers 1009 and the bias tees 1040 are shown outside a respective digital architectural element 1030, it is contemplated that in some embodiments at least some digital architectural elements 1030 will include a respective directional coupler 1009 and/or a respective bias tee 1040. In certain embodiments, at least one of the digital architectural elements 1030 lacks sensors, audio, and/or video capabilities. For example, a digital architectural element 1030 may include only communications capabilities such as Wi-Fi, cellular, and/or wired network capabilities.

In some cases, one or more of the digital architectural elements contain a module or other component for controlling one or more electrically tintable windows. In some cases, a digital architectural element contains or communicates with one or more window controllers. To this end, one or more of the digital architectural elements may include a component such as a gateway to implement controller area network (e.g., CANbus) functionality. In some such cases, the system depicted in FIG. 10 may have CANbus cabling provided over trunk lines or other components.

Figure 11:
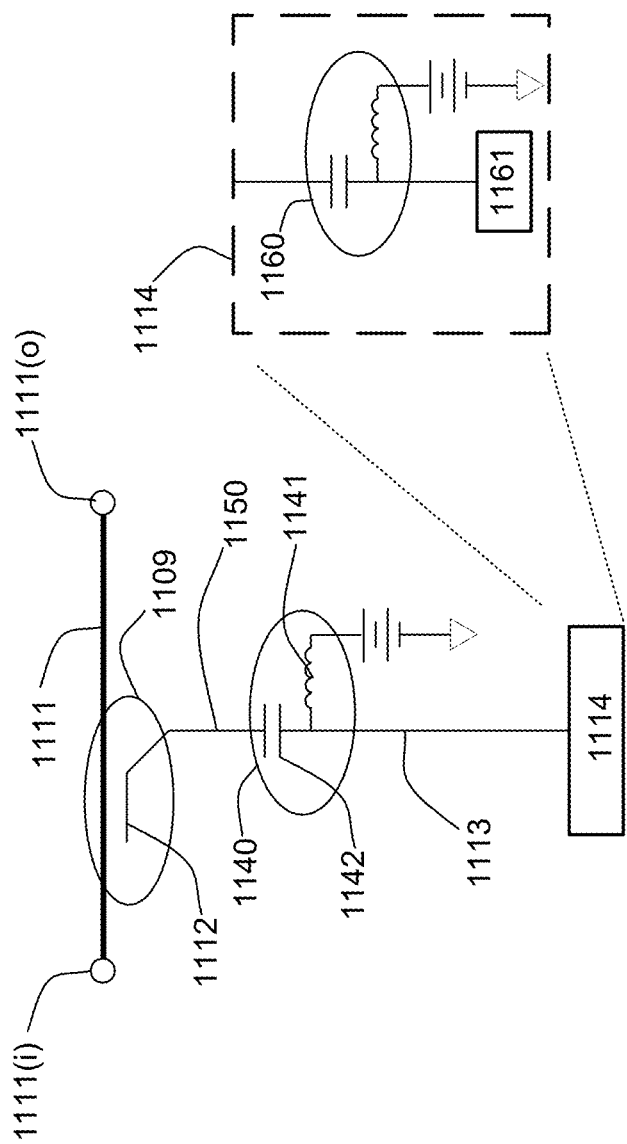
FIG. 11 illustrates a schematic illustration of an example of a trunk line circuit.

In FIG. 10 and other figures depicting systems containing digital architectural elements, it should be understood that the digital architectural elements may be substituted with other digital elements providing any one or more functions that provide control, processing, communications, and/or sensing. For example, any digital architectural element may be substituted by a digital wall controller, an enhanced functionality window controller, or the like FIG. 11 illustrates a schematic illustration of an example of a trunk line circuit similar to that described above in connection with FIG. 9C. In the illustrated example, the trunk line circuit contains a combination of features of both a directional coupler 1109 and a bias tee circuit 1140, which may be referred to as a multiport coupler or trunk tee. In the depicted example, the directional coupler 1109 is proximate to first conductor 1111 that includes an upstream segment (inlet) **1111(*i*) and a downstream segment (outlet) 1111(*o*). Conductor 1111 may be coupled with segments of a trunk line (e.g. segment 902 of FIGS. 9***c* and **1002(*i*) of FIG. 10. The directional coupler 1109 includes second conductor 1112 that is inductively coupled with first conductor 1111. In the illustrated example, the directional coupler provides a tap line 1150 for data signals extracted from the first conductor 1111. In certain embodiments, a directional coupler includes two parallel conductive elements (e.g., two copper traces). These are depicted as (i) the first conductor 1111 that connects two portions of a coaxial or other data carrying line (not illustrated), and (ii) the second conductor 1112 that is a directional finger. Through inductive coupling, signal from the main data carrying line is tapped or extracted for other use; in this case it is provided to a bias tee circuit 1140**. Among other parameters, the relative length of directional finger along the path of the continuous conductive element and separation distance between these two conductive elements dictates the strength of the data carrying signal that is tapped.

As an example, a data signal arrives at a directional coupler from a control panel, and the arriving signal (at **1111(*i*)) has signal strength of 25 dB. The directional coupler is configured to extract a fraction of the signal (e.g., 2 dB) and allow the remaining 23 dB of signal (at 1111(*o*)** to continue its journey downstream (away from the control panel (not illustrated)), and toward, e.g., the next directional coupler (not illustrated).

Tap 1150 may deliver data at a relatively low signal strength (by comparison to signal on first conductor 1111 to bias tee circuit 1140. As shown, bias tee circuit 1140 has a structure including an inductive element 1141 coupled to a source of power (e.g., a power segment such as a segment 1090) and a capacitive element 1142 on a link between the directional coupler 1109 and a node connecting to the inductive element 1141.

In operation, the bias tee circuitry 1140 may receive data as an RF signal over a coaxial cable from the directional coupler 1109 and combines it with DC power from a separate power source. It sends the combined signal on a drop line 1113 for downstream transmission to a device 1114, which may be digital architectural element (e.g., digital architectural element 1030 of FIG. 10) or other digital element, and/or a window controller and/or an electrically tintable window (e.g., in an IGU). The power provided to the bias tee 1140 (and particularly the inductive element 1141) may come from any of various sources. In some embodiments, it is provided via cabling originating at a control panel (e.g., cabling of a power insert line such as a line 1002(2) or a power segment such as a segment 1090). In some embodiments, it is provided via a storage battery, a storage capacitor, or other form of energy well (not illustrated). In certain embodiments, a combination trunk tee circuit includes both a power line cable and an energy well. Working in concert under appropriate control logic, these two power sources can provide for load leveling, backup power, and the like in power distribution system.

In an optional embodiment depicted in FIG. 11, device 1114 is configured as a digital architectural element that includes a bias tee circuit 1160 for accepting the data and power provided via the drop line 1113. AC power from the drop line 113 is directed on a first circuit leg to a power supply of the digital architectural element and data is directed to a different leg for processing at a block 1161.

In certain embodiments, a combination trunk tee circuit includes at least five ports: (i) an input data port for receiving data from an upstream source (e.g., a control panel), (ii) an output data port for transmitting data to downstream trunk tee circuits (and ultimately downstream processing units such as other digital architectural elements), (iii) an input power port for receiving power from a power source (e.g., a control panel), (iv) an output power port for transmitting unused power downstream to other devices that consume power, and (iv) a drop line port for transmitting tapped data and power to device such as a digital architectural element on the drop line. In certain embodiments, ports (i), (ii), and (iv) contain connectors for coaxial cables, while ports (iii) and (iv) contain connectors for twisted pair cables.

In certain embodiments, a directional coupler such as directional coupler 1109 within trunk tee 1103 contains a control or adjustment feature such as a mechanically or electrically controllable knob or dial for controlling or adjusting the coupling between the traces or other conductive elements contained in the directional coupler. For example, the control or adjustment feature may provide control over the relative positions and/or overlapping lengths of the traces, thereby permitting different degrees of signal coupling.

Depending where the directional coupler is deployed in the communications network (close to the control panel or terminus or somewhere in between), the directional coupler may require different degrees of signal coupling. An adjustable mechanism may permit different degrees of signal coupling appropriate for different positions on the communications network.

In certain embodiments, a trunk line connects to a control panel and carries both data and power lines. For example, a trunk line may carry the power insert lines 1002(2) and the data carrying cables 1002(1) from control panel 1020 in the system of FIG. 10.

Figure 12:
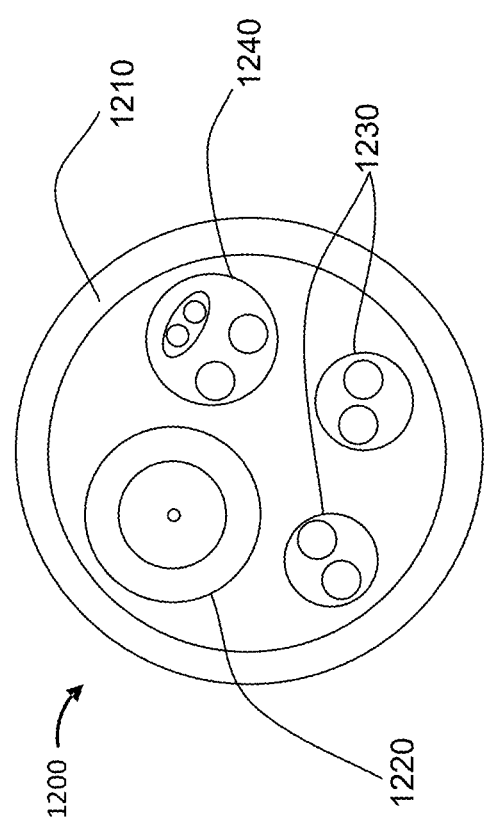
FIG. 12 depicts a cross section of an example trunk line configured to carry combination of power and data from and/or data, to a control panel.

FIG. 12 depicts a cross section of an example trunk line 1200 configured to carry combination of power and data from and/or data, to a control panel. Trunk line 1200 has conductors and shielding for carrying power and data for both a general purpose network protocol (e.g., Ethernet) and a control area network, e.g., the CANbus protocol. As shown in FIG. 12, trunk line 1200 includes an outer jacket 1210, which may be or include an insulator. In the depicted example, the outer jacket encloses an internal coaxial cable 1220 (e.g., RG6 coaxial) for high bandwidth data communication, two large gauge twisted pair cables 1230 (e.g., 14AWG unshielded twisted pair cables) for high wattage electrical power delivery, and a CANbus shielded multi-conductor cable 1240 for interacting with, e.g., window controllers, sensors, and the like. Of course, many of these features can be generalized such as, for example, the number of twisted pair conductors, the gauge of the conductors, and even the type of data carrying cable (e.g., non-coaxial line such as optical fiber). In certain embodiments, the CANbus cable includes two data conductors that are a twisted pair, with an overall shield (e.g., a foil shield) over the pair, and two power conductors. The two power conductors may be just a single wire and a drain wire (bare wire, no insulation) that electrically connects to the overall shield.

Figure 13:
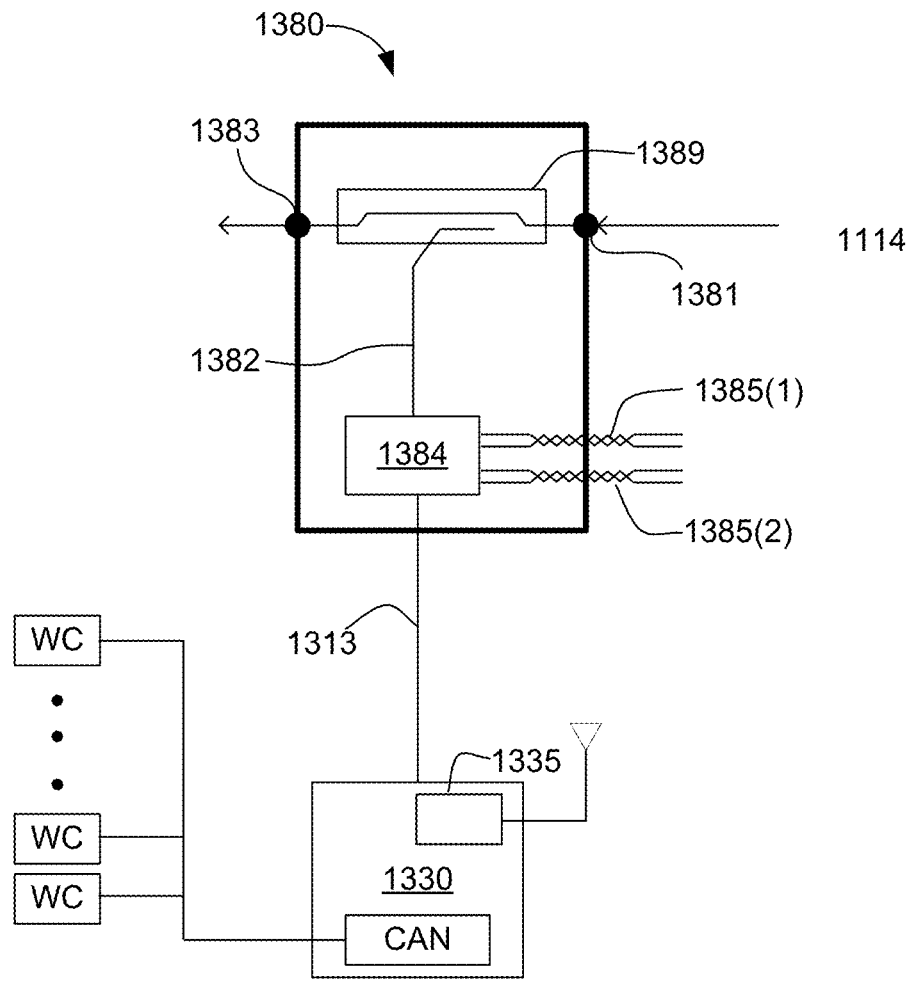
FIG. 13 shows an example of a portion of a data and power distribution system having a digital architectural element (DAE) coupled by way of a drop line with a combination module that includes a directional coupler and a bias tee circuit.

FIG. 13 shows an example of a portion of a data and power distribution system having a digital architectural element (such as a "smart frame" or similar communications/processing module) 1330 coupled by way of a drop line 1313 with a combination module 1380 that includes a directional coupler 1389 and a bias tee circuit 1384. The drop line 1313 may carry both power and data downstream, to the DAE 1330, and carries data from the DAE 1330 upstream, to a control panel (not shown). Data from a control panel (or other upstream source) may be provided via a coaxial cable input port 1381. This data is provided to the directional coupler 1389 of combination module 1380. The directional coupler 1389 extracts some of the data signal and transmits it on a line 1382, which may be a cable, an electrical trace on a circuit board, etc., depending on the design of the combination module 1380. Data from the control panel that is not tapped off by the combination trunk tee exits via a coaxial cable output port 1383.

Line 1382 connects to the bias tee circuit 1384 in the combination module 1380. Two twisted pair conductors (or other power carrying lines) 1385(1) and 1385(2) are also connected to the bias tee circuit 1384. With these connections, the bias tee circuit couples the power and data onto drop line 1313, which may be a coaxial cable. The digital architectural element or other communications/processing element 1330 may, as depicted, include and/or connect to components for cellular communication (e.g., the illustrated antenna) and cellular or CBRS processing logic 1335 that. The processing logic 1335, in some embodiments, may be 5G-compatible. In certain embodiments, the digital architectural element or other communications/processing element 1330, as depicted, provides a CANbus gateway that provides data and power to one or more CAN bus nodes such as window controllers, which control tint states of associated optically controllable windows.

In certain embodiments, during construction of a building, modules such as the combination module 1380 illustrated in FIG. 13 may be installed liberally throughout the building, including at some locations where they are not initially connected to digital architectural elements or other processing/communications modules. In such embodiments, the combination trunk tees may be used, after construction, to install digital processing devices, as needed by the building and/or tenants or other occupants.

Digital Architectural Elements

Figure 14:
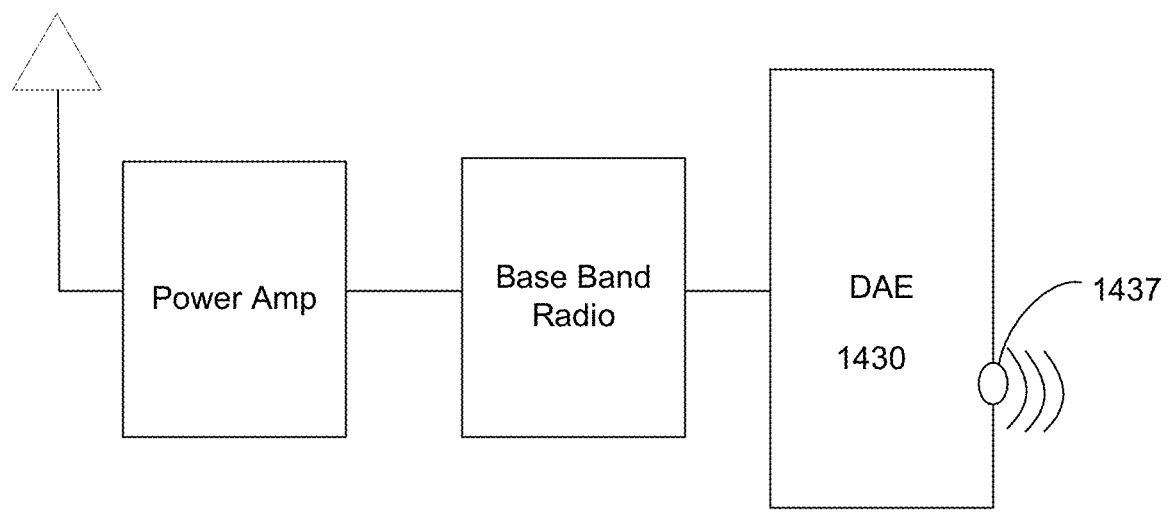
FIG. 14 illustrates a DAE that can support multiple communications types, according to some embodiments.
Figure 15:
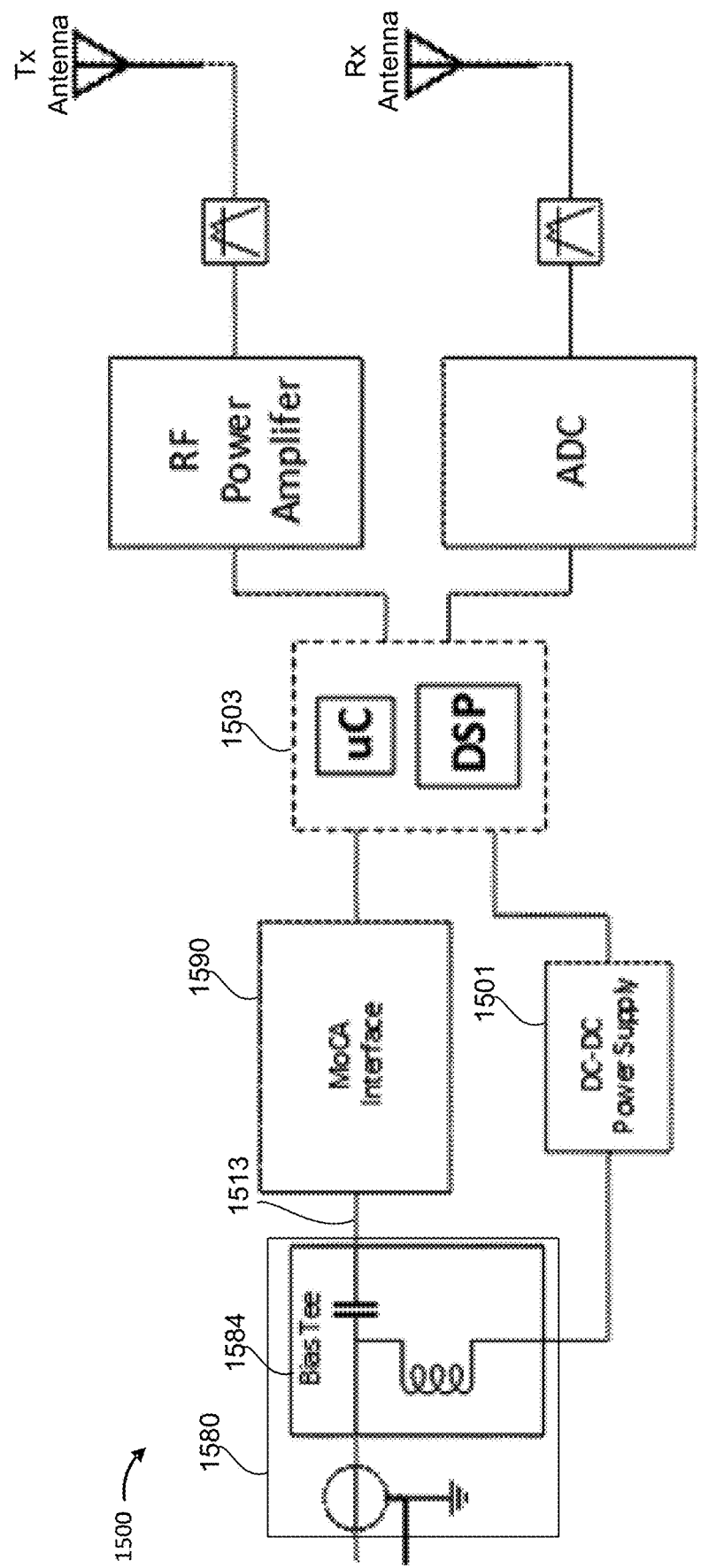
FIG. 15 illustrates a system of components that may be incorporated in or associated with a DAE, according to some embodiments.
Figure 16:
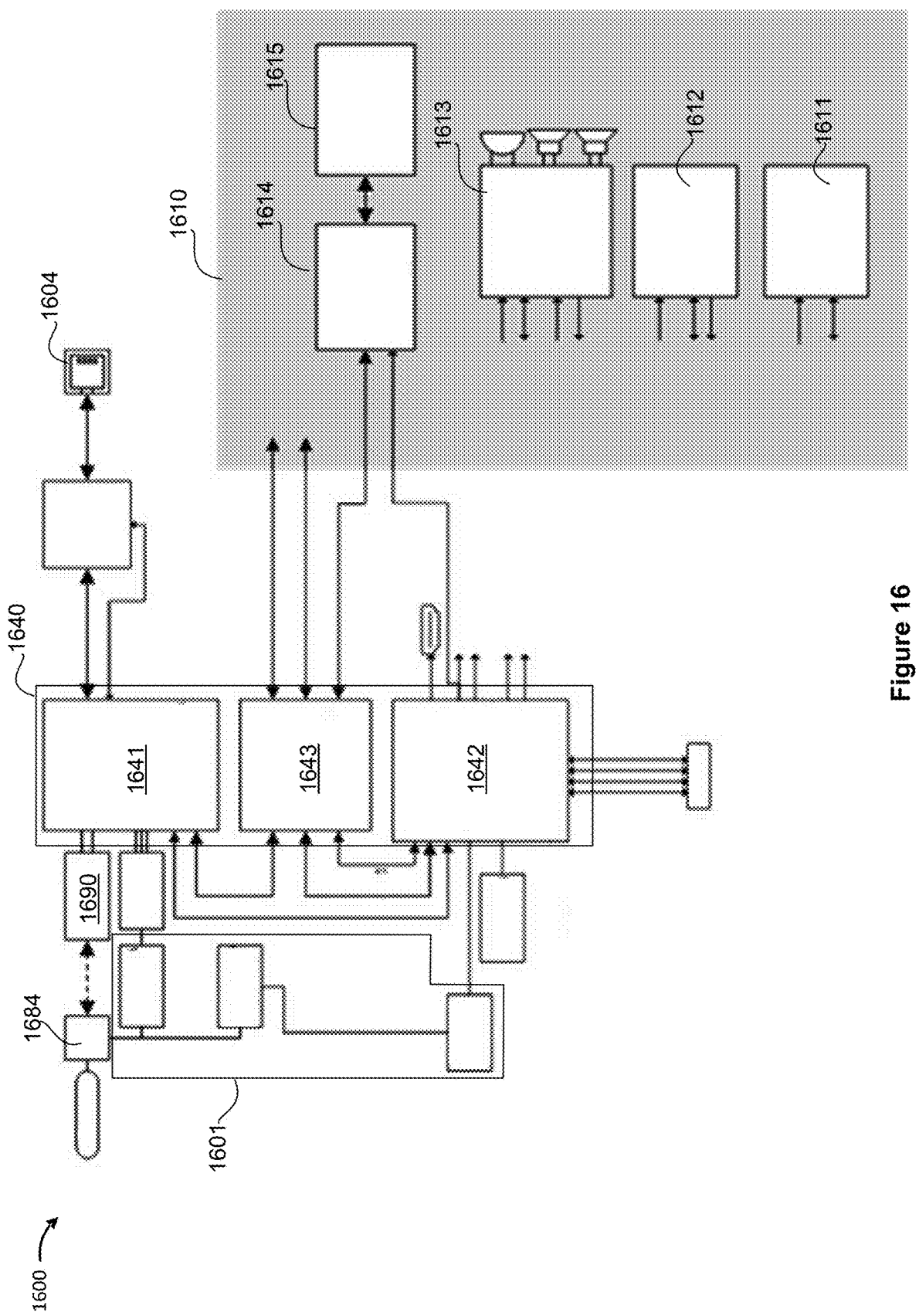
FIG. 16 illustrates an example of a system of components that may be incorporated in or associated with a digital architectural element, according to some embodiments.

FIGS. 14, 15, and 16 present block diagrams of versions of a digital architectural element, a digital wall interface, or similar device. For convenience, the following discussion will refer to a digital architectural element (DAE). FIG. 14 illustrates a DAE 1430 that can support multiple communications types, including, e.g., Wi-Fi communications with its own antenna 1437. Alternately or in addition the DAE 1430 may include or be coupled with cellular communications infrastructure such as, in the illustrated embodiment, a base band radio, an amplifier, and an antenna. Similarly, while not explicitly shown here, digital architectural element 1530 may support a citizen's band radio system (CBRS) employing a similar base band radio. From a communications and data processing perspective, the digital architectural element in this figure has the same general architecture as the full-featured digital architectural element. But it does not include a sensor and perhaps not ancillary components such as a display, microphone, and speakers.

In some embodiments, digital architectural elements support a modular style sensor configuration that allow for individual upgrade and replacement of sensors via plug and play insertion in a backbone type circuit board having a set of slots or sockets. In one embodiment, sensors used in the digital structural elements can be installed normal to the backbone in one of a multitude of slots/sockets standardized for maximum flexibility and functionality. In some embodiments, the sensors are modular and can be plug and play replaced via removal and insertion through openings in housing of the digital architectural elements. Failed sensors can be replaced or functionality/capabilities can be modified as needed. In one embodiment where digital architectural elements are installed during a construction phase of a project/building, use of plug and play sensors allows customization of digital architectural elements with one or more sensors that may not be needed when the project/building is ready for occupancy. For example, during construction, sensors could be installed to track construction assets within the site or monitor for unsafe (OSHA+) noise or air quality levels and/or a night camera could be installed to monitor movement on a construction site when the site would normally be unoccupied by workers. As desired or needed, after construction, these or other sensors could be removed, and quickly and easily replaced or supplemented during an occupancy phase, or at a later phase, when upgraded or sensors with new capabilities were needed or became available.

FIG. 15 illustrates a system 1500 of components that may be incorporated in or associated with a DAE. The system 1500 may be configured to receive and transmit data wirelessly (e.g., Wi-Fi communications, cellular communications, citizens band radio system communications, etc.) and to transmit data upstream and receive data downstream via, e.g., a coaxial drop line. In FIG. 15, elements of the system 1500 are presented at a relatively high level. The embodiment illustrated in FIG. 15 includes circuits that serve a similar function to the combination module 1380 (described above in connection with FIG. 13) at the interface of the trunk line and the drop line, specifically, a module 1580 including a bias tee circuit 1584 takes power and data from separate conductors (trunk line) and puts them on one cable (a drop line 1513). Thus, for downstream transmission, a coaxial drop line may deliver both power and data to a MoCA interface 1590 of a digital architectural element on the same conductors.

As illustrated, the system 1500 includes the bias tee circuit 1584 coupled by way of the drop line 1513 to a MoCA interface 1590. The MoCA interface 1590 is configured to convert downstream data signals provided in a MoCA format on coaxial cable (the drop line in this case) to data in a conventional format that can be used for processing. Similarly, the MoCA interface 1590 may be configured to format upstream data for transmission on a coaxial cable (drop line 1513). For example, packetized Ethernet data may be MoCA formatted for upstream transmission on coaxial cable.

In the illustrated example, a DC-DC power supply 1501 receives DC electrical power from the bias tee circuit 1584 and transforms this relatively high voltage power to a lower voltage power suitable for powering the processing components and other components of digital architectural element 1530. In certain implementations, power supply 1501 includes a Buck converter. The power supply may have various outputs, each with a power or voltage level suitable for a component that it powers. For example, one component may require 12 volt power and a different component may require 3.3 volt power.

In some approaches, the bias tee circuit 1584, the MoCA interface 1590, and the power supply 1501 are provided in a module (or other combined unit) that is used across multiple designs of a digital architectural element or similar network device. Such a module may provide data and power to one or more downstream data processing, communications, and/or sensing devices in the digital architectural element. In the depicted embodiment, a processing block 1503 provides processing logic for cellular (e.g., 5G) or other wireless communications functionality as enabled by a transmission (Tx) antenna and associated RF power amplifier and by a reception (Rx) antenna and associated analog-to-digital converter. In certain embodiments, the antennas and associated transceiver logic are configured for wideband communication (e.g., about 800 MHz-5.8 GHz). Processing block 1503 may be implemented as one or more distinct physical processors. While the block is shown with a separate microcontroller and digital signal processor, the two may be combined in a single physical integrated circuit such as an ASIC.

While the embodiment depicted in FIG. 15 provides separate transmit and receive antennas, other embodiments employ a single antenna for transmission and reception. Further, if a digital architectural element supports multiple wireless communications protocols such as one or more cellular formats (e.g., 5G for Sprint, 5G for T mobile, 4G/LTE for ATT, etc.), it may include separate hardware such antennas, amplifiers, and analog-to-digital converters for each format. Further, if a digital architectural element supports non-cellular wireless communications protocols such as Wi-Fi, citizen's band radio system, etc., it may require separate antennas and/or other hardware for each of these. However, in some embodiments, a single power amplifier may be shared by antennas and/or other hardware for multiple wireless communications formats.

In the depicted embodiment, the processing block 1503 may implement functionality associated with communications such as, for example, a baseband radio for cellular or citizens band radio communications. In some cases, different physical processors are employed for each supported wireless communications protocol. In some cases, a single physical processor is configured to implement multiple baseband radios, which optionally share certain additional hardware such as power amplifiers and/or antennas. In such cases, the different baseband radios may be definable in software or other configurable logic.

FIG. 16 illustrates an example of a system 1600 of components that may be incorporated in or associated with a digital architectural element. As shown, the system 1600 includes a bias tee circuit 1684 that may work as described above (e.g., similar to bias tee circuit 1584 in FIG. 15). Data from the bias tee circuit 1684 is provided to a MoCA front end module 1690 that works in conjunction with at least a portion of processing block 1640 (for example, a coaxial network controller system on a chip such as the MxL3710, available from MaxLinear, Inc. of Carlsbad, Calif.) to provide high speed data to one or more components of the system 1600.

Power from the bias tee circuit 1584 (e.g., 24 V DC) is provided to one or more voltage regulators in power supply 1601, at least some of which may collectively serve the functions of power supply 1501 in FIG. 15 and provide power to various components of processing block 1640. The processing block 1640 may include, as generally represented at block 1642, a general purpose microprocessor, a microcontroller, a digital signal processor, and integrated circuits of which some or all may contain multiple cores or embedded processors having various processing capabilities. In certain embodiments, processing block 1640 serves the functions of processing block 1503 in FIG. 15. As an example, processing block 1640 may provide CANbus functionality for one or more window controllers.

In the illustrated example, processing block 1640 includes a network switch 1643 which may be, for example a five-port Ethernet switch such as the SJA1105 available from NXP Semiconductors of the Netherlands). MoCA encoded data arriving from the MoCA front end may be decoded to provide data in conventional Ethernet format. That data may then be provided to the network switch, where it may be distributed to various data processing components of the system 1600.

In an embodiment, a modular electrical connector 1604 such as the illustrated RJ45 connector may provide data for any purposes an occupant or building owner might have, e.g., a user laptop or data center connection. In one example, connector 1604 provides a connection for gigabit Ethernet via twisted pair copper wire.

Block 1610 of FIG. 16 includes examples of additional components not illustrated in the embodiment of FIG. 15. In certain embodiments, these are provided together in a single chassis or case or are otherwise provided as a module. In other embodiments, they are provided separately and each may be integrated in a digital architectural element. As shown, block 1605 includes a sensor module 1611, a video module 1612, an audio module 1613, and window controller elements, including window controller logic 1614 and window controller power circuits 1615. In certain embodiments, some or all of the functionality of window controller 1614 may be implemented in processing block 1640, thereby minimizing or eliminating a requirement for a separate logic element such as window controller logic 1614.

In some embodiments, 5G infrastructure may replace both Wi-Fi and 4G via a single service protocol and associated infrastructure. For example, one or more 5G antennas and associated components in a region of a building may provide wireless communications functionality that serves all needs, effectively replacing the need for Wi-Fi. In certain embodiments, a digital architectural element employs a citizens band radio system (CBRS), which does not require separate license from the FCC or other regulatory body.

CONCLUSION

In the description, numerous specific details were set forth in order to provide a thorough understanding of the presented embodiments. The disclosed embodiments may be practiced without some or all of these specific details. In other instances, well-known process operations were not described in detail to not unnecessarily obscure the disclosed embodiments. While the disclosed embodiments were described in conjunction with the specific embodiments, it will be understood that the specific embodiments are not intended to limit the disclosed embodiments.

What is claimed is:

1. A network for data communication, comprising: two or more trunk line segments configured for disposition on or in a building, wherein the two or more trunk line segments are configured to communicatively couple by a circuitry with one or more devices, wherein:

the coupling is configured (i) to deliver one or more signals to, and/or (ii) to receive one or more signals from, the one or more devices at a data transmission rate of at least about one half (0.5) gigabit per second, the coupling is further configured to facilitate tapping of a portion of data signals transmitted by the two or more trunk line segments, wherein the one or more signals delivered to the one or more devices include power signals combined with the data signals tapped, a remaining portion of the data signals that are not tapped are transmitted by the two or more trunk line segments to other devices operatively coupled to the two or more trunk line segments, and signals received from the one or more devices are transmitted through the two or more trunk line segments to a system configured to determine building operations parameters based, at least in part, on the one or more signals received from the one or more devices, wherein the building operations parameters comprise one or more parameters controllable by one or more building systems comprising at least one of: an HVAC system, a lighting system, or a security system.

2. The network of claim 1, wherein the one or more devices comprise:

(a) a tintable window of the building, (b) a controller configured to control one or more functions related to the tintable window, (c) a sensor, or (d) an emitter.

3. The network of claim 1, wherein the circuitry is configured as a bias tee comprising an inductor or a capacitor.

4. The network of claim 1, wherein the two or more trunk line segments are coupled in a coupling comprising a serial coupling.

5. The network of claim 1, wherein the one or more devices comprise an Internet of Things (IoT) device, a device configured for at least a fifth generation cellular communication (5G) protocol, or a millimeter Wave device.

6. A method for implementing a network for data communication, comprising:

installing two or more trunk line segments that are (I) coupled, and (II) disposed on, or in, a building; and forming the network at least in part by coupling the two or more trunk line segments by a circuitry with one or more devices, wherein the network is configured (i) to deliver one or more signals to, and/or (ii) to receive one or more signals from, the one or more devices at a data transmission rate of at least about one half (0.5) gigabit per second, wherein:

the network is further configured to facilitate tapping of a portion of data signals transmitted by the two or more trunk line segments, the one or more signals delivered to the one or more devices include power signals combined with the data signals tapped, a remaining portion of the data signals that are not tapped are transmitted by the two or more trunk line segments to other devices operatively coupled to the two or more trunk line segments, and signals received from the one or more devices are transmitted through the two or more trunk line segments to a system configured to determine building operations parameters based, at least in part, on the one or more signals received from the one or more devices, wherein the building operations parameters comprise one or more parameters controllable by one or more building systems comprising at least one of: an HVAC system, a lighting system, or a security system.

7. The method of claim 6, wherein the one or more devices include an antenna, sensor, and/or emitter.

8. The method of claim 6, wherein the signals are transmitted through at least one coaxial cable included in the two or more trunk line segments.

9. The method of claim 8, wherein the data signals include wireless data signals.

10. The method of claim 6, wherein the two or more trunk line segments are operatively coupled to a building management control system.

11. The method of claim 6, wherein the one or more devices comprise a tintable window of the building and/or a controller configured to control one or more functions related to the tintable window.

12. The method of claim 6, wherein the two or more trunk line segments are connected in a linear series topology.

13. The method of claim 6, further comprising installing the one or more devices in, or on, a structural element of the building.

14. The method of claim 6, wherein the one or more devices comprise an Internet of Things (IoT) device, a device configured for at least a fifth generation cellular communication (5G) protocol, or a millimeter wave device.

15. The method of claim 6, wherein the one or more devices comprise a tintable window.

16. The method of claim 15, wherein the tintable window comprises an electrochromic window.

17. The method of claim 6, further comprising installing at least one window in the building after forming the network.

18. The method of claim 6, wherein at least a portion of the two or more trunk line segments is installed in, or on, an exterior wall of the building.

19. The method of claim 6, wherein the one or more devices comprise an antenna and/or a repeater.

20. The method of claim 19, wherein the antenna and/or the repeater is installed in, or on, a window of the building.

21. The method of claim 15, wherein the tintable window is associated with a digital display screen.

22. The method of claim 6, wherein formation of at least a portion of the network is performed during construction of the building.

23. The method of claim 6, wherein formation of the network comprises coupling the circuitry to one or more windows of the building.

24. A network for data communication, comprising: two or more trunk line segments that are serially coupled at least in part, wherein the trunk line segments are configured for disposition on or in a building, wherein:
the two or more trunk line segments are configured to couple by at least one circuit with one or more devices disposed on, in, or outside the building,
the at least one circuit is configured to (i) deliver one or more signals to, and/or (ii) receive one or more signals from, the one or more devices,
the at least one circuit is further configured to facilitate tapping of a portion of data signals transmitted by the two or more trunk line segments,
the one or more signals delivered to the one or more devices include power signals combined with the data signals tapped,
a remaining portion of the data signals that are not tapped are transmitted by the two or more trunk line segments to other devices operatively coupled to the two or more trunk line segments, and
wherein signals received from the one or more devices are transmitted through the two or more trunk line segments to a system configured to determine building operations parameters based, at least in part, on the one or more signals received from the one or more devices, wherein the building operations parameters comprise one or more parameters controllable by one or more building systems comprising at least one of: an HVAC system, a lighting system, or a security system.

25. The network of claim 24, wherein the one or more devices include a tintable window and/or a controller configured to control the tintable window.

26. The network of claim 24, wherein the one or more devices include a transceiver, antenna and/or repeater.

27. The network of claim 25, wherein the tintable window comprises an electrochromic window.

28. The network of claim 25, wherein the tintable window is coupled to a digital display technology.

29. A system comprising:
tintable windows;
window controllers configured to (i) couple to the tintable windows and (ii) control one or more tint states of the tintable windows; and
a high bandwidth data communications network operatively coupled to the window controllers, the high bandwidth data communications network comprising:
(i) one or more high bandwidth data communications interfaces configured to connect to (A) one or more data processing systems and/or (B) one or more other data communications networks, and
(ii) one or more data communications links configured to connect to (I) the one or more high bandwidth communications interfaces and (II) one or more digital elements, wherein the one or more high bandwidth data communications interfaces are configured to:
facilitate tapping of a portion of data transmitted via the high bandwidth data communications network,
combine power signals with the tapped portion of data, and
transmit the combined power signals with the tapped portion of data to the window controllers via the one or more data communications links, wherein a remaining portion of data not tapped is transmitted by the high bandwidth data communications network to other devices operatively coupled to the two or more trunk line segments, and wherein signals received from the one or more one or more digital elements to a system configured to determine building operations parameters based, at least in part, on the one or more signals received from the one or more digital elements, wherein the building operations parameters comprise one or more parameters controllable by one or more building systems comprising at least one of: an HVAC system, a lighting system, or a security system.

30. A system for operating a building, comprising:
at least one optically switchable window disposed on or in a building; and
one or more digital architectural elements (DAE) comprising:
the at least one optically switchable window,
an architectural feature associated with the at least one optically switchable window, and
a sensor group, wherein sensors of the sensor group are disposed in a housing associated with the DAE, and wherein at least one sensor of the sensor group is plug and play replaceable within the housing.

31. The system of claim 30, wherein the one or more digital architectural elements (DAE) include, or are operatively coupled with, a power system, a communications system, a compute system, a learning system, and/or a control system.

32. The network of claim 1, wherein the one or more devices comprise a sensor, an antenna, a microphone, or a speaker.

33. The network of claim 1, wherein the one or more devices comprise one or more digital architectural elements (DAE) comprising an architectural feature associated with the building, and a sensor group.

34. The method of claim 6, wherein the one or more devices comprise one or more digital architectural elements (DAE) comprising an architectural feature associated with the building, and a sensor group.

35. The method of claim 6, wherein the signals are transmitted through at least one coaxial cable included in the two or more trunk line segments.

36. The network of claim 1, wherein the data signals comprise wireless data signals.

37. The network of claim 1, wherein the two or more trunk line segments are configured to couple to a building management control system.

38. The network of claim 1, wherein the one or more devices comprise a window of the building and/or a controller configured to control one or more functions related to the window.

39. The network of claim 1, wherein the two or more trunk line segments are connected in a linear series topology.

40. The network of claim 1, wherein the one or more devices are configured to form a structural element of the building.

41. The network of claim 1, wherein the one or more devices comprise a tintable window.

42. The network of claim 41, wherein the tintable window comprises an electrochromic window.

43. The network of claim 1, wherein the network is configured to be installed prior to installing at least one window in the building.

44. The network of claim 1, wherein at least a portion of the two or more trunk line segments is configured for installation in, or on, an exterior wall of the building.

45. The network of claim 1, wherein the one or more devices comprise an antenna and/or a repeater.

46. The network of claim 45, wherein the antenna and/or the repeater is configured for installation in, or on, a window of the building.

47. The network of claim 1, wherein the one or more devices comprises a digital display screen coupled to a window of the building.

48. The network of claim 1, wherein at least a portion of the network is configured for installation during construction of the building.

49. The system of claim 29, wherein the high bandwidth data communications network is configured for data transmission rate of at least about one half (0.5) gigabit per second.

50. The network of claim 1, which coupling is further configured to pass signals between the two or more trunk line segments.

51. The method of claim 6, which network is further configured to pass signals between the two or more trunk line segments.

52. The network of claim 24, which at least one circuit is further configured to pass signals between the two or more trunk line segments.

53. The network of claim 1, wherein the building operations parameters are determined by at least one machine learning model executing on the system to which the signals are transmitted.

54. The network of claim 1, wherein the building operations parameters are associated with one or more regions of the building that span multiple rooms and/or multiple floors.

55. The system of claim 30, wherein the housing is removably mounted to a mullion associated with the at least one optically switchable window.

* * * * *